(12) United States Patent
Kim et al.

(10) Patent No.: US 8,283,229 B2
(45) Date of Patent: Oct. 9, 2012

(54) METHODS OF FABRICATING VERTICAL CHANNEL TRANSISTORS

(75) Inventors: Kang-Uk Kim, Seoul (KR); Hyun-Woo Chung, Seoul (KR); Yongchul Oh, Suwon-si (KR); Hui-Jung Kim, Seongnam-si (KR); Hyun-Gi Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/906,630

(22) Filed: Oct. 18, 2010

(65) Prior Publication Data

US 2011/0111568 A1 May 12, 2011

(30) Foreign Application Priority Data

Nov. 12, 2009 (KR) .................. 10-2009-0109154

(51) Int. Cl.
*H01L 29/772* (2006.01)

(52) U.S. Cl. .................. 438/268; 257/327; 257/E21.41; 257/E29.262

(58) Field of Classification Search .................. 438/268, 438/270; 257/327, 328, E21.41, E29.262
See application file for complete search history.

(56) References Cited

U.S. PATENT DOCUMENTS

| | | | | |
|---|---|---|---|---|
| 5,457,064 A * | 10/1995 | Lee | ................ | 438/253 |
| 5,574,299 A * | 11/1996 | Kim | ................ | 257/296 |
| 5,828,094 A * | 10/1998 | Lee | ................ | 257/296 |
| 7,365,385 B2 | 4/2008 | Abbott | | |
| 7,564,084 B2 * | 7/2009 | Song et al. | ................ | 257/296 |
| 7,713,823 B2 * | 5/2010 | Sung et al. | ................ | 438/272 |
| 8,120,103 B2 * | 2/2012 | Hong | ................ | 257/331 |
| 8,154,065 B2 * | 4/2012 | Yoon et al. | ................ | 257/308 |
| 2001/0000689 A1 * | 5/2001 | Kajiyama | ................ | 365/149 |
| 2002/0098639 A1 * | 7/2002 | Kisu et al. | ................ | 438/238 |
| 2004/0197989 A1 * | 10/2004 | Sommer et al. | ................ | 438/243 |
| 2005/0056873 A1 * | 3/2005 | Sommer et al. | ................ | 257/296 |
| 2005/0173750 A1 * | 8/2005 | Park | ................ | 257/304 |
| 2005/0253143 A1 * | 11/2005 | Takaura et al. | ................ | 257/67 |
| 2006/0043617 A1 | 3/2006 | Abbott | | |
| 2006/0097304 A1 * | 5/2006 | Yoon et al. | ................ | 257/307 |
| 2007/0015356 A1 * | 1/2007 | Lee et al. | ................ | 438/637 |
| 2007/0082448 A1 * | 4/2007 | Kim et al. | ................ | 438/268 |
| 2007/0087499 A1 * | 4/2007 | Seo et al. | ................ | 438/243 |

(Continued)

FOREIGN PATENT DOCUMENTS

KR 10-0881392 B1 5/2008

(Continued)

*Primary Examiner* — Jarrett Stark
*Assistant Examiner* — Michele Fan
(74) *Attorney, Agent, or Firm* — Harness, Dickey & Pierce, P.L.C.

(57) ABSTRACT

Methods of fabricating vertical channel transistors may include forming an active region on a substrate, patterning the active region to form vertical channels at sides of the active region, forming a buried bit line in the active region between the vertical channels, and forming a word line facing a side of the vertical channel.

10 Claims, 68 Drawing Sheets

U.S. PATENT DOCUMENTS

| | | | |
|---|---|---|---|
| 2007/0284623 A1* | 12/2007 | Kim et al. | 257/213 |
| 2008/0099815 A1 | 5/2008 | Sun | |
| 2008/0173936 A1* | 7/2008 | Yoon et al. | 257/329 |
| 2009/0004813 A1* | 1/2009 | Lee | 438/421 |
| 2009/0108340 A1* | 4/2009 | Seo | 257/329 |
| 2009/0114981 A1* | 5/2009 | Sung et al. | 257/329 |
| 2009/0121268 A1* | 5/2009 | Lee et al. | 257/296 |
| 2009/0166723 A1* | 7/2009 | Sung et al. | 257/328 |
| 2009/0236656 A1* | 9/2009 | Sung et al. | 257/329 |
| 2009/0242971 A1* | 10/2009 | Cho et al. | 257/328 |
| 2010/0237405 A1* | 9/2010 | Shin | 257/329 |
| 2010/0237407 A1* | 9/2010 | Nojima | 257/329 |
| 2010/0258858 A1* | 10/2010 | Kim | 257/330 |
| 2010/0270602 A1* | 10/2010 | Choi | 257/296 |
| 2011/0127605 A1* | 6/2011 | Kim | 257/334 |

FOREIGN PATENT DOCUMENTS

KR  10-2009-0022759 A  3/2009

\* cited by examiner

METHODS OF FABRICATING VERTICAL CHANNEL TRANSISTORS

CROSS-REFERENCE TO RELATED APPLICATION

This U.S. non-provisional patent application claims priority under 35 U.S.C. §119 to Korean Patent Application No. 10-2009-0109154, filed on Nov. 12, 2009, in the Korean Intellectual Property Office (KIPO), the entire contents of which is incorporated herein by reference.

BACKGROUND

1. Field

Example embodiments of the inventive concepts relate to methods of fabricating transistors, and more particularly, to methods of fabricating vertical channel transistors.

2. Description of the Related Art

In the semiconductor industry, bit lines are generally formed by various fabricating methods. One known fabricating method is a method of fabricating a MOS field-effect transistor including a horizontal channel. This fabricating method has been advanced to improve integration of a semiconductor device as design rules of semiconductor devices decrease, and operational speed and yield is improved. A transistor that includes a vertical channel has been suggested to improve integration, resistance, and current driving capability of the transistor including the known horizontal channel.

SUMMARY

Example embodiments of the inventive concepts may provide methods of fabricating vertical channel transistors.

In some embodiments thereof, the method may include forming an active on a substrate, patterning the active to form vertical channels at lateral sides of the active, forming a buried bit line in the active between the vertical channels; and forming a word line facing a lateral side of the vertical channel. In some embodiments thereof, forming the active includes etching the substrate to form a trench and filling the trench with insulation material to form a device isolation layer defining the active, wherein the active includes an island shape with rounded edges at opposite sides of the active. In some embodiments thereof, forming the buried bit line includes partially removing a center of the active to form active branches defining a buried bit line pattern which runs across the center of the active, forming a damascene bit line pattern under the buried bit line pattern and filling the damascene bit line pattern with metal to form the buried bit line.

In some embodiments thereof, forming the vertical channel includes forming a word line pattern crossing one of the center and edge of the active and overlapping a portion of the active branch, another portion of the active branch which is not overlapped with the word line pattern being transformed into the vertical channel. In some embodiments thereof, forming the word line includes forming a gate insulation layer in the word line pattern and forming a word line in the word line pattern, the gate insulation layer being disposed between the word line and the vertical channel, the word line pattern running across the center of the active, and the word line facing an inner surface of the vertical channel, the inner surface of the vertical channel confronting the center of the active.

In some embodiments thereof, forming the word line includes forming a gate insulation layer in the word line pattern and forming a word line in the word line pattern, the gate insulation layer being disposed between the word line and the vertical channel, the word line pattern running across an edge of the active, and the word line facing an outer surface of the vertical channel, the outer surface of the vertical channel confronting the edge of the active. In some embodiments thereof, forming the buried bit line includes removing a center of the active to form vertical channels defining a buried bit line pattern, each of the vertical channels including an inner surface facing the center of the active and an outer surface having a shape coincident with a rounded edge of the active, forming a damascene buried bit line pattern under the buried bit line pattern and filling the buried bit line pattern with metal to form the buried bit line.

In some embodiments thereof, forming the word line includes forming a word line pattern crossing the edge of the active without overlapping the edge of the active, forming a gate insulation layer in the word line pattern and forming the word line facing the vertical channel, the gate insulation layer being disposed between the word line and the vertical channel, the word line pattern detouring around the edge of the active and the word line including a shape coincident with the rounded edges of the active. In some embodiments thereof, the method further includes forming a lower junction in a bottom portion of the vertical channel and forming an upper junction in a top portion of the vertical channel. In some embodiments thereof, one of the word line and active crosses the buried bit line perpendicularly and the other does not crosses the buried bit line perpendicularly.

In some embodiments thereof, the method includes forming a vertical active extending in a first direction on a substrate, the active having an island shape including a center and lateral edges; forming a vertical active branch at the lateral edge of the active, the vertical active branch defining a buried bit line pattern crossing the center of the active in a second direction, forming a damascene buried bit line pattern extending in the second direction under the buried bit line pattern, filling the damascene buried bit line pattern with metal to form a buried bit line extending in the second direction, filling the buried bit line pattern with insulation material to form an insulation pillar extending in the second direction and covering the buried bit line, forming a vertical channel defining a word line pattern extending in a third direction which crosses the active, the vertical channel including a portion of the edge of the active, forming a gate insulation layer and a word line in the word line pattern, the word line facing a lateral side of the vertical channel and forming lower and upper junctions at bottom and top portions of the vertical channel, respectively.

In some embodiments thereof, forming the buried bit line includes one of depositing the metal within the damascene buried bit line pattern siliciding the active exposed by the damascene buried bit line pattern and depositing a doped silicon within the damascene buried bit line pattern and then silciding the doped silicon. In some embodiments thereof, forming the word line pattern includes removing an inner portion of the active branch, the removed inner portion of the active branch being more adjacent to the center of the active than an outer portion of the active branch. In some embodiments thereof, the vertical channel includes an inner surface facing the center of the active and an outer surface facing the edge of the active opposite to the inner surface and the word line faces the inner surface of the vertical channel.

In some embodiments thereof, forming the word line pattern includes removing an outer portion of the active branch, the removed outer portion of the active branch being more adjacent to the edges of the active than an inner portion of the active branch. In some embodiments thereof, the vertical channel includes an outer surface facing the edge of the active and an inner surface facing the center of the active opposite to the outer surface and the word line faces the outer surface of the vertical channel. In some embodiments thereof, the first direction is perpendicular to the second direction and is inclined to the third direction at an angle of 0° to 90°.

In some embodiments thereof, the method includes forming a vertical active extending in a first direction on a substrate, the active having an island shape including a center and rounded lateral edges, forming a buried bit line pattern crossing the center of the active in a second direction, the buried bit line pattern defining the edge of the active as a vertical channel, forming a damascene buried bit line pattern extending in the second direction under the buried bit line pattern, filling the damascene buried bit line pattern with metal to form a buried bit line extending in the second direction, filling the buried bit line pattern with insulation material to form an insulation pillar extending in the second direction and covering the buried bit line, forming the word line pattern extending in a third direction, the word line pattern crossing the vertical channel without overlapping the vertical channel, forming a gate insulation layer and a word line extending in the third direction in the word line pattern, the word line extending along the rounded edge of the active, and forming lower and upper junctions at bottom and top portions of the vertical channel, respectively.

In some embodiments thereof, the vertical channel includes an inner surface facing the center of the active and an outer surface composing of the edge of the active opposite to the inner surface and the word line faces the outer surface of the vertical. In some embodiments thereof, the first direction is perpendicular to the third direction and is inclined to the second direction at an angle of 0° to 90°. In some embodiments thereof, methods of fabricating a vertical channel transistor may include forming an active region on a substrate, forming a plurality of vertical channels by patterning the active region, forming a buried bit line in the active region between the vertical channels, and forming a word line on a side of at least one of the vertical channels.

In some embodiments thereof, methods of fabricating a vertical channel transistor may include forming an active region extending in a first direction on a substrate, the active region including a center region and end regions, forming an active branch in at least one of the end regions, the active branch defining a buried bit line pattern extending through the center region in a second direction, forming a damascene buried bit line pattern extending in the second direction using the buried bit line pattern, for forming a buried bit line by forming a conductive layer in the damascene buried bit line pattern, forming an insulation pillar by forming an insulation material in the buried bit line pattern to cover the buried bit line, forming a channel defining a word line pattern, the word line pattern extending through the active region in a third direction, the channel including a portion of the active branch and extending in a fourth direction, forming a gate insulation layer and a word line in the word line pattern and forming first and second junction regions on opposite ends of the channel.

In some embodiments thereof, methods of fabricating a vertical channel transistor may include forming an active region extending in a first direction on a substrate, forming a buried bit line pattern extending through a center region of the active region in a second direction, the buried bit line pattern defining at least one channel, forming a damascene buried bit line pattern extending in the second direction using the buried bit line pattern, forming a buried bit line by forming a conductive layer in the damascene buried bit line pattern, forming an insulation pillar to cover the buried bit line by forming an insulation layer in the buried bit line pattern, forming a word line pattern extending in a third direction, the word line pattern adjacent to the at the least one channel, the at least one channel extending in a fourth direction, forming a gate insulation layer and a word line extending in the third direction in the word line pattern, the word line extending along an edge of the at least one channel, and forming junctions at opposite ends of the at least one channel.

BRIEF DESCRIPTION OF THE DRAWINGS

Example embodiments will be more clearly understood from the following brief description taken in conjunction with the accompanying drawings. FIGS. 1-37B represent non-limiting, example embodiments as described herein.

FIGS. 37A and 37B are block diagrams illustrating electronic devices and memory systems including vertical channel transistors according to example embodiments of the inventive concepts.

Figure 1A:
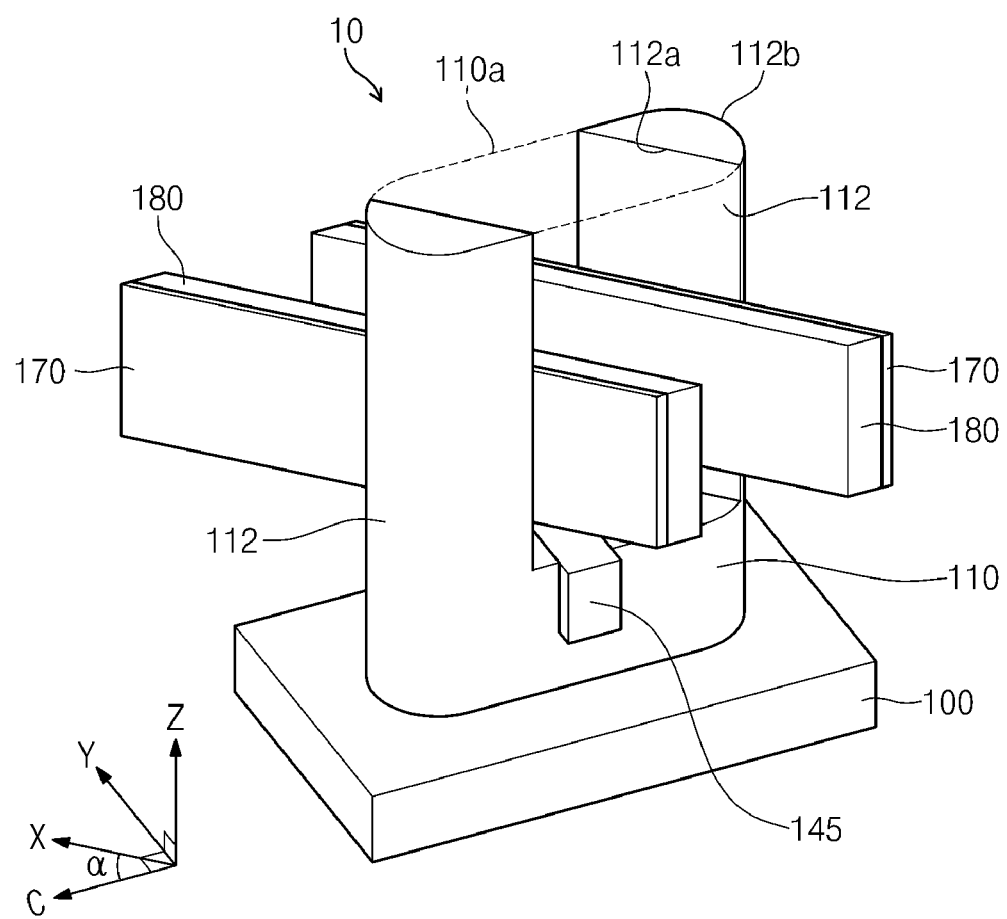
FIG. 1A-1C are perspective views illustrating vertical channel transistors according to example embodiments of the inventive concepts.

It should be noted that these Figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Reference will now be made in detail to example embodiments of the inventive concepts, examples of which are illustrated in the accompanying drawings. The embodiments are described below in order to explain the inventive concepts by referring to the figures. This inventive concepts may, however, be embodied in many different forms and should not be construed as limited to the example embodiments set forth herein. Rather, these embodiments are provided so that this disclosure will be thorough and complete, and will fully convey the scope of the invention to those of ordinary skill in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein, the term "and/or" includes any and all combinations of one or more of the associated listed items and may be abbreviated as "/". Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises" and/or "comprising," or "includes" and/or "including" if used in this specification, specify the presence of stated features, regions, integers, steps, operations, elements, and/or components, but do not preclude the presence or addition of one or more other features, regions, integers, steps, operations, elements, components, and/or groups thereof.

Example embodiments of the inventive concepts may be described herein with reference to cross-sectional illustrations, which are schematic illustrations of idealized embodiments (and intermediate structures) of the inventive concepts. As such, variations from the shapes of the illustrations, as a result, for example, of manufacturing techniques and/or tolerances, are to be expected. Thus, example embodiments of the inventive concepts should not be construed as limited to the particular shapes of regions illustrated herein, but are to include deviations in shapes that result from, e.g., manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1A is a perspective view illustrating vertical channel transistor according to example embodiments of the inventive concepts. Referring to FIG. 1A, a vertical channel transistor 10 may include an active region 110 protruding in the Z direction from a semiconductor substrate 100 and being of an island shape extending in the C direction, a buried bit line 145 extending in the Y direction substantially perpendicular to the C direction, and a word line 180 extending in the X direction obliquely crossing the C direction at an angle of $\alpha$ degrees. The angle $\alpha$ of the word line may be in the range from about 0° to 90°, for example about 45°. According to some example embodiments of the inventive concepts, the buried bit line 145 may be perpendicular to the active region 110 but not to the word line 180. The buried bit line 145 may intersect the word line 180 at an angle of, for example, about 90°-$\alpha$.

The active region 110 may include a plurality (e.g., 2) of vertical channels 112 with a plurality (e.g., 2) word lines 180 in between. A vertical channel 112 may include an inner surface 112a that is closest to a word line 180 and an outer surface 112b on an opposite side of the vertical channel 112 from the inner surface 112a. The inner surface 112a may be a planar shape facing in the direction of the center of the active region 110, and the outer surface 112b may be a convex shape facing away from the direction of the center of the active region 110. The plurality of vertical channels 112 may be formed by, for example, removing a portion 110a of the active region 110. The removed portion 110a (dotted line) may include portions of edges and a center of the active region 110.

According to example embodiments of the inventive concepts, a gate insulation layer 170 may be between an inner surface 112a of a vertical channel 112 and a word line 180. The word line 180 may be an inner word line crossing a center of an active region 110. A vertical channel transistor 10 in which the word line 180 faces the inner surface 112a of the vertical channel 112 and extends in the X direction crossing the C direction at about 45° at the center of the active region 110 may be formed.

Figure 1B:
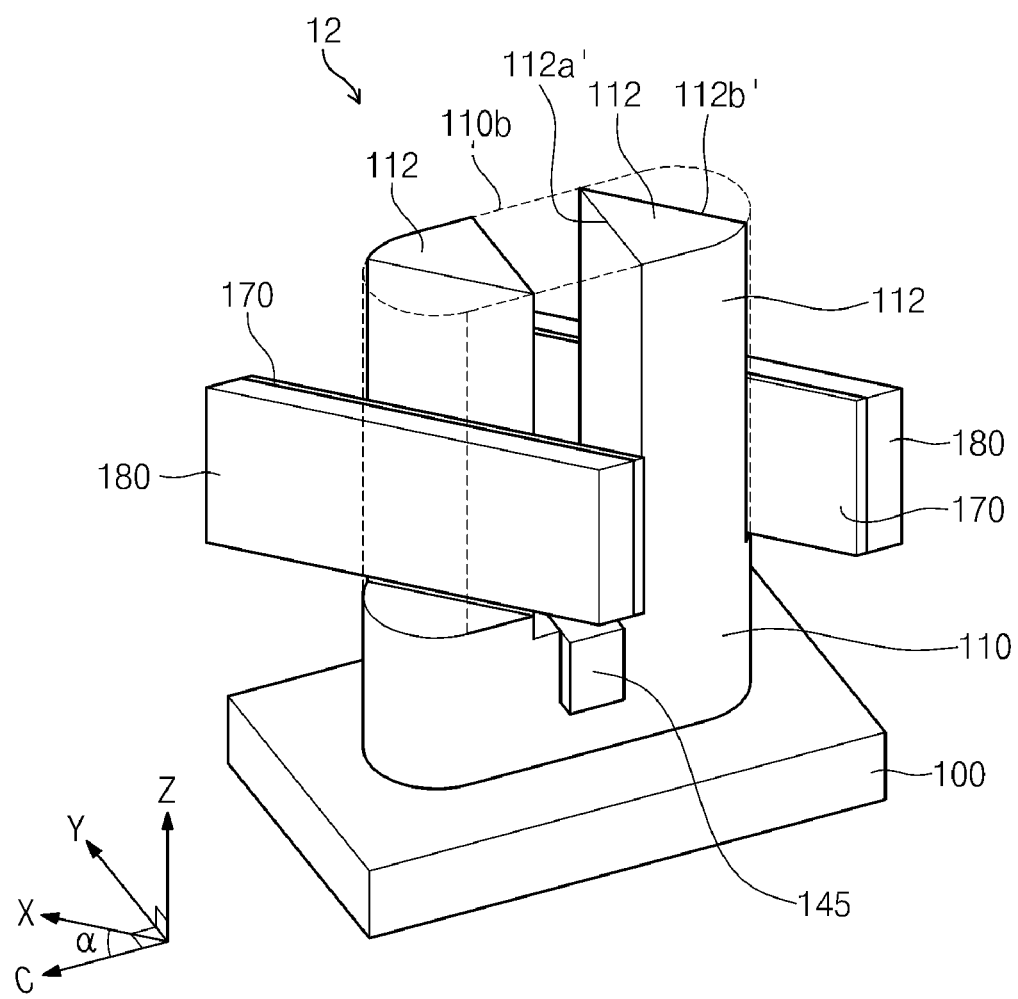

FIG. 1B is a perspective view illustrating vertical channel transistors according to example embodiments of the inventive concepts. Referring to FIG. 1B, a vertical channel transistor 12 may include an active region 110 protruding in the Z direction from a semiconductor substrate 100 and being of an island shape extending in the C direction, a buried bit line 145 extending in the Y direction substantially perpendicular to the C direction, and a word line 180 extending in the X direction obliquely crossing the C direction at an angle of $\alpha$ degrees (e.g., about 45°). According to some example embodiments, the buried bit line 145 and the active region 110 may be perpendicular to each other and the word line 180 may extend obliquely with respect to both the active region 110 and the buried bit line 145.

The active region 110 may include a plurality of vertical channels 112 and a word line 180 may be outside the vertical channels 112. For example, a word line 180 may be outside each of the plurality of vertical channels 112. A vertical channel 112 may include a planar outer surface 112b' that is closest to the word line 180 and a planar inner surface 112a' on an opposite side of the vertical channel 112 from the outer surface 112b'. A plurality of vertical channels 112 may be formed by, for example, removing a portion 110b of the active region 110. The removed portion 110b (dotted line) may include portions of edges and a center of the active region 110.

According to example embodiments of the inventive concepts, a gate insulation layer 170 may be between an outer surface 112b' of a vertical channel 112 and a word line 180. The word line 180 may be an outer word line crossing an edge of an active region 110. The vertical channel transistor 12 in which the word line 180 is partially offset with an edge of the active region 110 to face the outer surface 112b' of the vertical channel 112 and extending in the X direction crossing the C direction at about 45° outside the active region 110 may be formed.

Figure 1C:
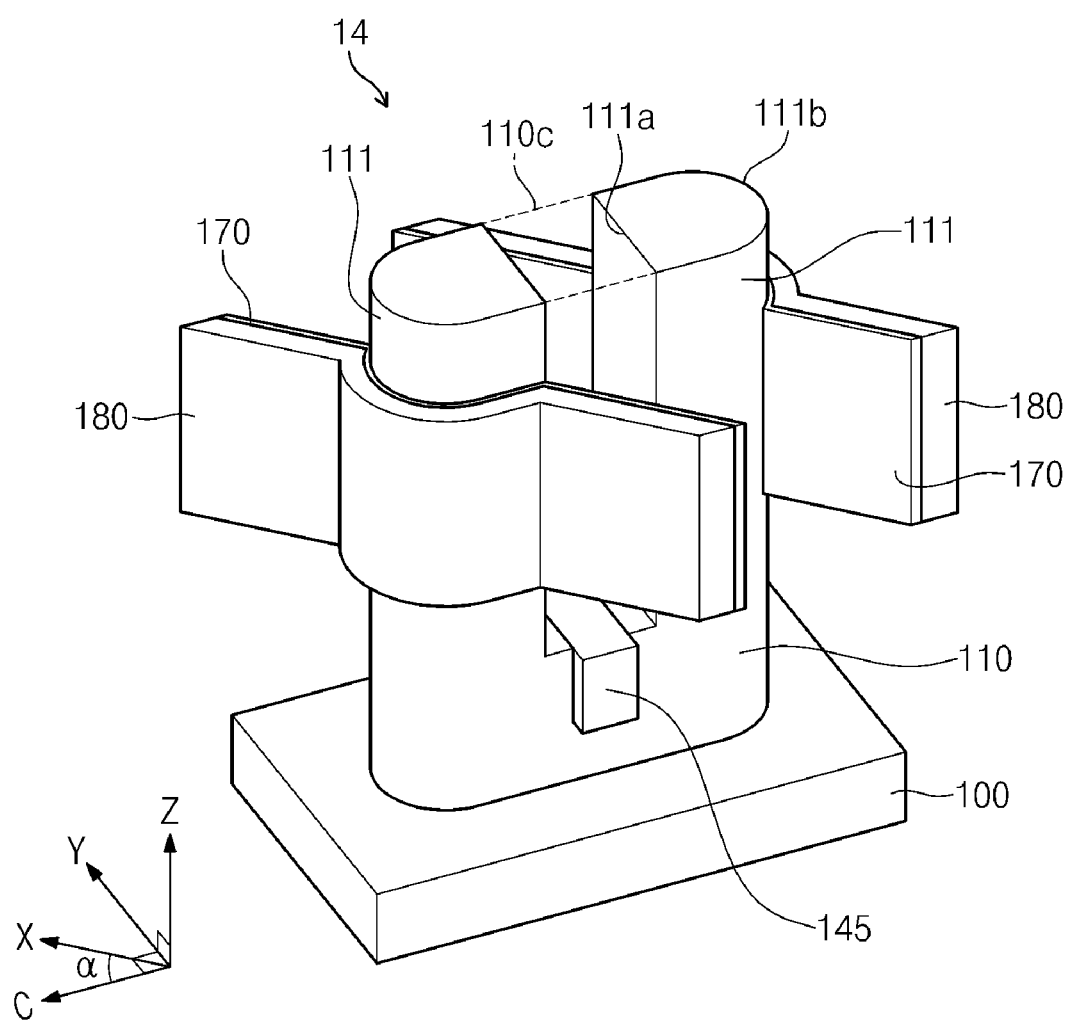

FIG. 1C is a perspective view illustrating vertical channel transistors according to example embodiments of the inventive concepts. Referring to FIG. 1C, a vertical channel transistor 14 may include an active region 110 protruding in the Z direction from a semiconductor substrate 100 and being of an island shape extending in the C direction, a buried bit line 145 extending in the Y direction substantially perpendicular to the C direction, and a word line 180 extending in the X direction obliquely crossing the C direction at an angle of $\alpha$ degrees (e.g., about 45°).

The active region 110 may include a plurality of vertical channels 111 and a word line 180 may be outside a vertical channel 111. A vertical channel 111 may include a convex outer surface 111b that is closest to the word line 180 and a planar inner surface 111a on a side opposite of the vertical channel 111 from the outer surface 111b. A vertical channel 111 may be formed by, for example, removing a portion 110c of the active region 110. The removed portion 110c (dotted line) may include a central portion of the active region 110.

According to example embodiments of the inventive concepts, a gate insulation layer 170 may be between an outer surface 111b of a vertical channel 111 and a word line 180. The word line 180 may be an outer word line having a curved shape along an outside of an active region 110. A vertical channel transistor 14 in which the word line 180 is formed along an edge of the active region 110 to face the outer surface 111b of the vertical channel 111 and extends in the X direction crossing the C direction at an angle of about 45° may be formed.

FIGS. 2A, 3A, 4A, 5A, 6A, 7A and 8A are plan views illustrating methods of fabricating vertical channel transistors according to example embodiments of the inventive concepts illustrated in FIG. 1A. FIGS. 2B, 3B, 4B, 5B, 6B, 7B and 8B are cross-sectional views taken along lines II:B-II:B', III:B-III:B', IV:B-IV:B', V:B-V:B', VI:B-VI:B', VII:B-VII:B' and VIII:B-VIII:B' of FIGS. 2A, 3A, 4A, 5A, 6A, 7A and 8A, respectively. FIGS. 2C, 3C, 4C, 5C, 6C, 7C and 8C are cross-sectional views taken along lines II:C-II:C', III:C-III:C', IV:C-IV:C', V:C-V:C', VI:C-VI:C', VII:C-VII:C' and VIII:C-VIII:C' of FIGS. 2A, 3A, 4A, 5A, 6A, 7A and 8A, respectively.

Figure 2A:
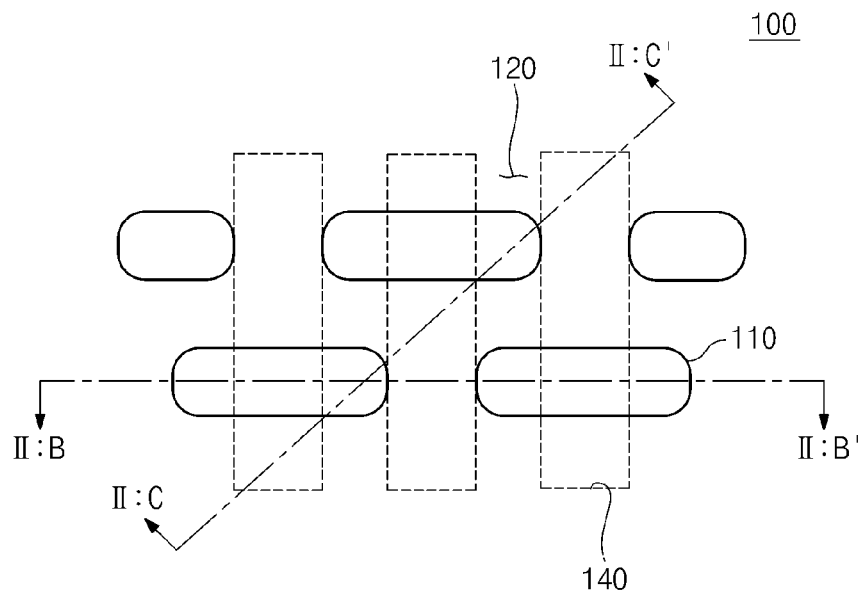
FIGS. 2A, 3A, 4A, 5A, 6A, 7A and 8A are plan views illustrating methods of fabricating vertical channel transistors according to example embodiments of the inventive concepts illustrated in FIG. 1A.
Figure 2B:
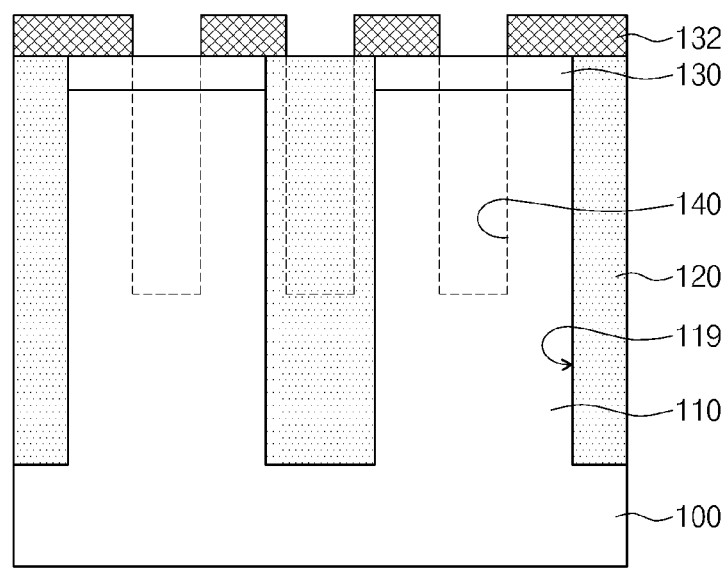
FIGS. 2B, 3B, 4B, 5B, 6B, 7B and 8B are cross-sectional views taken along lines II:B-II:B', III:B-III:B', IV:B-IV:B', V:B-V:B', VI:B-VI:B', VII:B-VII:B' and VIII:B-VIII:B' of FIGS. 2A, 3A, 4A, 5A, 6A, 7A and 8A, respectively.
Figure 2C:
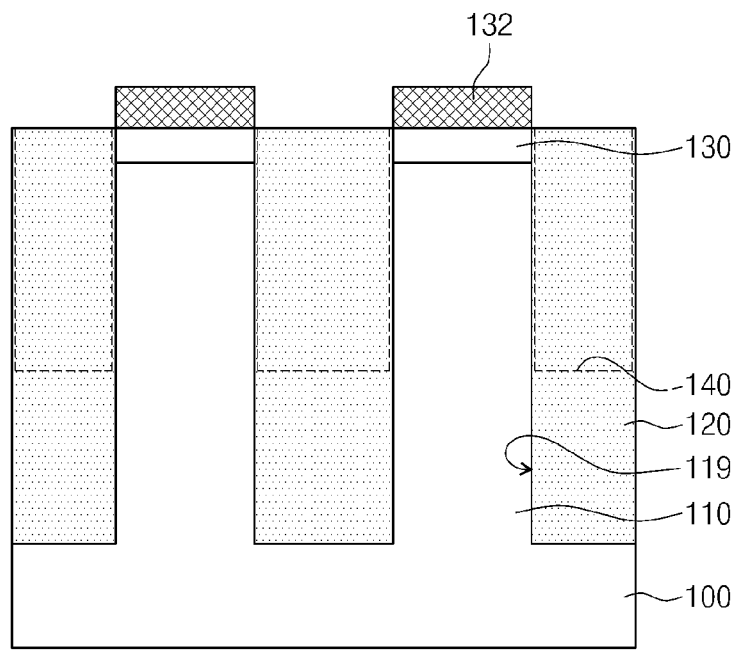
FIGS. 2C, 3C, 4C, 5C, 6C, 7C and 8C are cross-sectional views taken along lines II:C-II:C', III:C-III:C', IV:C-IV:C', V:C-V:C', VI:C-VI:C', VII:C-VII:C' and VIII:C-VIII:C' of FIGS. 2A, 3A, 4A, 5A, 6A, 7A and 8A, respectively.

Referring to FIGS. 2A, 2B and 2C, a plurality of active regions 110 may be formed on a semiconductor substrate 100. An active region 110 may be formed in the shape of pillar which extends in the vertical direction, the Z direction of FIG. 1A, from the semiconductor substrate 100. The active region 110 may be of an island shape with a longer axis in the latitudinal direction (the C direction of FIG. 1A) and a shorter axis in the longitudinal direction (the Y direction of FIG. 1A). For example, the active region 110 may have a rectangular shape with rounded ends.

The semiconductor substrate 100 may be etched to form a trench 119, and the trench 119 may be filled with a device isolation layer 120 to define the active region 110. The active regions 110 may be arranged in a zigzag pattern. As an example, a hard mask 130 may be formed on the semiconductor substrate 100 and the semiconductor substrate 100 may be partially removed by, for example, a dry etch using the hard mask 130 to form the trench 119. The semiconductor substrate 100 may be, for example, a single crystalline silicon bulk wafer and/or a silicon-on-insulator (SOI) substrate. The active region 110 may be formed of the single crystalline silicon. The semiconductor substrate 100 may be doped with first impurities (e.g., P-type impurities). The device isolation layer 120 may be silicon oxide (e.g., $SiO_2$), silicon nitride (e.g., SiN and/or $Si_3N_4$), silicon oxynitride (e.g., SiON) or any combinations thereof. For example, the device isolation layer 120 may be silicon oxide.

A first mask 132 may be formed on the semiconductor substrate 100 to define a buried bit line pattern 140 (referred to as BBL pattern hereinafter). The first mask 132 may be formed, for example, by depositing and patterning a photoresist. The first mask 132 may be formed in the shape of line which extends in the Y direction and covers edges of the active region 110 to expose a center thereof.

Figure 3A:
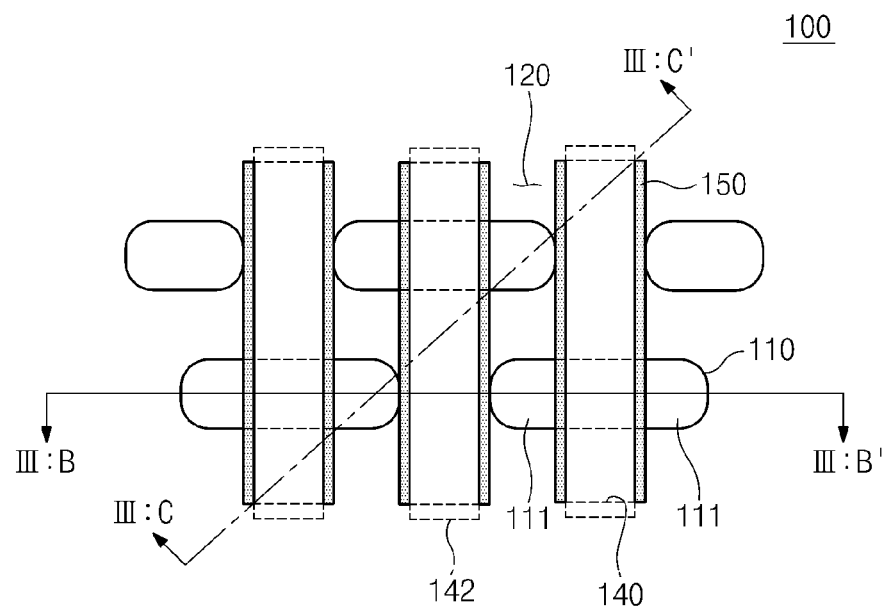
Figure 3B:
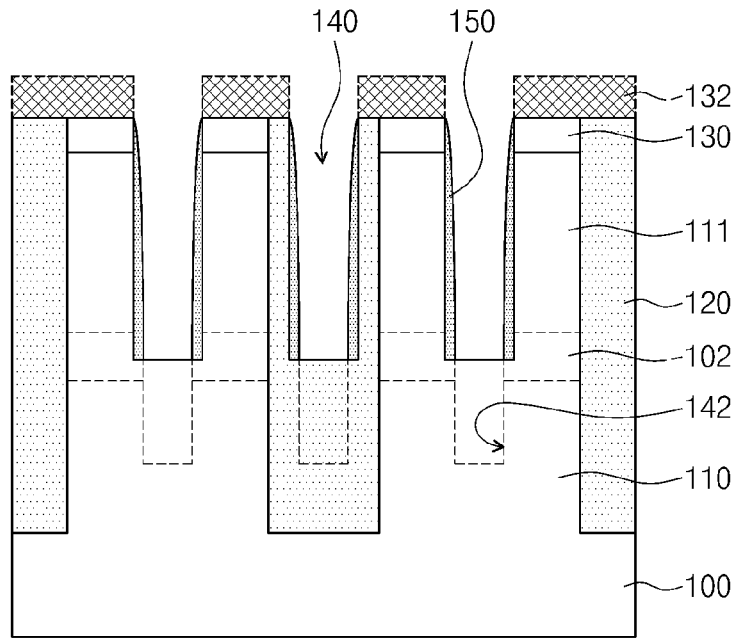
Figure 3C:
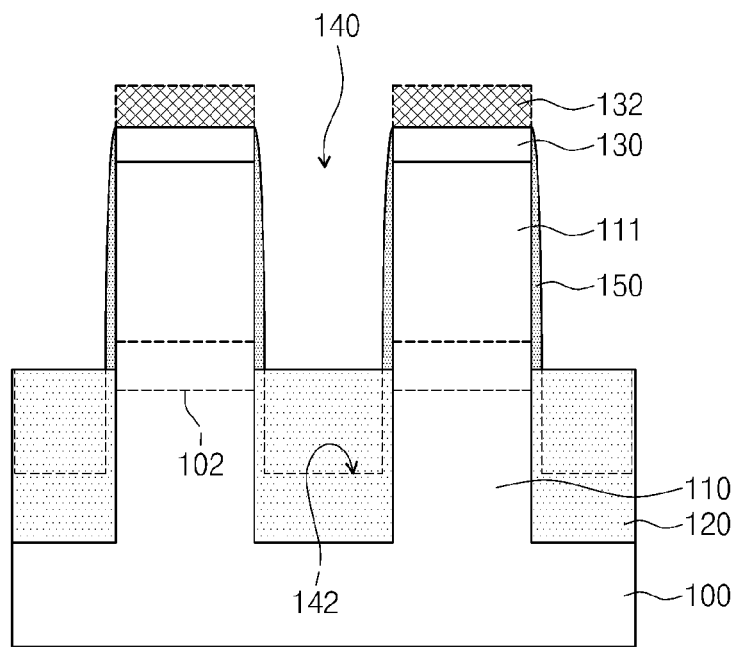

Referring to FIGS. 3A, 3B and 3C, the BBL pattern 140 may be formed by, for example, an etch process using the first mask 132. The BBL pattern 140 may be formed by dry etching the active region 110 and the device isolation layer 120 without an etch selectivity. The BBL pattern 140 may be formed in the shape of a line extending in the Y direction on the semiconductor substrate 100. For example, a center of the active region 110 may be removed in the Y direction and the device isolation layer 120 between the plurality of adjacent active regions 110 may be removed simultaneously in the same Y direction to form the BBL pattern 140. The BBL pattern 140 may be shallower than the device isolation layer 120. The center of the active region 110 may be removed by the BBL pattern 140 such that the active region 110 may have a plurality (e.g., 2) branches 111 protruding in the Z direction from both edges of the active region 110.

Selectively, a lower junction 102 may be formed in the active region 110 exposed by the BBL pattern 140. The lower junction 102 may be doped with second impurities, such as N-type impurities. The lower junction 102 may be formed through a following process (e.g., a process for a buried bit line formation explained later with reference to FIGS. 5A-5C). A liner 150 may be formed on inner wall of the BBL pattern 140 to define a damascene BBL pattern 142 (referred to as D-BBL pattern hereinafter). The liner 150 may be formed by, for example, etching an insulation material after depositing the insulation material different from the device isolation layer 120. For example, the liner 150 may be formed of silicon nitride while the device isolation layer 120 may be formed of silicon oxide. The liner 150 may protect the active branch 111 from etch damage when etching for the formation of the D-BBL pattern 142. The first mask 132 may be removed by, for example, an ash process.

Figure 4A:
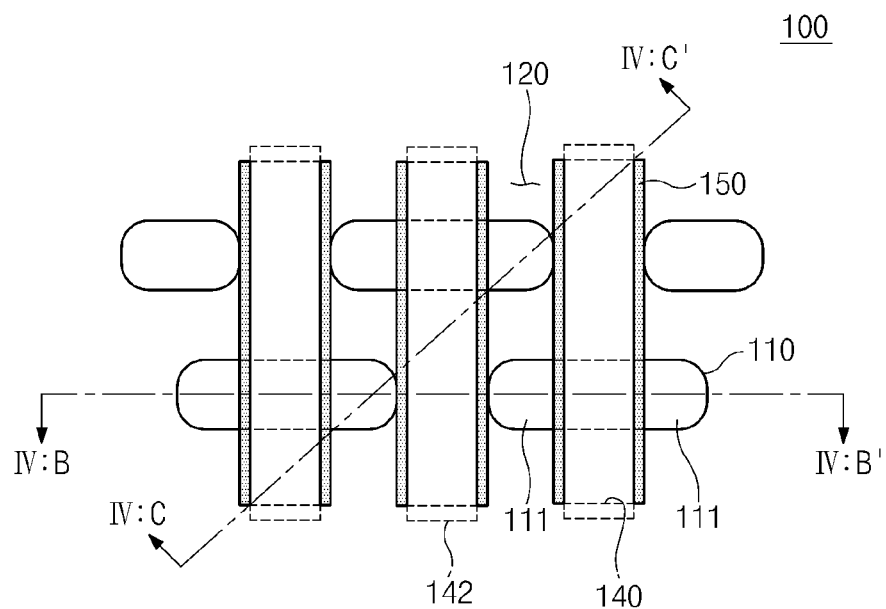
Figure 4B:
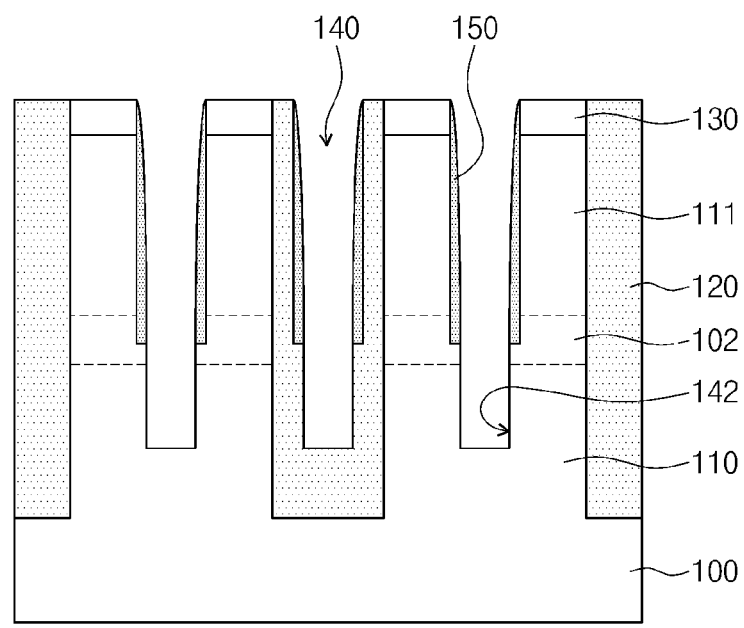
Figure 4C:
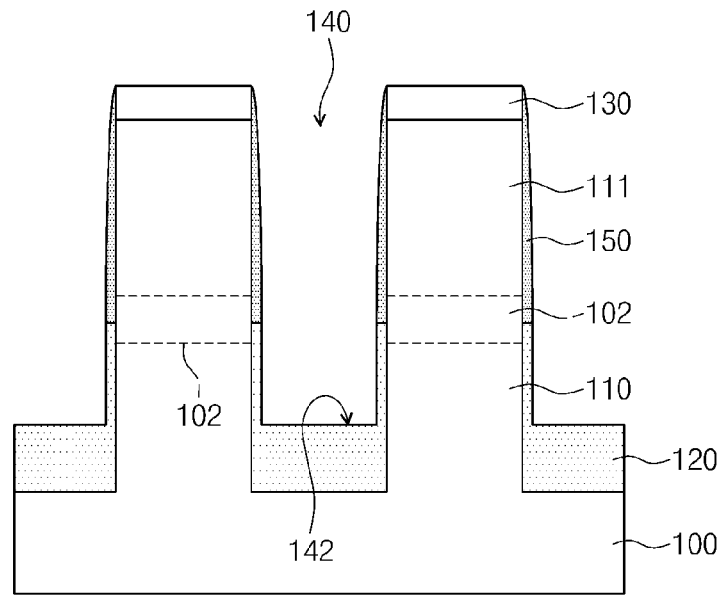

Referring to FIGS. 4A, 4B and 4C, the D-BBL pattern 142 may be formed on the semiconductor substrate 100. The D-BBL pattern 142 may extend in the Y direction under the BBL pattern 140. For example, the active region 110 exposed by the BBL pattern 140 and the device isolation layer 120 may be removed through, for example, an etch process using a hard mask 130 and the liner 150 as an etch mask, which may form the D-BBL pattern 142. The D-BBL pattern 142 may be shallower than the device isolation layer 120. The BBL pattern 140 and the D-BBL pattern 142 may be formed simultaneously by, for example, an etch process using the first mask 132. The etch processes described above may be applied to example embodiments explained later.

Figure 5A:
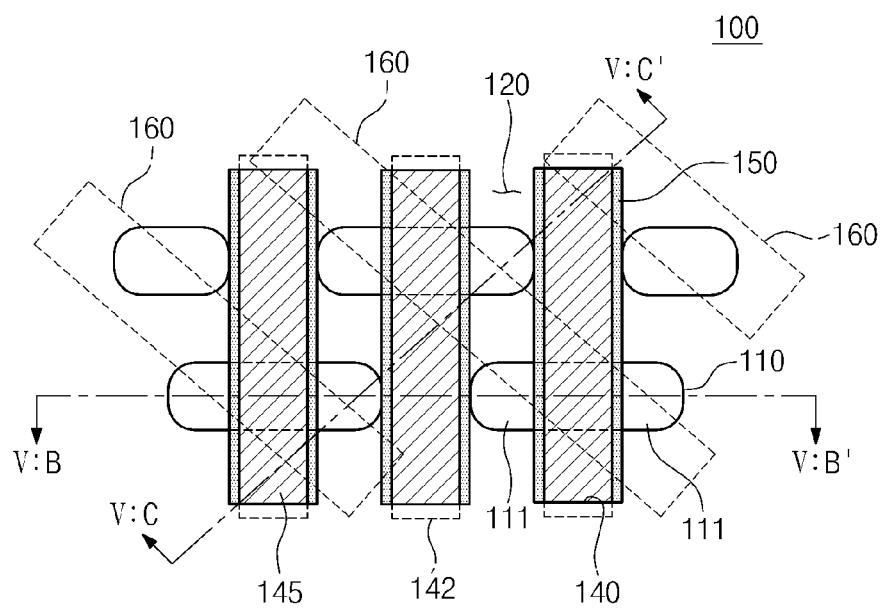
Figure 5B:
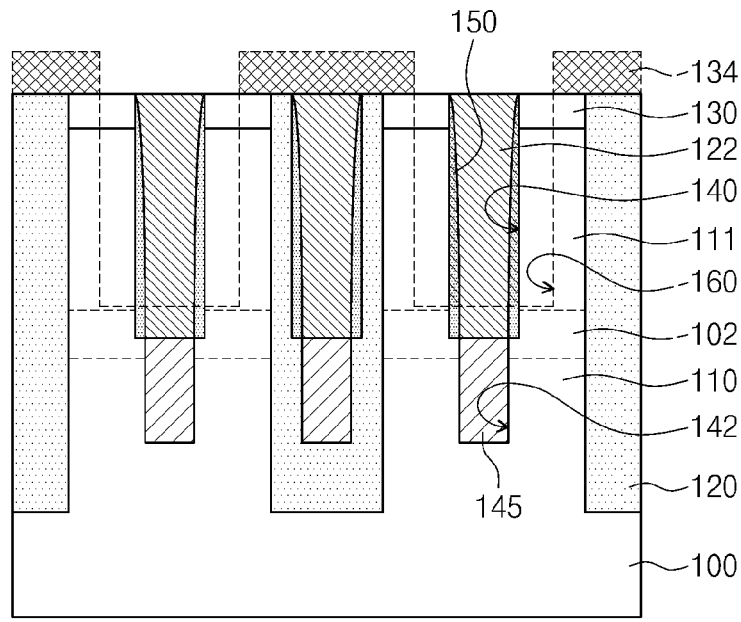
Figure 5C:
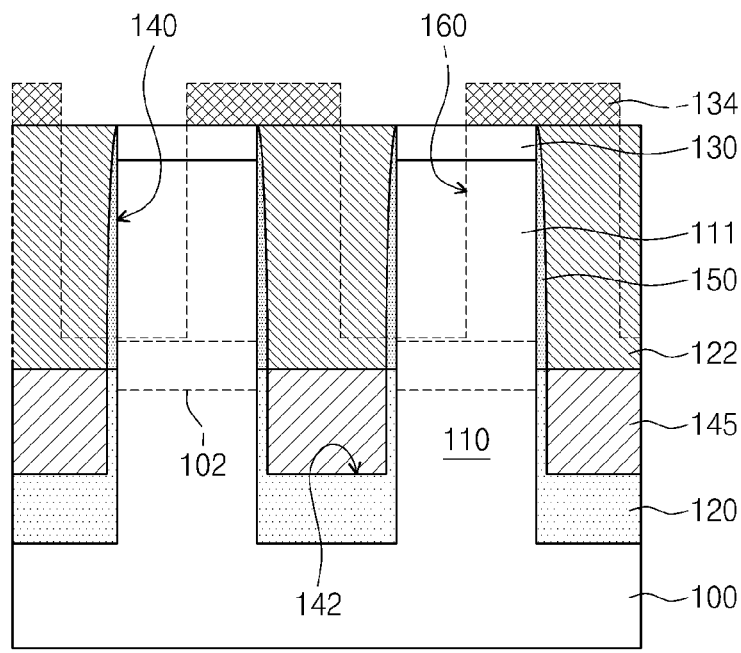

Referring to FIGS. 5A and 5B, a buried bit line 145 may be formed in the Y direction on the semiconductor substrate 100. The BBL pattern 140 may be filled with insulation material to form an insulation pillar 122 which extends in the Y direction to cover the buried bit line 145. The insulation pillar 122 may be aimed of, for example, silicon nitride.

The buried bit line 145 may be formed of conductive material. As an example, metal (e.g., TiN) may be deposited to fill the D-BBL pattern 142 and etched-back to form the buried bit line 145. As another example, the buried bit line 145 may be formed by depositing and etch-back metal after forming the lower junction 102 by implanting the active region 110 exposed by the D-BBL pattern 142 with impurities. As still another example, a doped silicon may be deposited in the D-BBL pattern 142 and a silicided buried bit line 145 (e.g., $CoSi_x$) may be formed by silicidation. In case of silicidation, impurities doped in silicon may be moved into the active region 110 to form the lower junction 102. As another example, when the lower junction 102 may be formed with low-concentration as shown in FIGS. 3A-3C, the low junction 102 may be formed with an LDD structure by high-concentration doping. According to example embodiments of the inventive concept, the buried bit line 145 including metal may be of a lower resistance as compared to, for example, the buried bit line 145 formed of silicon.

A second mask 134 may be formed to define a word line pattern 160 (referred to as WL pattern hereinafter) on the semiconductor substrate 100. For example, photoresist may be deposited and patterned to form the second mask 134 in the shape of a line. The line-shaped second mask 134 may extend in a direction (X direction of FIG. 1A) obliquely crossing the C direction. The second mask 134 may cover an outer portion of the active branch 111 to expose a center of the active region 110. The second mask 134 may also expose an inner portion of the active branch 111. The inner portion of the active branch 111 may be overlapped with the WL pattern 160.

Figure 6A:
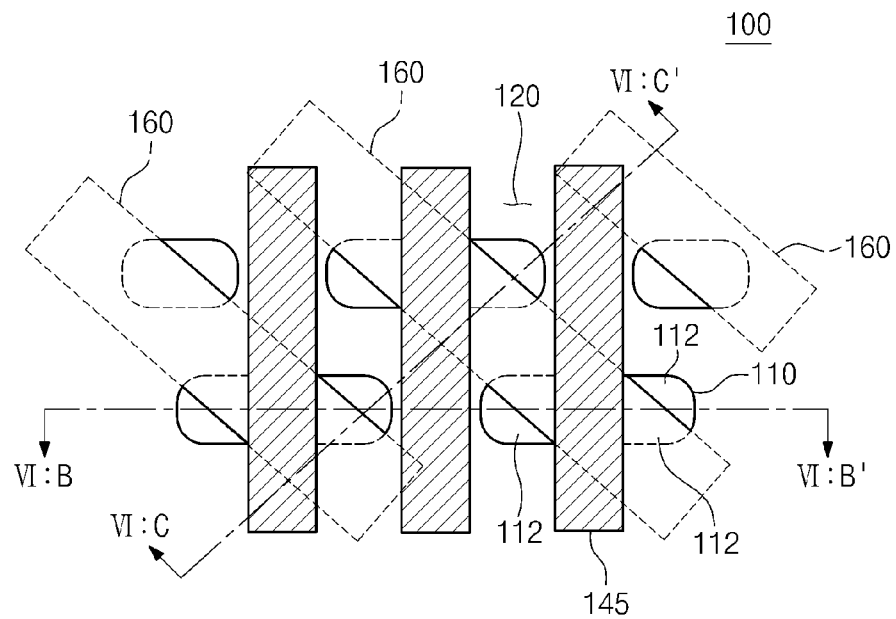
Figure 6B:
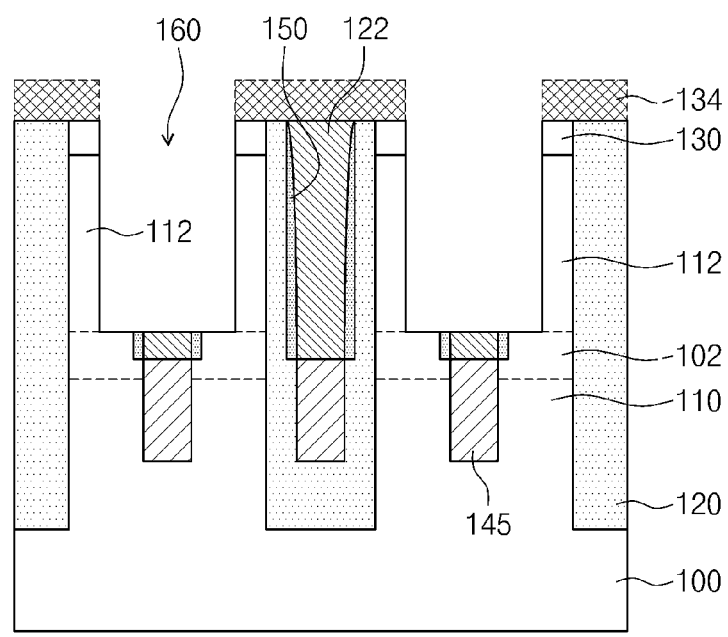
Figure 6C:
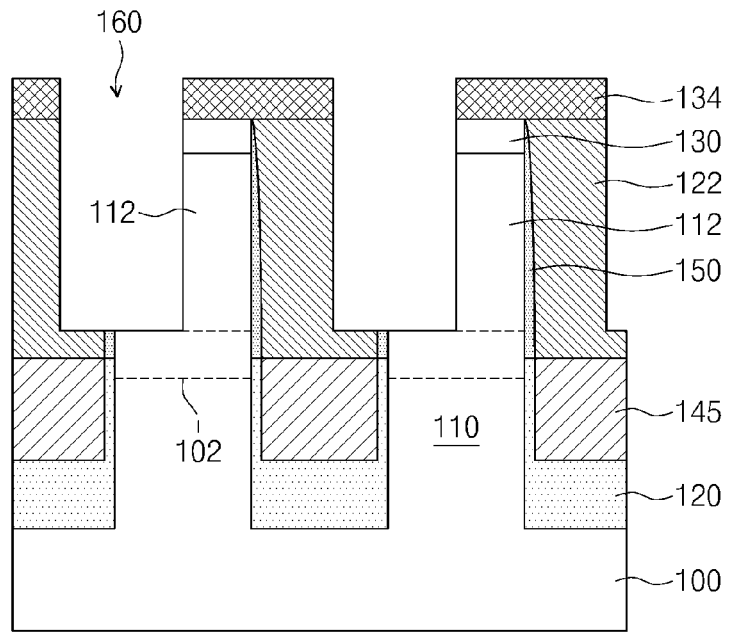

Referring to FIGS. 6A, 6B and 6C, an etch process using the second mask 134 may form the WL pattern 160, for example. The WL pattern 160 may extend in the X direction obliquely crossing the Y direction of the buried bit line 145 at an angle of about 45°. For example, portions of the device isolation layer 120, the active branch 111 and the insulation pillar 122 may be, for example, etched using a dry etch process with no etch selectivity to form the WL pattern 160 in the shape of a hollow line (e.g., a trench) which extends in the X direction. The WL pattern 160 may overlap the center of the active region 110 in the diagonal direction (X direction of FIG. 1A). The active branch 111 may be partially removed by the WL pattern 160 so as to form a vertical channel 112. According to the embodiments of the inventive concept, one active region 110 may be patterned into a plurality (e.g., 2) of vertical channels 112 which protrude vertically from outer edges of the active region 110. A vertical channel 112 may be a portion of the active branch 111 which does not horizontally overlap with the WL pattern 160. The vertical channel 112 may have a plane-shaped inner surface and a convex-shaped outer surface, as described with respect to FIG. 1A. The WL pattern 160 may expose inner walls of the vertical channel 112. The second mask 134 may be removed by, for example, an ash process. In the following drawings including FIG. 6A, the liner 150 may not be illustrated for simplicity.

Figure 7A:
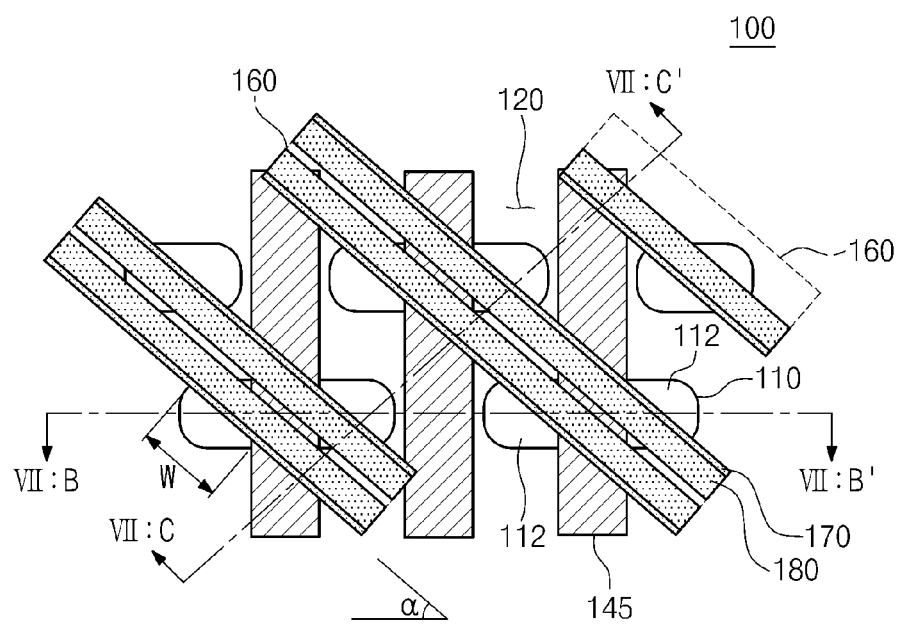
Figure 7B:
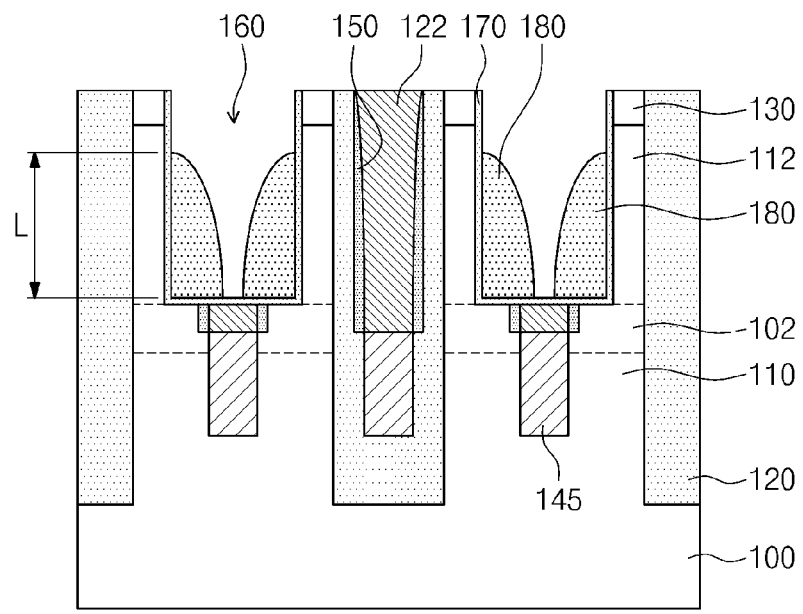
Figure 7C:
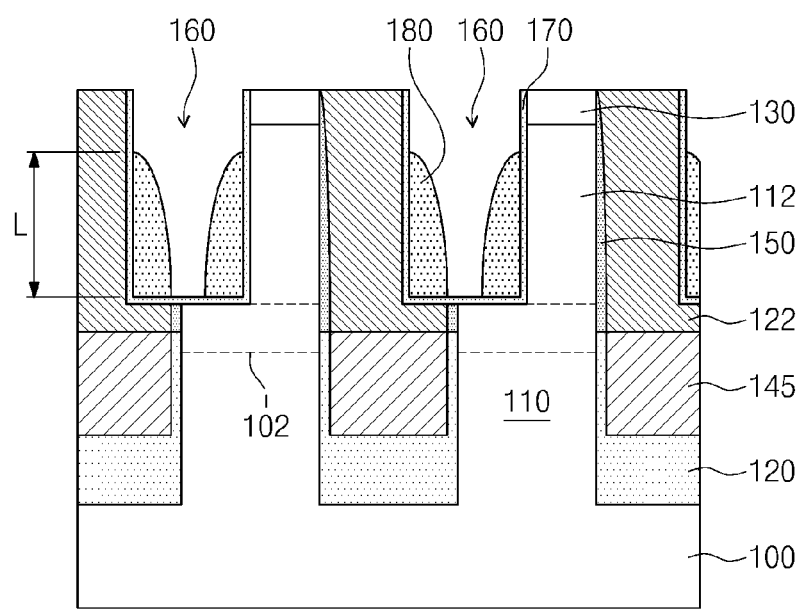

Referring to FIGS. 7A, 7B and 7C, a gate insulation layer 170 and a word line 180 may be formed on the semiconductor substrate 100 so as to extend in the X direction. The gate insulation layer 170 may be formed of insulation material. For example, a silicon oxide layer may be deposited on inner sidewall of the WL pattern 160 to form the gate insulation layer 170. As another example, the exposed portion of the vertical channel 112 may be thermally oxidized to form the gate insulation layer 170. The word line 180 may be formed of conductive material. For example, polysilicon and/or metal (e.g., TiN) may be deposited and etched back to form the word line 180 in the WL pattern 160. The word line 180 may have a width L (vertical length) identical to or less than that of the WL pattern 160. The size of the width L may be changed depending on, for example, the etch process for the word line 180. According to example embodiments of the inventive concepts, the width L of the word line 180 may be chosen arbitrarily, which may result in reproducibility of the channel length.

The word line 180 may extend in the X direction to cross the active region 110 at an angle of α degrees and a gate width or channel width W may be defined as an X directional length between the word line 180 and the vertical channel 112 (e.g., overlap length). The word line 180 may cross the center of the active region 110 and be between the plurality of vertical channels 112. The angle α between the word line 180 and the active region 110 may be designed arbitrarily. The channel width W may depend on the word line angle α. For example, the greater the word line angle α is, the shorter the channel width W may become.

Figure 8A:
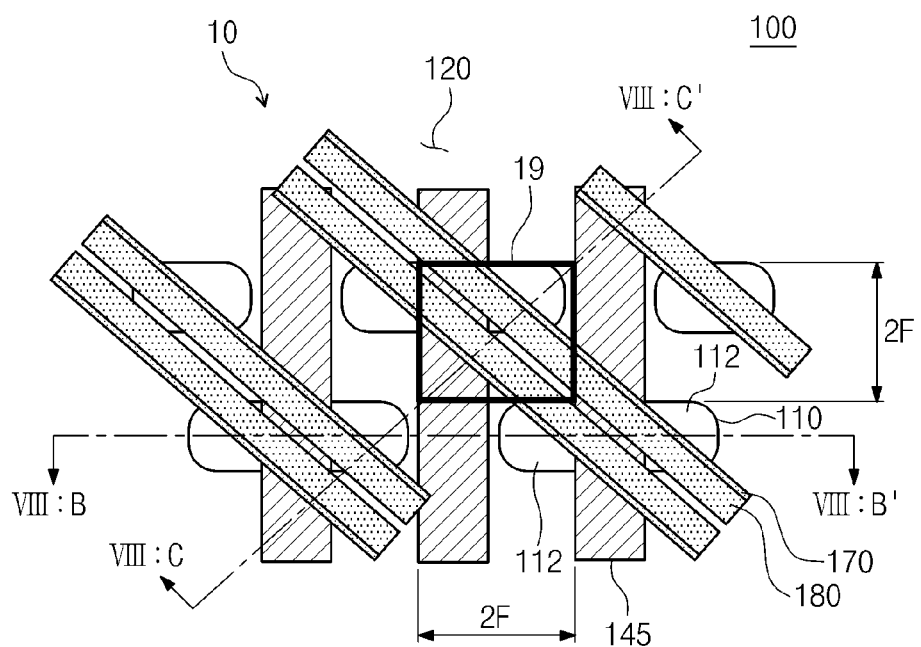
Figure 8B:
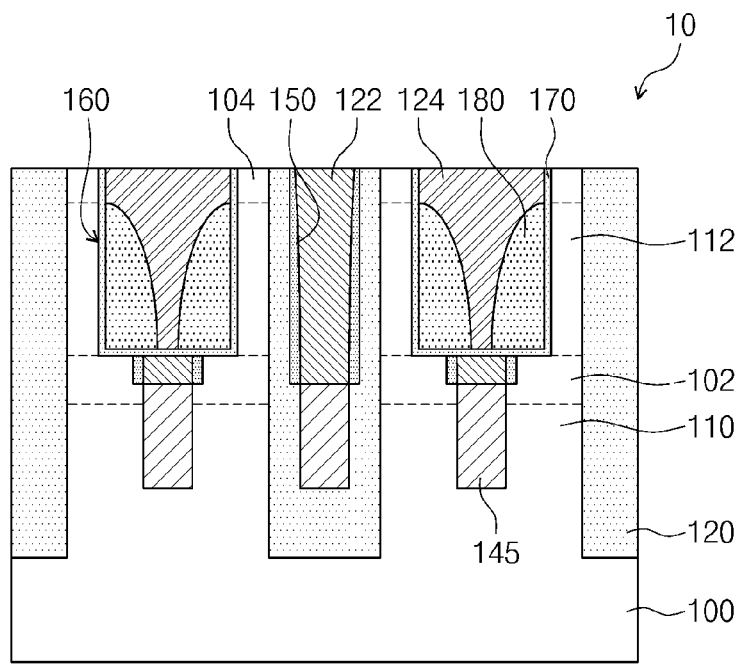
Figure 8C:
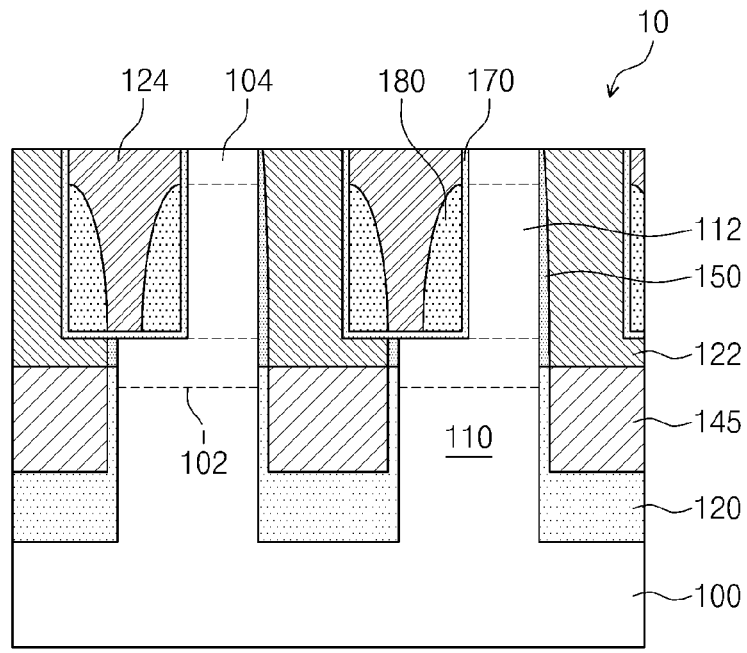

Referring to FIGS. 8A, 8B and 8C, an insulation layer 124 may be formed within the WL pattern 160 to cover the word line 180. The insulation layer 124 may be formed of, for example, silicon oxide, silicon nitride or a combination thereof. A top surface of the vertical channel 112 may be exposed by removing the hard mask 130 using, for example, an etch-back and/or CMP process. The top portion of the vertical channel 112 may be, for example, implanted with impurities to form an upper junction 104. According to example embodiments of the inventive concepts, the implant process may be performed in a self-aligned manner because only the vertical channel 104 may be exposed. The upper junction 104 may include an LDD structure formed by low-concentration doping and high-concentration doping. In example embodiments of the inventive concepts, if a pitch of the buried bit lines 145 is 2F and a pitch of the active regions 110 is 2F, an area of the memory cell 19 may be $4F^2$.

According to example embodiments of the inventive concepts, an active region 110 may be formed with an island shape, a buried bit line 145 may be formed to cross the center of an active region 110, the active region 110 may be patterned into the a plurality (e.g., 2) vertical channels 112, and a word line 180 may be formed to obliquely extend along an inner side of the vertical channel 112 of the active region 110. A vertical channel transistor 10 may be fabricated, for example, as illustrated in FIG. 1A. The vertical channel transistor 10 may be used in a peripheral region as well as a cell region. The vertical channel transistor 10 may be utilized in a logic device as well as a memory device. For example, the vertical channel transistor 10 may be a part of a DRAM device.

Figure 9A:
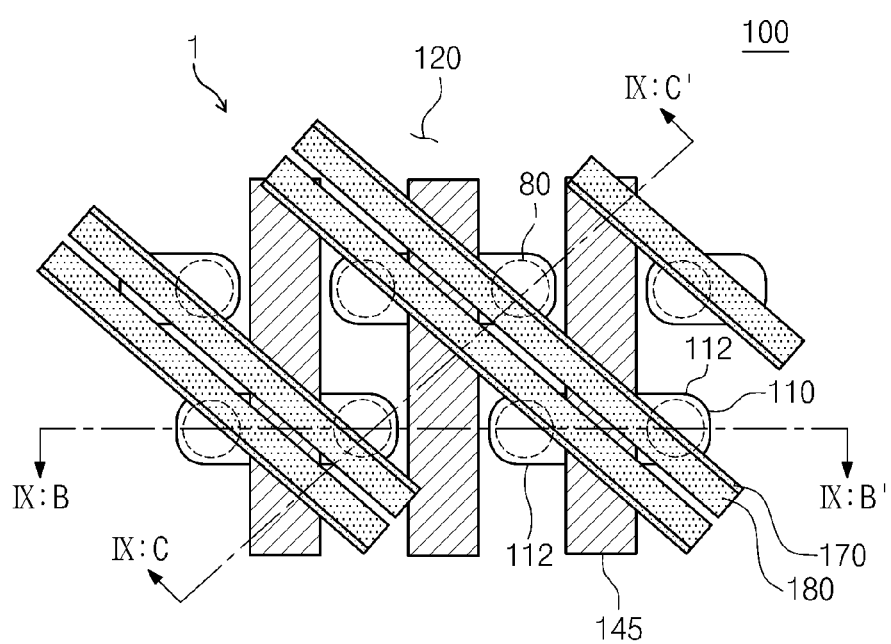
FIG. 9A is a plan view illustrating dynamic random access memory devices including vertical channel according to example embodiments of the inventive concepts.
Figure 9B:
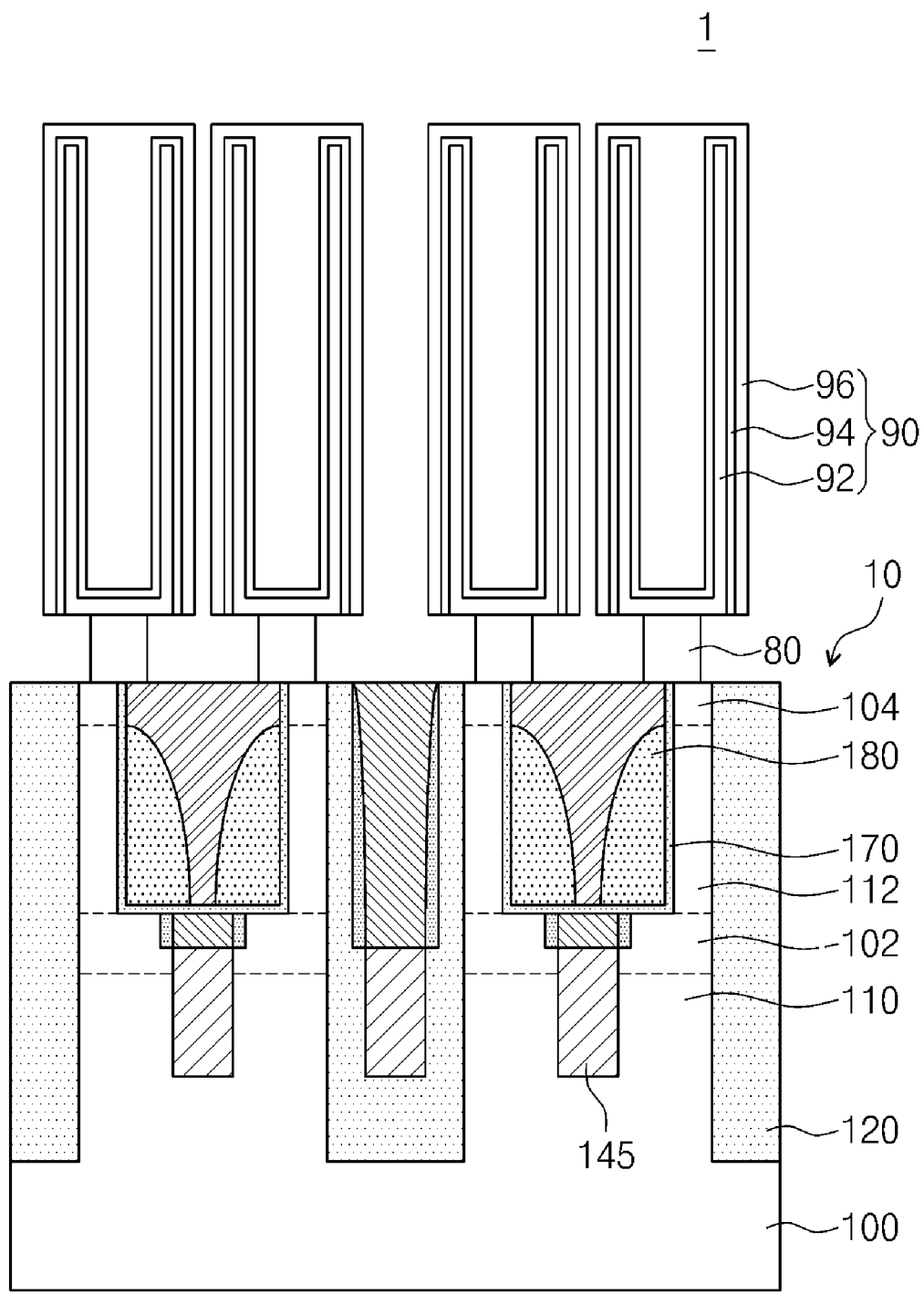
FIG. 9B is a cross-sectional view taken along a line IX:B-IX:B' of FIG. 9A.
Figure 9C:
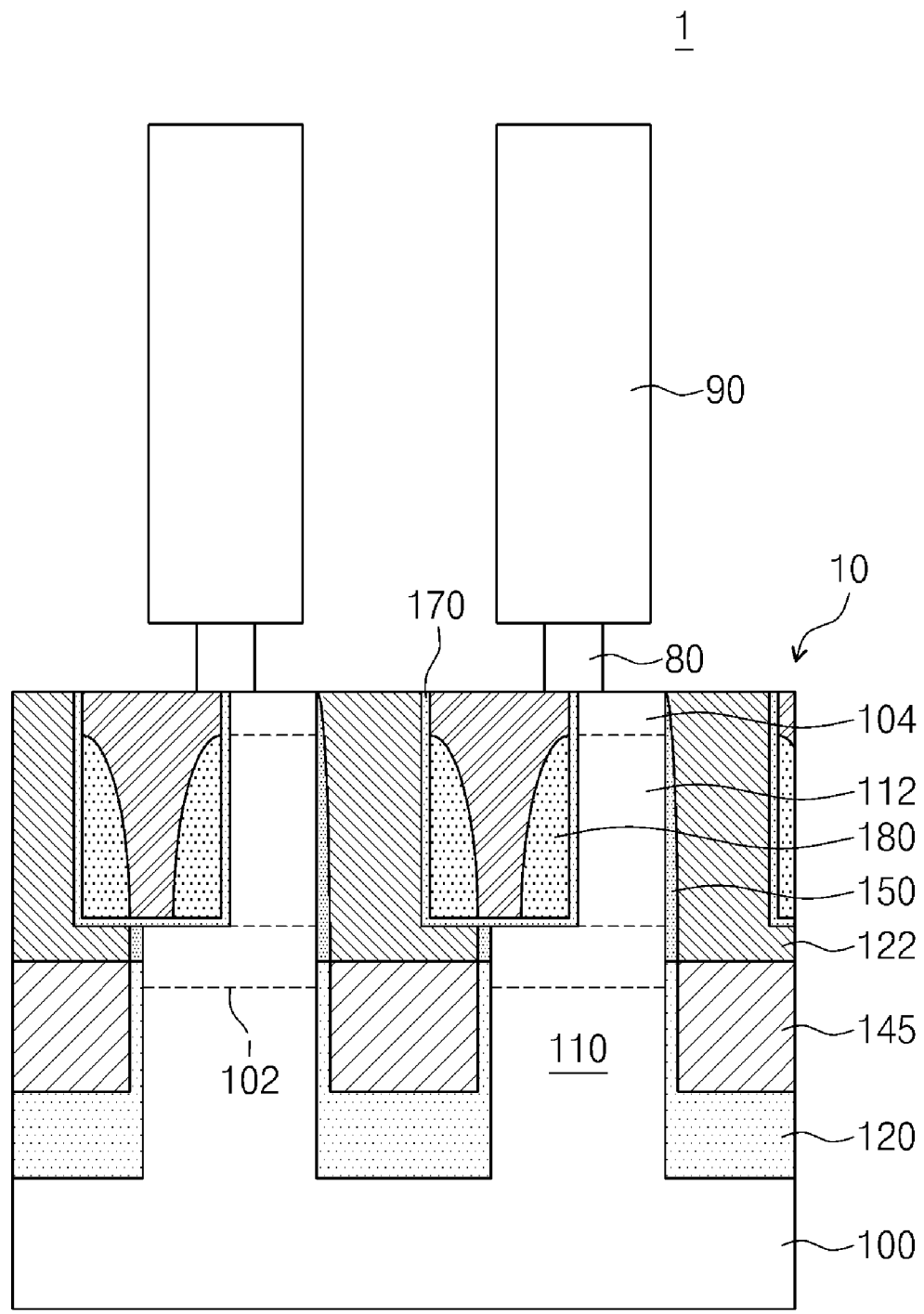
FIG. 9C is a cross-sectional view taken along a line IX:C-IX:C' of FIG. 9A.

FIG. 9A is a plan view illustrating a DRAM device including a vertical channel transistor according to example embodiments of the inventive concepts illustrated in FIG. 1A. FIG. 9B is a cross-sectional view taken along a line IX:B-IX:B' of FIG. 9A. FIG. 9C is a cross-sectional view taken along a line IX:C-IX:C' of FIG. 9A. Referring to FIGS. 9A, 9B and 9C, a DRAM device 1 may include a vertical channel transistor 10 and a capacitor 90. The capacitor 90 may have a cylindrical structure in which a dielectric layer 94 is between a lower electrode 92 and an upper electrode 96. The lower electrode 92 may be electrically connected to the upper junction 104 of the vertical channel transistor 10 through a contact 80.

As another example, the vertical channel transistor 10 may be utilized as a non-volatile memory device by substituting the gate insulation layer 170 with an ONO layer capable of trapping carriers. As still another example, the vertical channel transistor 10 may be utilized as a phase change memory device (PRAM) by forming a phase change material layer between the word line 180 and the buried bit line 145.

FIGS. 10A, 11A, 12A and 13A are plan views illustrating methods fabricating vertical channel transistors according to example embodiments of the inventive concepts illustrated in FIG. 1B. FIGS. 10B, 11B, 12B and 13B are cross-sectional views taken along lines X:B-X:B', XI:B-XI:B', XII:B-XII:B' and XIII:B-XIII:B' of FIGS. 10A, 11A, 12A and 13A, respectively. FIGS. 10C, 11C, 12C and 13C are cross-sectional views taken along lines X:C-X:C', XI:C-XI:C', XII:C-XII:C' and XIII:C-XIII:C' of FIGS. 10A, 11A, 12A and 13A, respectively. For brevity, description of previously described features is omitted below.

Figure 10A:
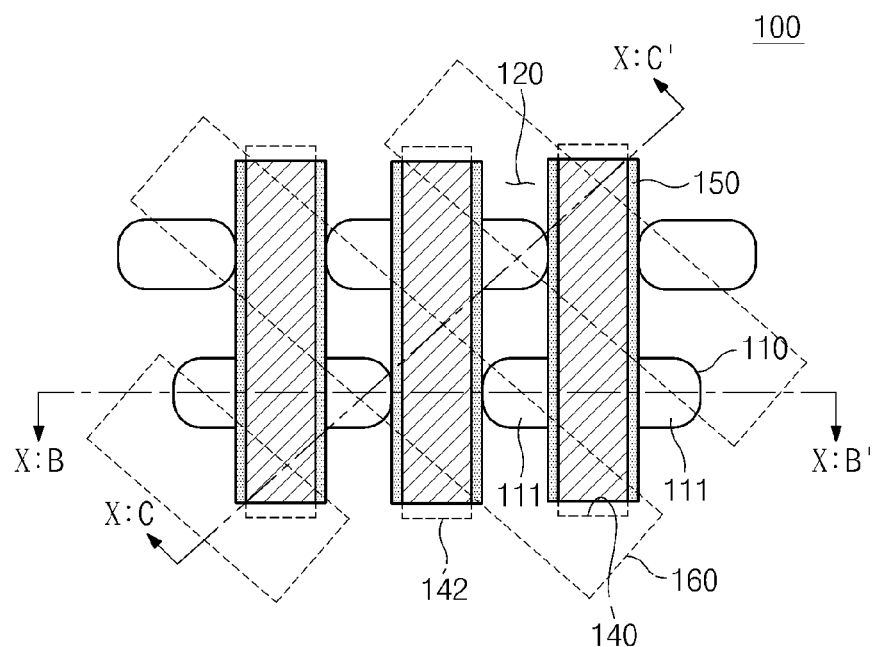
FIGS. 10A, 11A, 12A and 13A are plan views illustrating methods of fabricating vertical channel transistors according to example embodiments of the inventive concepts illustrated in FIG. 1B.
Figure 10B:
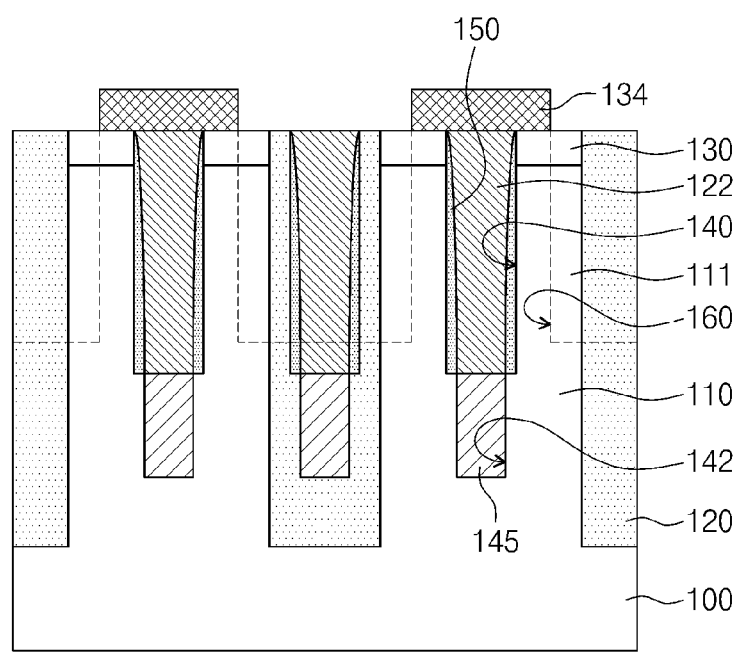
FIGS. 10B, 11B, 12B and 13B are cross-sectional views taken along lines X:B-X:B', XI:B-XI:B', XII:B-XII:B' and XIII:B-XIII:B' of FIGS. 10A, 11A, 12A and 13A, respectively.
Figure 10C:
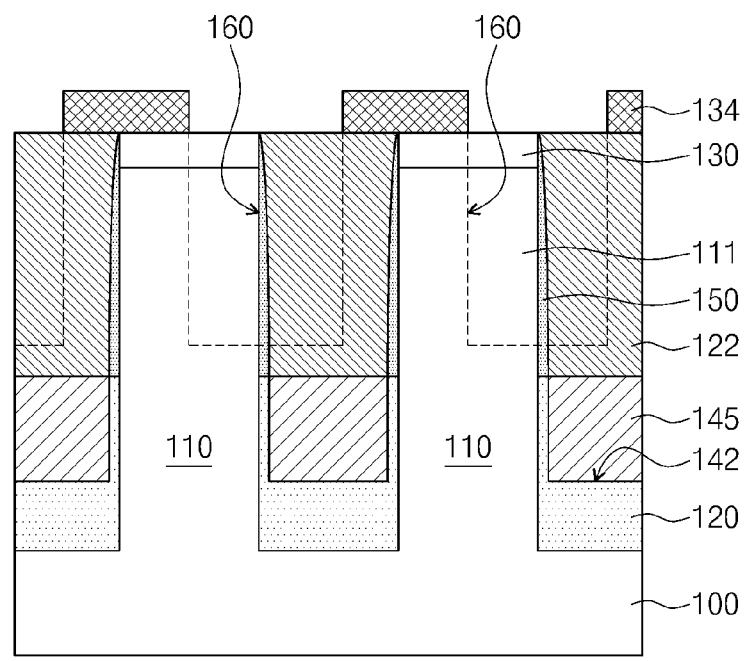
FIGS. 10C, 11C, 12C and 13C are cross-sectional views taken along lines X:C-X:C', XI:C-XI:C', XII:C-XII:C' and XIII:C-XIII:C' of FIGS. 10A, 11A, 12A and 13A, respectively.

Referring to FIGS. 10A-10C, active regions 110 defined by a device isolation layer 120 may be formed on a semiconductor substrate 100 using methods identical or similar to those described with reference to FIGS. 2A-2C. A BBL pattern 140 may be formed to cross a center of the active region 110 in the longitudinal direction (Y direction of FIG. 1B) using methods identical or similar to those described with reference to FIGS. 3A-3C. The active region 110 may be patterned into a plurality (e.g., 2) of active branches 111 simultaneously with the formation of the BBL pattern 140. A D-BBL pattern 142 may be formed under the BBL pattern 140 to extend in the Y direction using methods identical or similar to those described with reference to FIGS. 4A-4C. A buried bit line 145 may be formed to fill the D-BBL pattern 142 by methods identical or similar to those illustrated in FIGS. 5A-5C. An insulation pillar 122 may be formed in the BBL pattern 140 so as to cover the buried bit line 145.

A second mask 134 may be formed on the semiconductor substrate 100 so as to define a word line pattern 160. The second mask 134 may be formed in the shape of line extending in the diagonal direction (X direction of FIG. 1B) and exposing an outer portion of the active branch 111 by covering the center of the active region 110 as well as an inner portion of the active branch 111. The outer portion of the active branch 111 may be overlapped by the word line pattern 160.

Figure 11A:
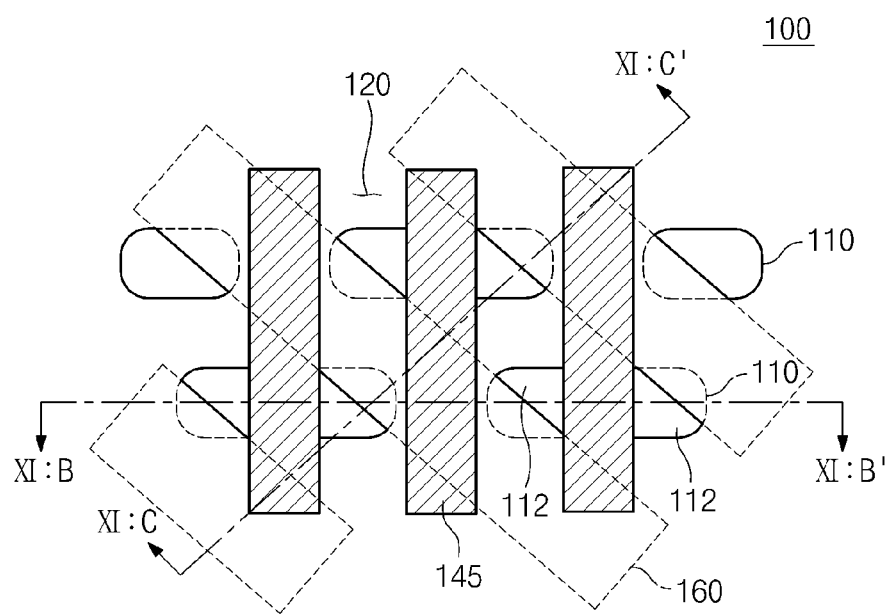
Figure 11B:
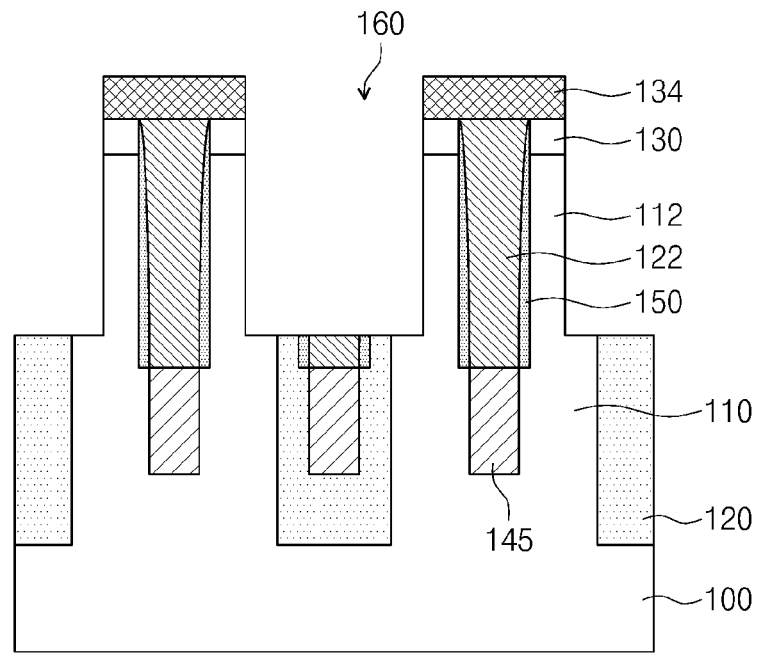
Figure 11C:
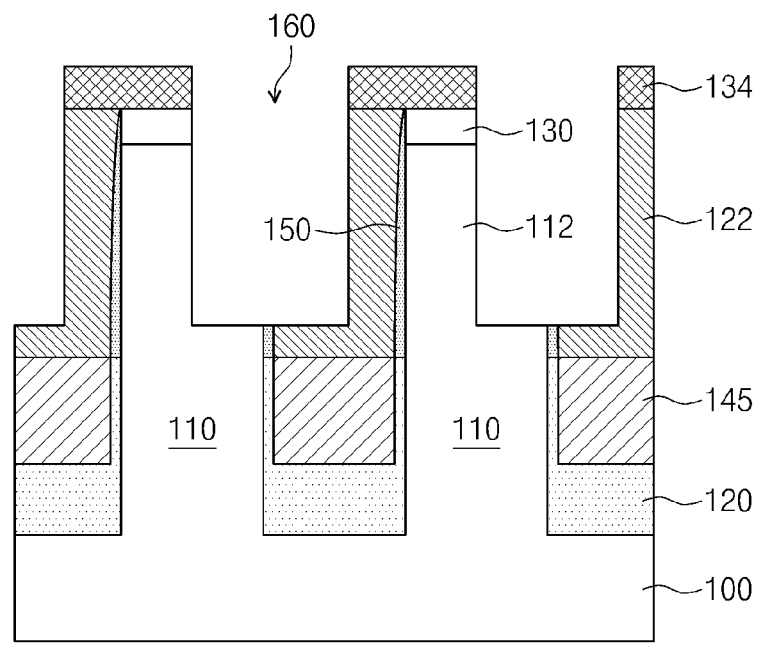
Figure 12A:
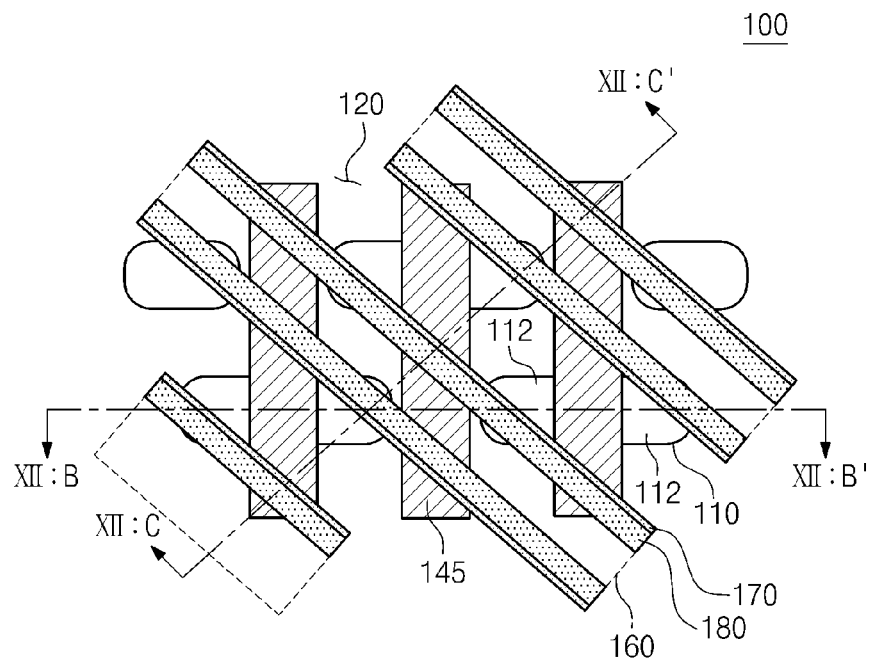
Figure 12B:
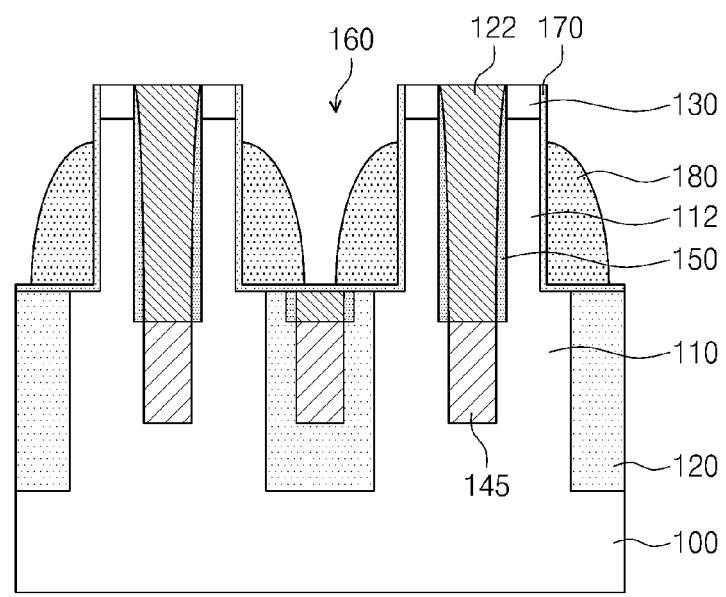
Figure 12C:
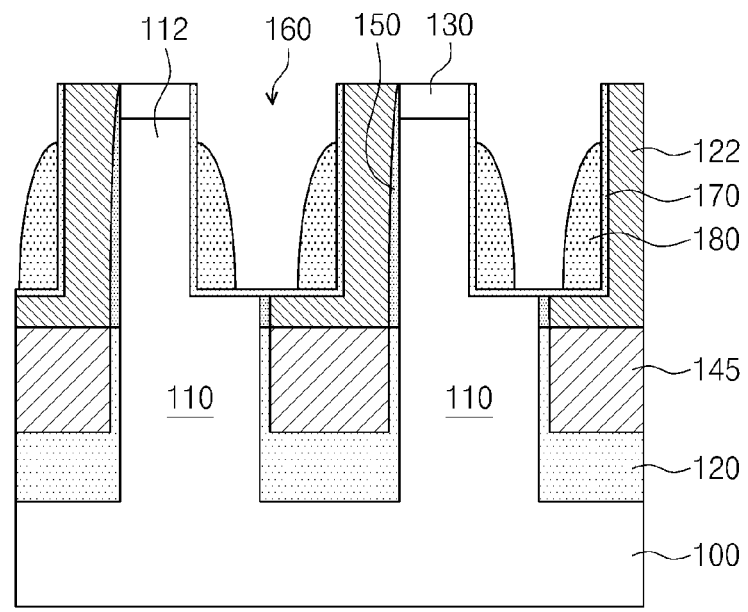
Figure 13A:
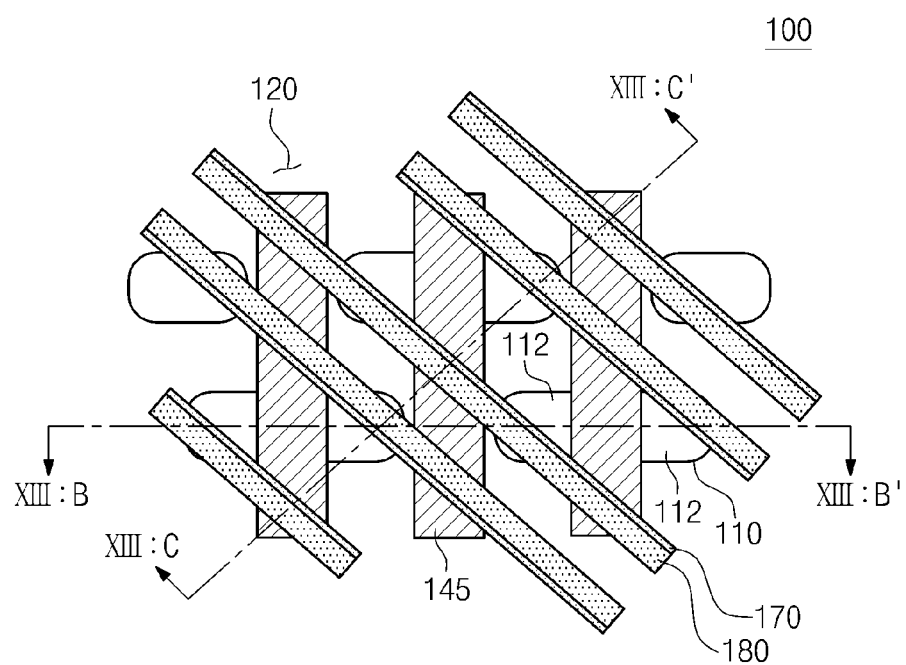
Figure 13B:
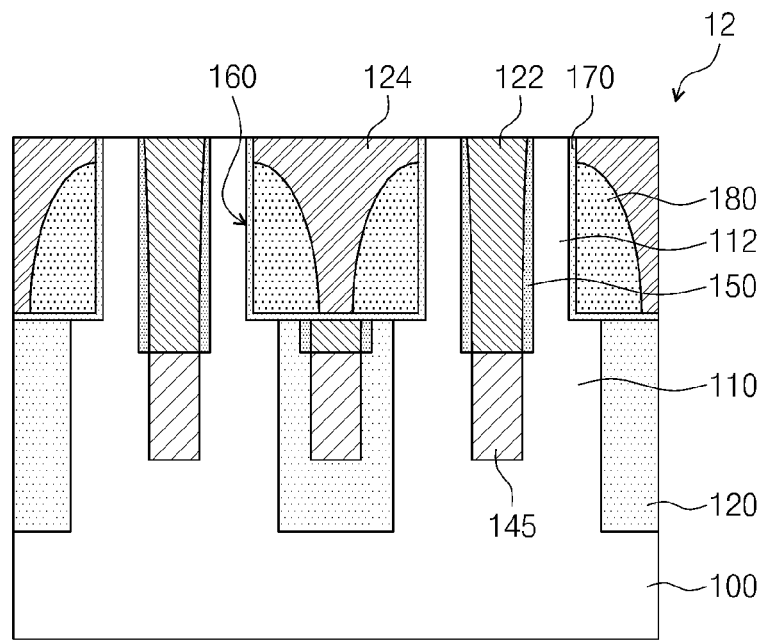
Figure 13C:
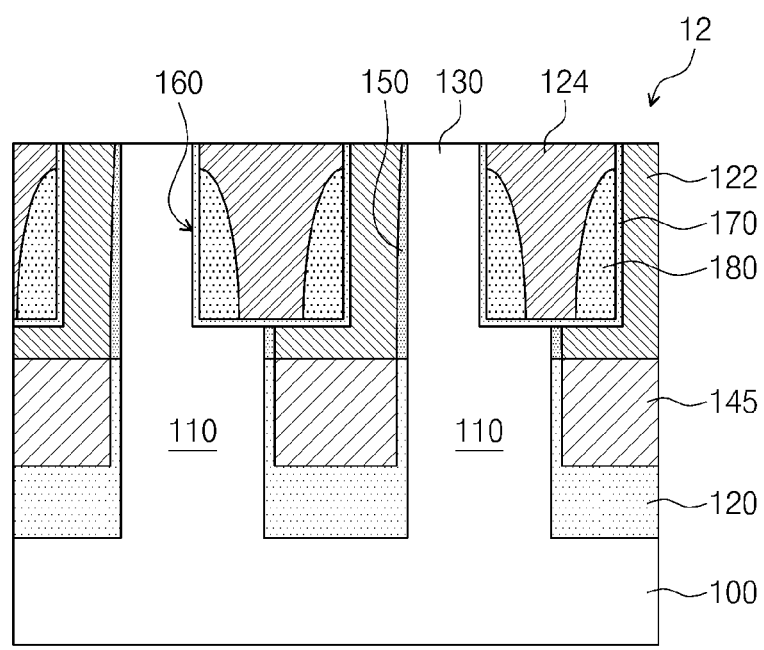

Referring to FIGS. 11A-11C, the WL pattern 160 may be formed by, for example, an etch process using the second mask 134. The WL pattern 160 may be formed in the shape of hollow line (e.g., a trench) to extend in the X direction obliquely crossing the buried bit line 145. The active branch 111 may be partially removed to form a vertical channel 112. According to example embodiments of the inventive concepts, the active region 110 may be patterned into a plurality of vertical channels 112 protruding vertically from the edge of the active region 110. The second mask 134 may be removed by, for example, an ash process Referring to FIGS. 12A-12C, a gate insulation layer 170 and a word line 180 may be formed in the WL pattern 160 so as to extend in the X direction. According to example embodiments of the inventive concepts, the word line 180 may be formed to cross the edge of the active region 110 in the X direction on the outside the vertical channel 112. Referring to FIGS. 13A-13C, an insulation layer 124 may be formed in the WL pattern 160 and a top surface of the vertical channel 112 may be exposed by, for example, removing a hard mask 130 through an etch-back and/or CMP process.

According to example embodiments of the inventive concepts, an active region 110 may be formed with an island shape, a buried bit line 145 may be formed to cross the center of the active region 110, the active region 110 may be patterned into a plurality of vertical channels 112, and a word line 180 may be formed to obliquely extend along an outer side of the vertical channel 112. According to some example embodiments, a vertical channel transistor 12 may be fabricated, for example, as illustrated in FIG. 1B.

FIGS. 14A, 15A, 16A and 17A are plan views illustrating methods of fabricating vertical channel transistors according to example embodiments of the inventive concepts illustrated in FIG. 1C. FIGS. 14B, 15B, 16B and 17B are cross-sectional views taken along lines XIV:B-XIV:B', XV:B-XV:B', XVI:B-XVI:B' and XVII:B-XVII:B' of FIGS. 14A, 15A, 16A and 17A, respectively. FIGS. 14C, 15C, 16C an 17C are cross-sectional views taken along lines XIV:C-XIV:C', XV:C-XV:C', XVI:C-XVI:C' and XVII:C-XVII:C' of FIGS. 14A, 15A, 16A and 17A, respectively.

Figure 14A:
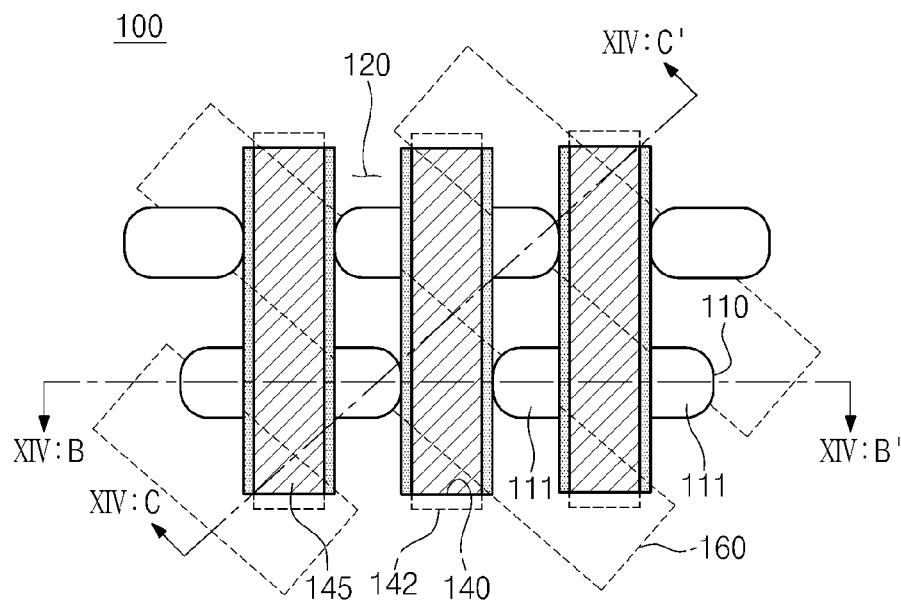
FIGS. 14A, 15A, 16A and 17A are plan views illustrating methods of fabricating vertical channel transistors according to example embodiments of the inventive concepts illustrated in FIG. 1C.
Figure 14B:
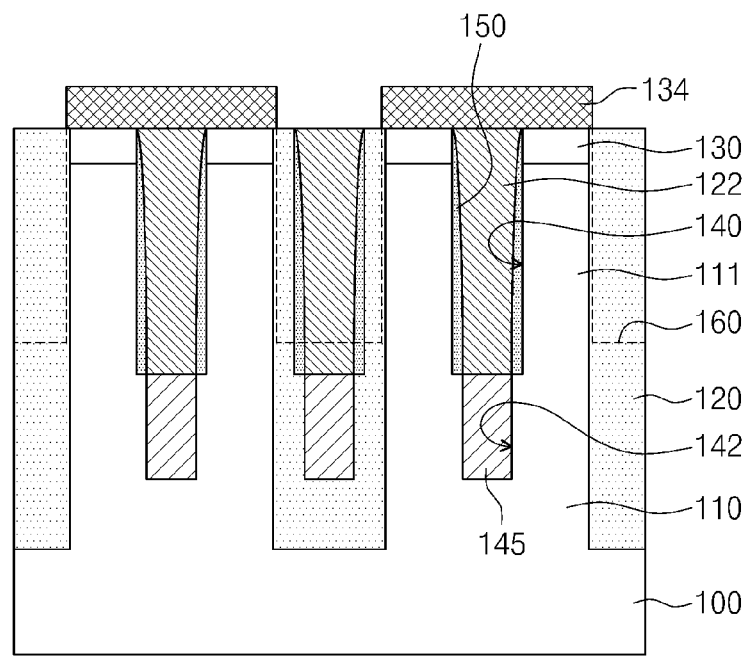
FIGS. 14B, 15B, 16B an 17B are cross-sectional views taken along lines XIV:B-XIV:B', XV:B-XV:B', XVI:B-XVI:B' and XVII:B-XVII:B' of FIGS. 14A, 15A, 16A and 17A, respectively.
Figure 14C:
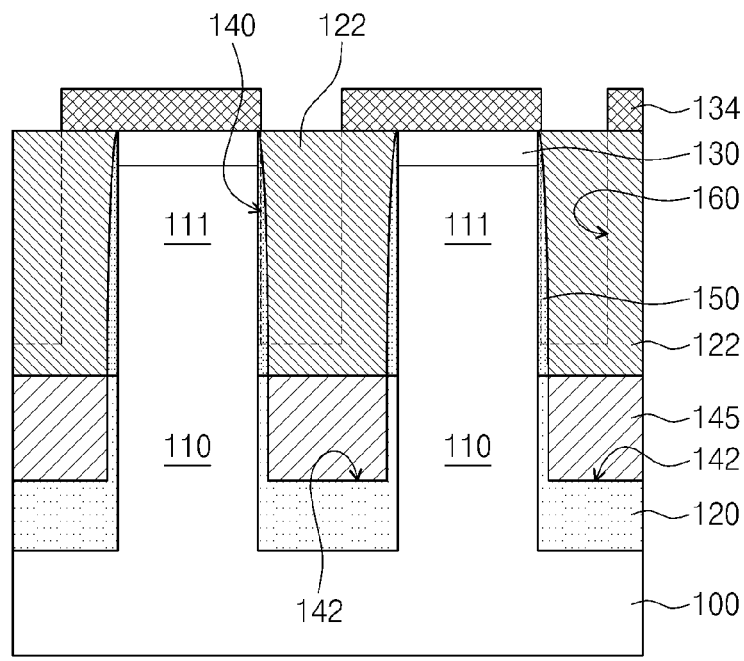
FIGS. 14C, 15C, 16C an 17C are cross-sectional views taken along lines XIV:C-XIV:C', XV:C-XV:C', XVI:C-XVI:C' and XVII:C-XVII:C' of FIGS. 14A, 15A, 16A and 17A, respectively.

Referring to FIGS. 14A-14C, an active region 110 defined by a device isolation layer 120 may be formed on the semiconductor substrate 100, and a BBL pattern 140 may be formed to cross a center of the active region 110 in the longitudinal direction (Y direction of FIG. 1C). The active region 110 may be patterned into a plurality (e.g., 2) of active branches 111 simultaneously with the formation of the BBL pattern 140. A D-BBL pattern 142 may be formed under the BBL pattern 140 to extend in the Y direction, a buried bit line 145 may be formed in the D-BBL pattern 142, and an insulation pillar 122 may be foamed in the BBL pattern 140 so as to cover the buried bit line 145. A second mask 134 may be formed on the semiconductor substrate 100 so as to define a word line pattern 160. The second mask 134 may extend in the diagonal direction (X direction of FIG. 1C) and may cover the active branch 111.

Figure 15A:
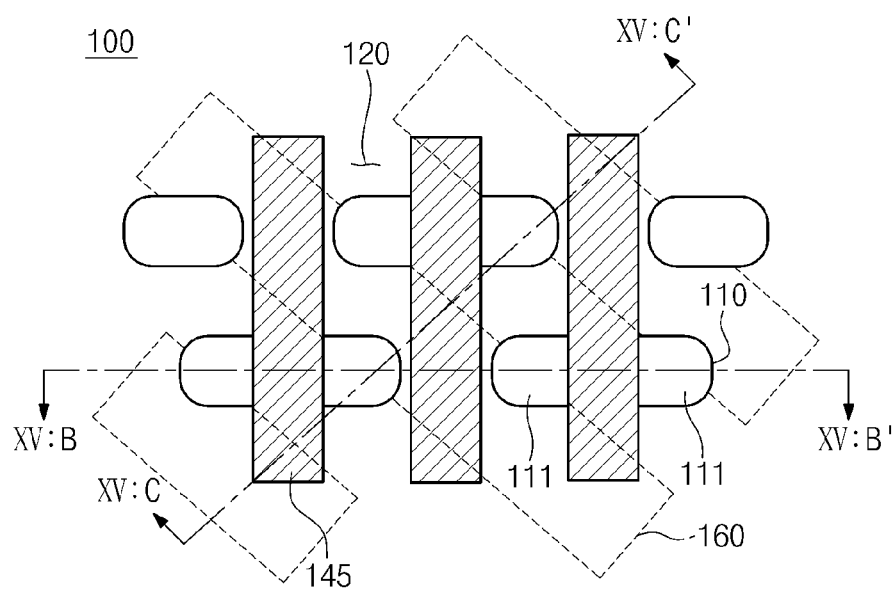
Figure 15B:
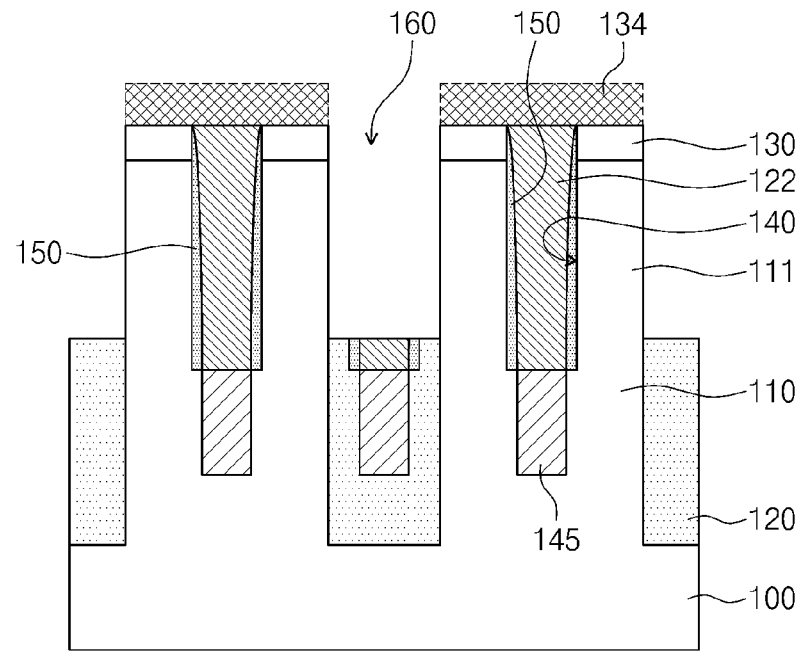
Figure 15C:
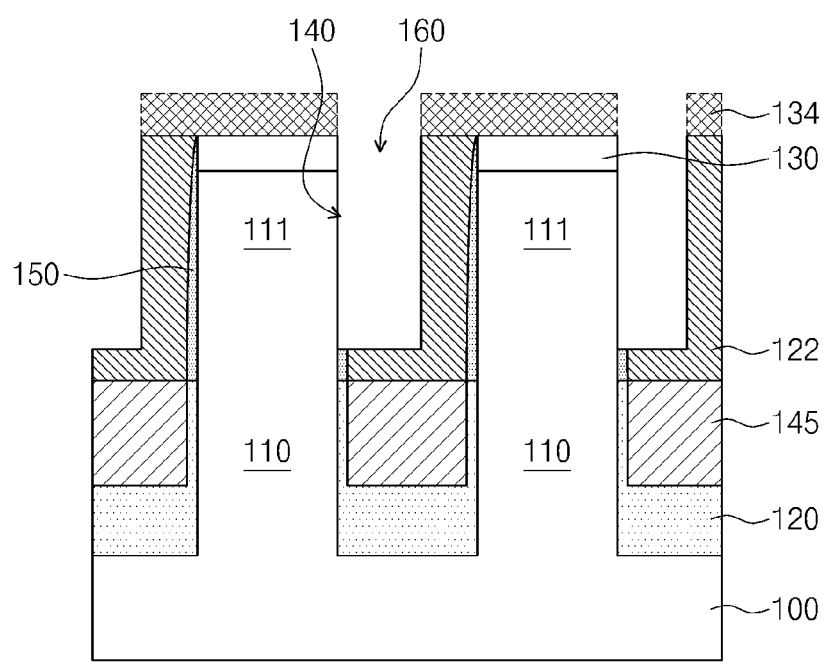

Referring to FIGS. 15A-15C, the WL pattern 160 may be foamed by, for example, an etch process using the second mask 134. The WL pattern 160 may be foamed in the shape of hollow line (e.g., a trench) to extend in the X direction obliquely crossing the buried bit line 145 at an angle of about 45°. The WL pattern 160 may be formed not to be overlapped with the active branch 111 in a horizontal direction such that the active branch 111 may remain intact. According to example embodiments of the inventive concepts, the active branch 111 may be utilized as a vertical channel. The second mask 134 may be removed by, for example, an ash process.

Figure 16A:
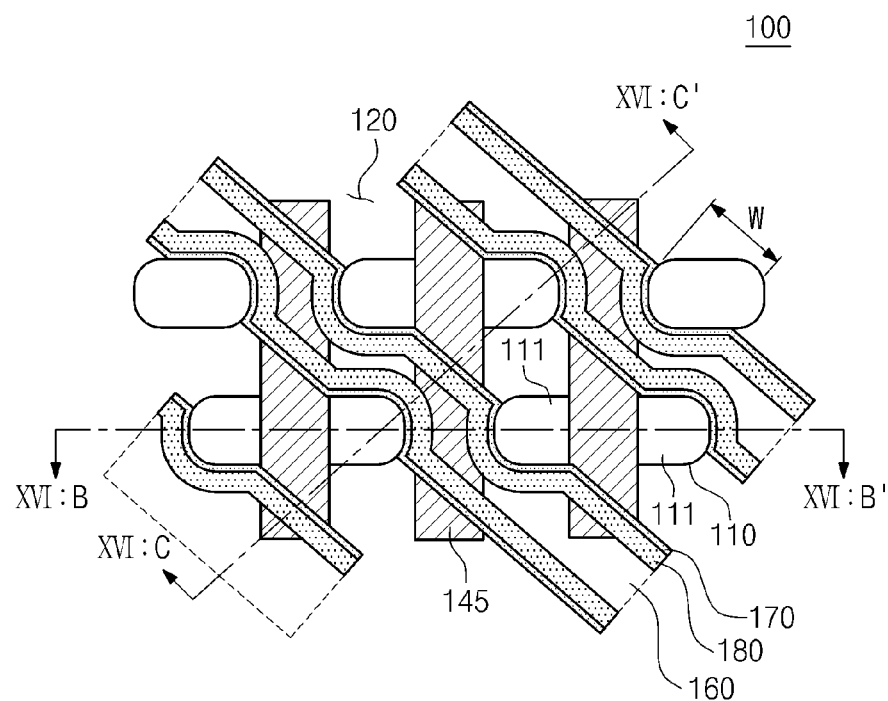
Figure 16B:
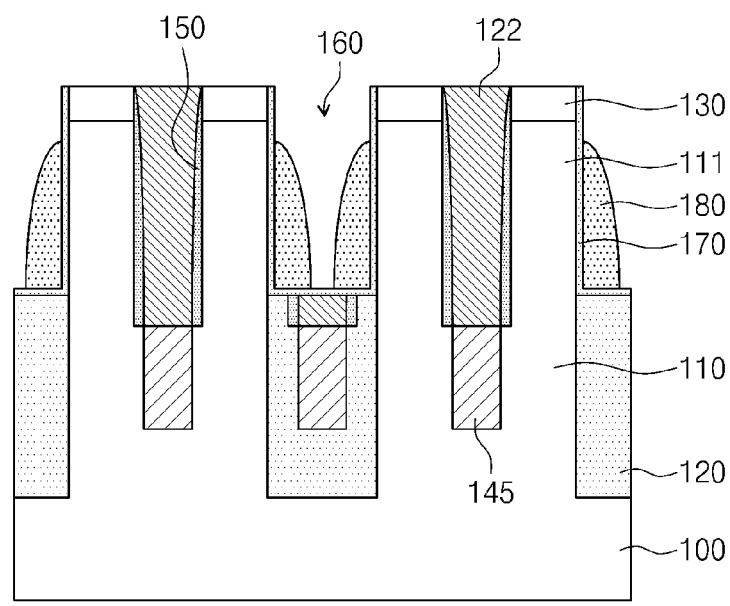
Figure 16C:
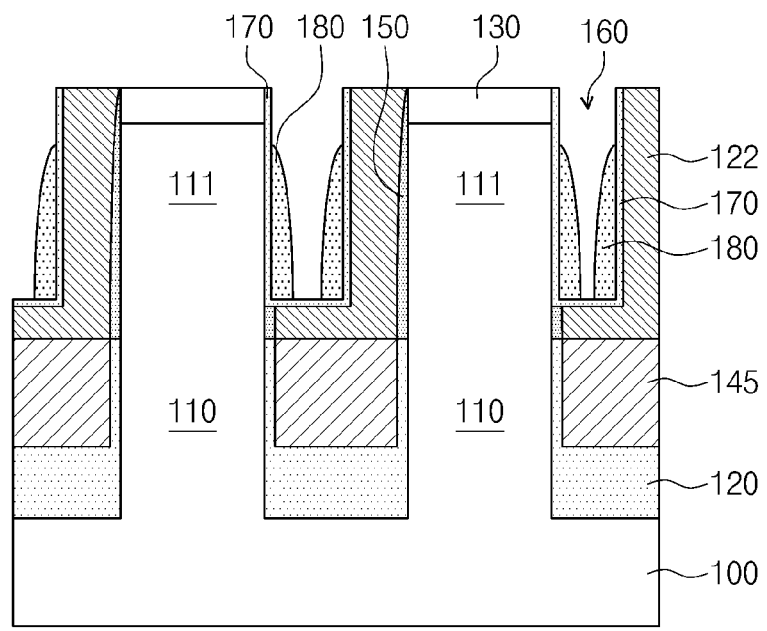
Figure 17A:
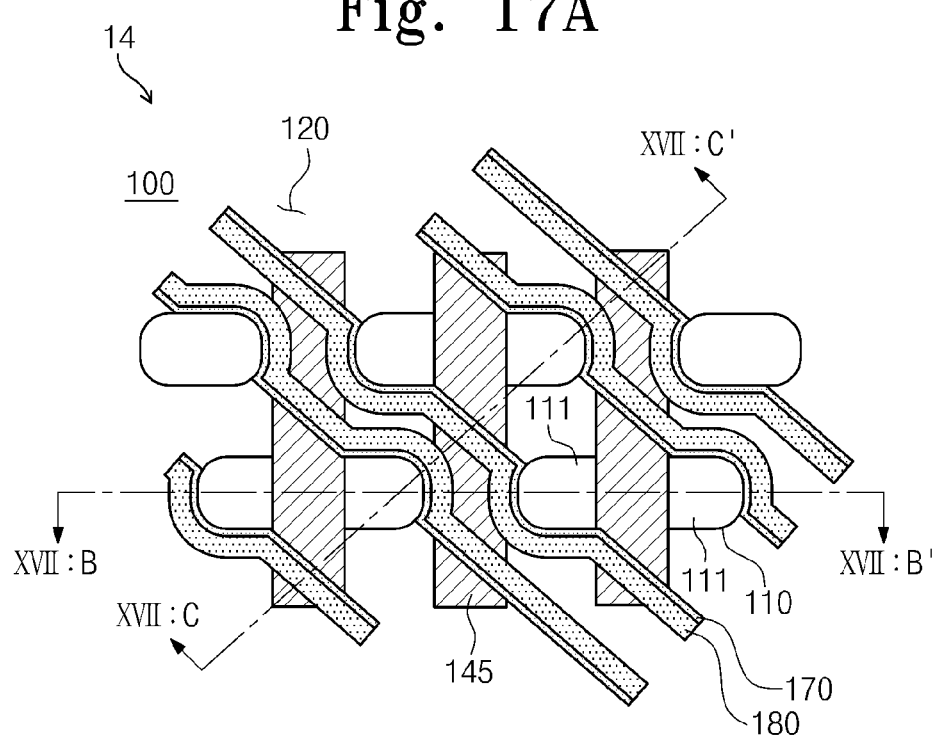
Figure 17B:
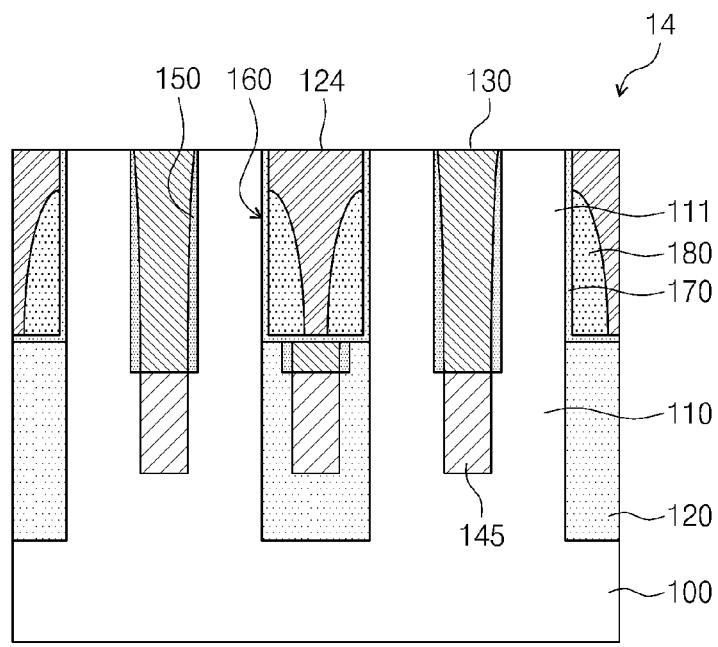
Figure 17C:
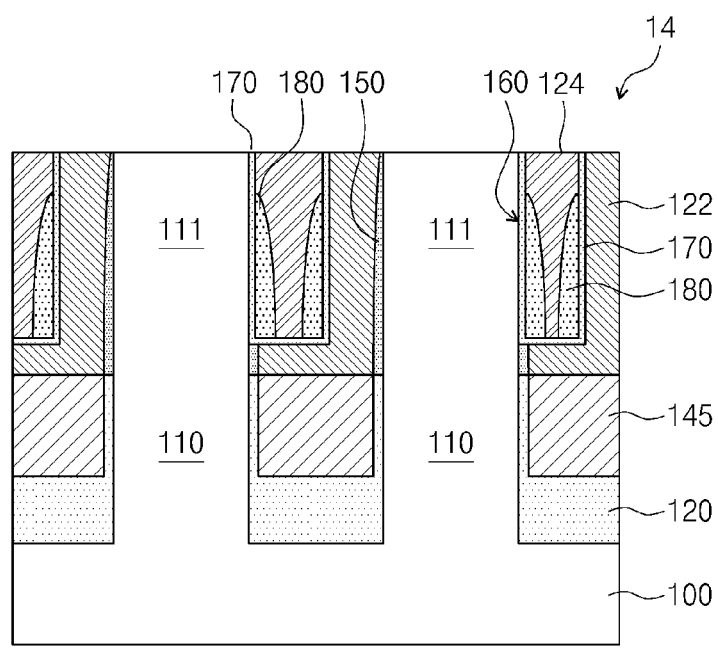

Referring to FIGS. 16A-16C, a gate insulation layer 170 and a word line 180 may be formed in the WL pattern 160. Each of the gate insulation layer 170 and the word line 180 may include a round portion facing the vertical channel 111. According to example embodiments of the inventive concepts, the word line 180 may be formed in a shape coinciding with a shape of the outer side of the vertical channel 111 without overlapping the active region 110 in the horizontal direction. The rounded word line 180 may be of increased channel width W compared to, for example, the line-shaped word line 180 illustrated in FIG. 12A. Referring to FIGS. 17A-17C, an insulation layer 124 may be formed in the WL pattern 160 and a hard mask 130 may be removed by, for example, an etch or CMP process, which exposes a top surface of the vertical channel 111.

According to example embodiments of the inventive concepts, an active region 110 may be formed with an island shape, a buried bit line 145 may be formed to cross the center of the active region 110, the active region 110 may be patterned into a plurality of vertical channels 111, and a word line 180 may be formed to obliquely extend along, and wrap around, an outer side of the vertical channel 111. According to some example embodiments, a vertical channel transistor 14 may be fabricated, for example, as illustrated in FIG. 1C.

Figure 18A:
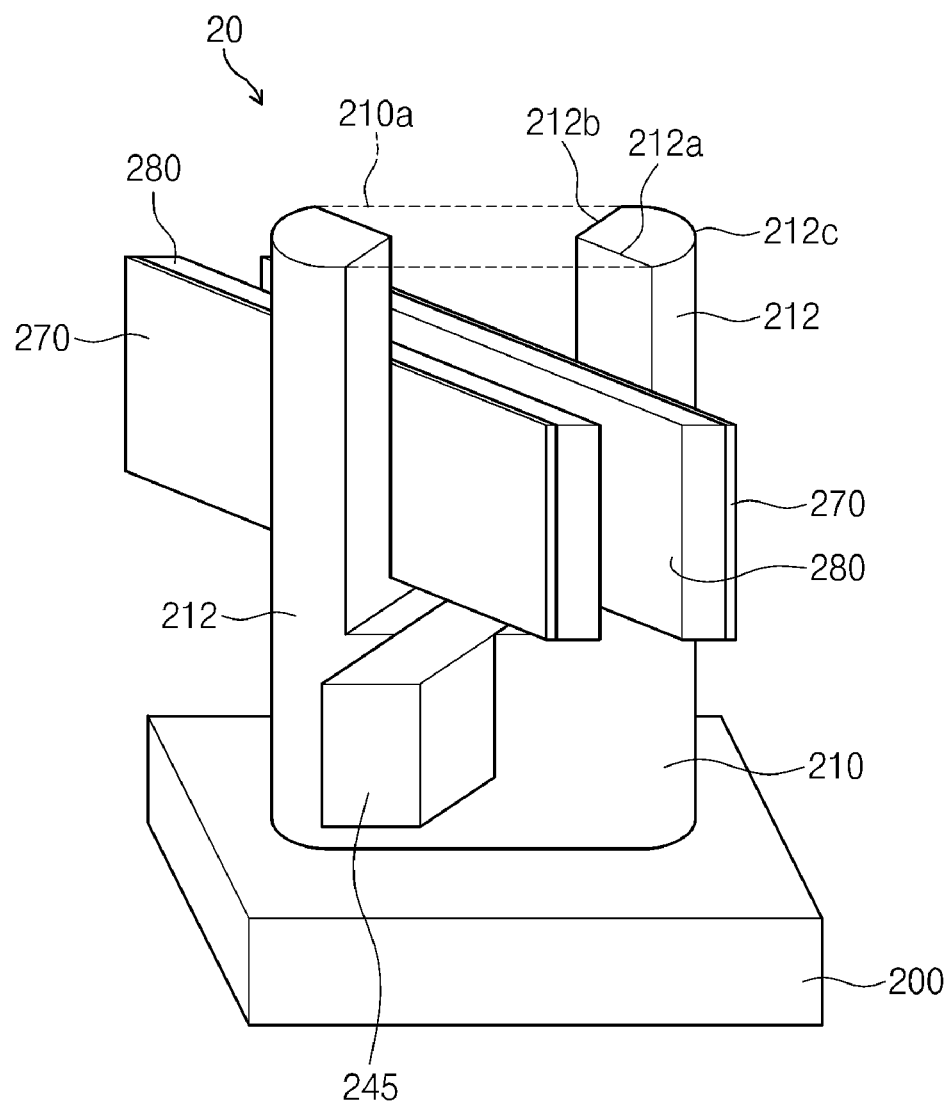
FIG. 18A-18C are perspective views illustrating vertical channel transistors according to example embodiments of the inventive concepts.

FIG. 18A is a perspective view illustrating vertical channel transistors according to example embodiments of the inventive concepts. Referring to FIG. 18A, a vertical channel transistor 20 may include a word line 280 extending in the X direction on a semiconductor substrate 200, a buried bit line 245 extending in the Y direction substantially perpendicular to the X direction, an active region 210 protruding in the Z direction from the semiconductor substrate 200 and being of an island shape extending in the C direction obliquely crossing the X direction at an angle of β degrees. The angle β may be in the range from about 0° to 90°, for example about 45°. According to example embodiments of the inventive concepts, the buried bit line 245 may be perpendicular to the word line 280 but not to the active region 210. The buried bit line 245 may intersect the active region 210 at an angle of, for example, about 90°-β.

The active region 210 may include a plurality of vertical channels 212 (e.g., 2) with a plurality of word lines 280 (e.g., 2) in between. The vertical channel 212 may have first and second inner surfaces 212a and 212b facing in a direction of the center of the active region 210, and an outer surface 212c facing away from the direction of the center of the active region 210. The first and second inner surfaces 212a and 212b may be, for example, planar and the outer surface 212c may be, for example, convex. The word line 280 may face and be closest to the first inner surface 212a of the vertical channel 212. The vertical channel 212 may be formed by, for example, removing a portion 210a (dotted line) of the active region 210. The removed portion 210a may include a central portion of the active region 210.

According to example embodiments of the inventive concepts, a gate insulation layer 270 may be between a first inner surface 212a of a vertical channel 212 and a word line 280. The word line 280 may be an inner word line obliquely crossing the center of an active region 210. A vertical channel transistor 20 may include the word line 280 facing the first inner surface 212a of the vertical channel 212 at the center of the active region 210 and may be substantially perpendicular to a buried bit line 245.

Figure 18B:
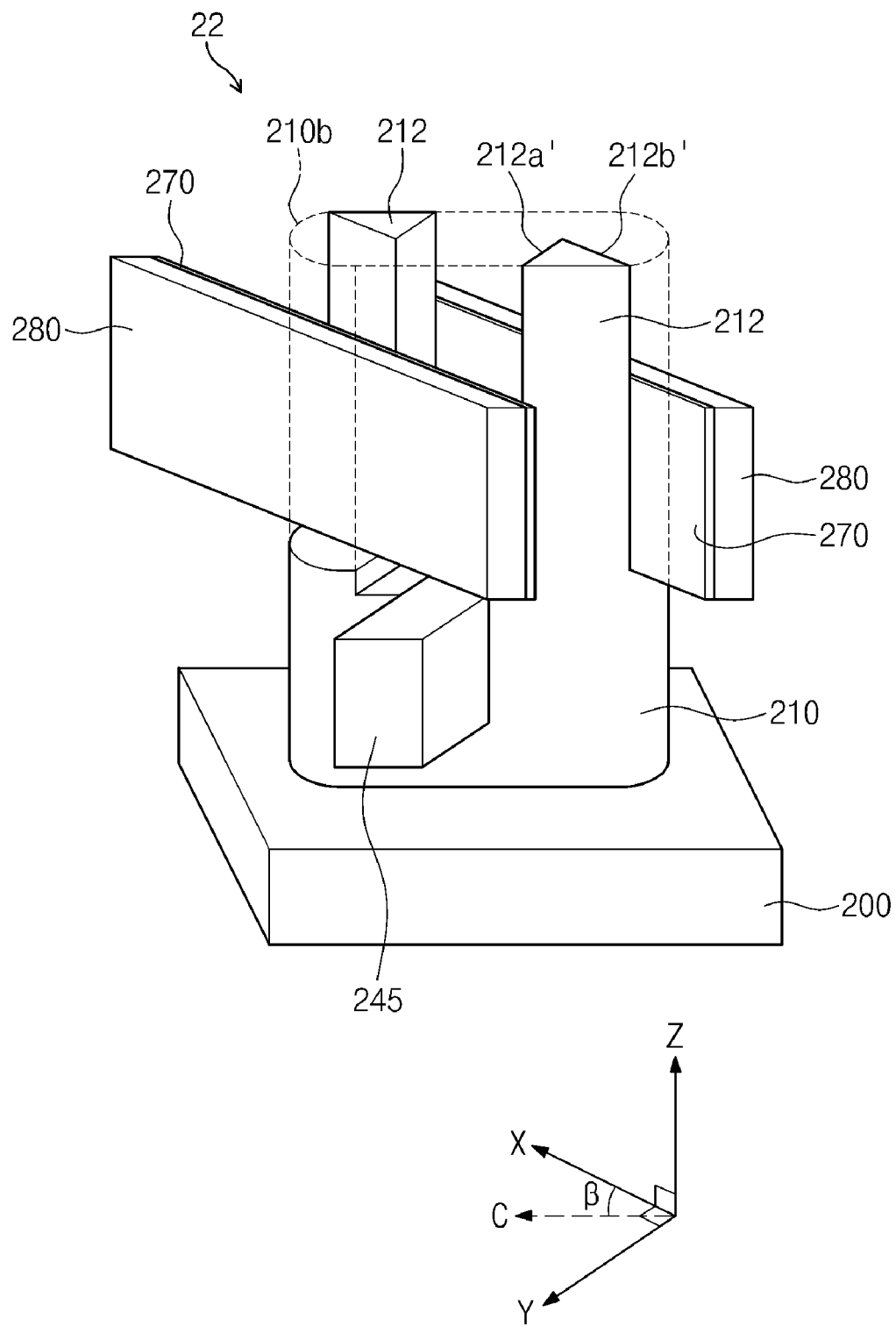

FIG. 18B is a perspective view illustrating vertical channel transistors according to example embodiments of the inventive concepts. Referring to FIG. 18B, a vertical channel transistor 22 may include a word line 280 extending in the X direction on a semiconductor substrate 200, a buried bit line 245 extending in the Y direction substantially perpendicular to the X direction, an active region 210 protruding in the Z direction from the semiconductor substrate 200 and being of an island shape extending in the C direction obliquely crossing the X direction at an angle of β degrees. The angle β may be in the range from about 0° to 90°, for example about 45°.

The active region 210 may have a plurality (e.g., 2) of vertical channels 212 and the word line 280 may be outside the vertical channel 212. The vertical channel 212 may have an inner surface 212a' facing an inside of the active region 210, and an outer surface 212b' facing away from the active region 210. The inner and outer surfaces 212a' and 212b' may be, for example, planar. The word line 280 may be closer to the outer surface 212b' than to the inner surface 212a' of the vertical channel 212. The vertical channel 212 may be formed by removing a portion 210b (dotted line) of the active region 210. The removed portion 210b may include portions of edges and a center of the active region 210.

According to example embodiments of the inventive concepts, a gate insulation layer 270 may be between an outer surface 212b' of a vertical channel 212 and a word line 280. The word line 280 may be an outer word line crossing the edge of an active region 210. A vertical channel transistor 22 may include the word line 280 facing the outer surface 212b' of the vertical channel 212 at the edge of the active region 210 and the word line 280 may be substantially perpendicular to a buried bit line 245.

Figure 18C:
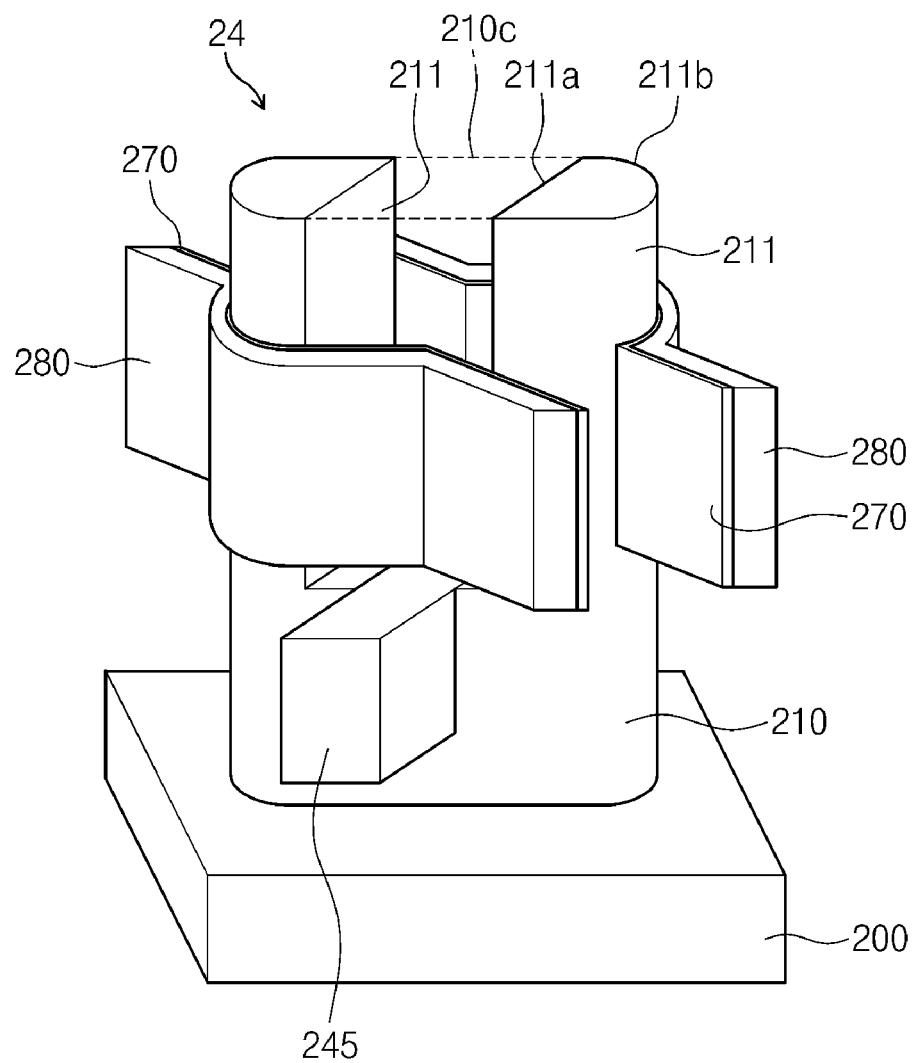

FIG. 18C is a perspective view illustrating vertical channel transistors according to example embodiments of the inventive concepts. Referring to FIG. 18C, a vertical channel transistor 24 may include a word line 280 extending in the X direction on a semiconductor substrate 200, a buried bit line 245 extending in the Y direction substantially perpendicular to the X direction, an active region 210 protruding in the Z direction from the semiconductor substrate 200 and being of an island shape extending in the C direction obliquely crossing the X direction at an angle of β degrees. The angle β may be in the range from about 0° to 90°, for example about 45°.

The active region 210 may have a plurality (e.g., 2) of vertical channels 211 and the word line 280 may be outside the vertical channel 211. The vertical channel 211 may have an outer surface 211b facing the word line 280 and an inner surface 211a opposite the outer surface 211b. The inner surface 211a may be, for example, planar and the outer surface 211b may be, for example, convex. The word line 280 may include a curved portion facing the outer surface 211b of the vertical channel 211. The word line 280 may wrap around the outer surface 211b. The vertical channel 211 may be formed by removing a portion 210c (dotted line) of the active region 210. The removed portion 210c may include a central portion of the active region 210.

According to example embodiments of the inventive concepts, a gate insulation layer 270 may be between an outer surface 211b of a vertical channel 211 and a word line 280. The word line 280 may be an outer word line with a curved shape along an outside of an active region 210. A vertical channel transistor 24 may be formed in which the word line 280 is formed along the edge of the active region 210 to face the outer surface 211b of the vertical channel 211 and the word line 280 may be substantially perpendicular to a buried bit line 245.

FIGS. 19A, 20A, 21A, 22A, 23A, 24A and 25A are plan views illustrating methods of fabricating vertical channel transistors according to example embodiments of the inventive concepts illustrated in FIG. 18A. FIGS. 19B, 20B, 21B, 22B, 23B, 24B and 25B are cross-sectional views taken along lines XIX:B-XIX:B', XX:B-XX:B', XXI:B-XXI:B', XXII:B-XXII:B', XXIII:B-XXIII:B', XXIV:B-XXIV:B' and XXV:B-XXV:B' of FIGS. 19A, 20A, 21A, 22A, 23A, 24A and 25A, respectively. FIGS. 19C, 20C, 21C, 22C, 23C, 24C and 25C are cross-sectional views taken along lines XIX:C-XIX:C', XX:C-XX:C', XXI:C-XXI:C', XXII:C-XXII:C', XXIII:C-XXIII:C', XXIV:C-XXIV:C' and XXV:C-XXV:C' of FIGS. 19A, 20A, 21A, 22A, 23A, 24A and 25A, respectively.

Figure 19A:
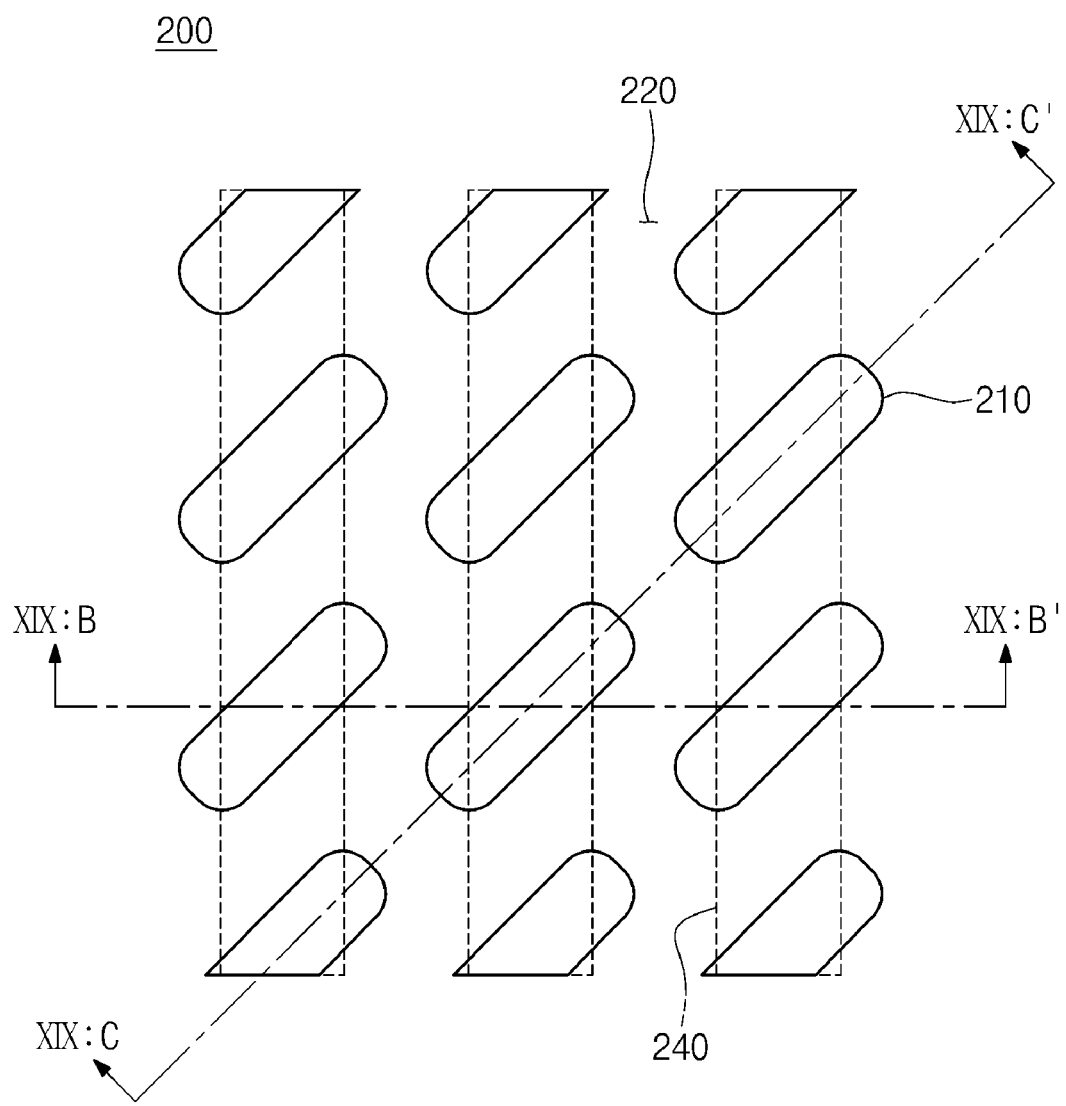
FIGS. 19A, 20A, 21A, 22A, 23A, 24A and 25A are plan views illustrating methods of fabricating vertical channel transistors according to example embodiments of the inventive concepts illustrated in FIG. 18A.
Figure 19B:
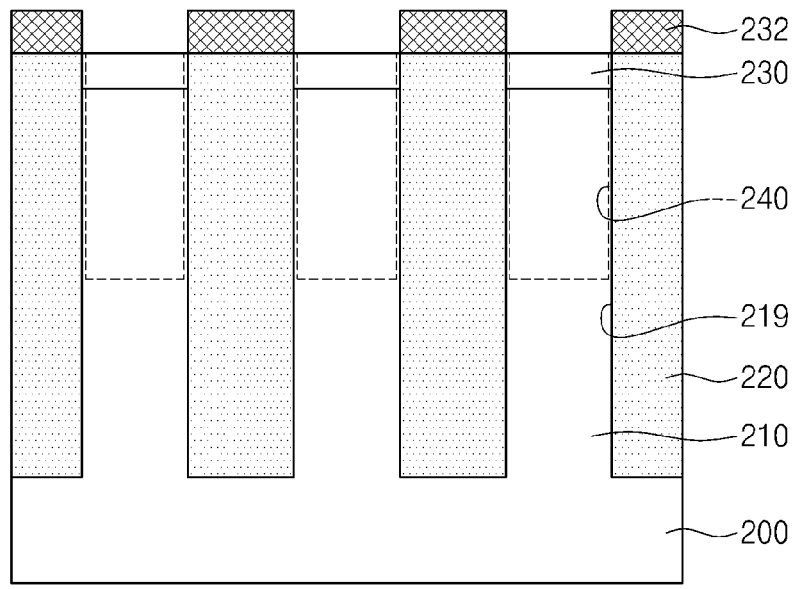
FIGS. 19B, 20B, 21B, 22B, 23B, 24B and 25B are cross-sectional views taken along lines XIX:B-XIX:B', XX:B-XX:B', XXI:B-XXI:B', XXII:B-XXII:B', XXIII:B-XXIII:B', XXIV:B-XXIV:B' and XXV:B-XXV:B' of FIGS. 19A, 20A, 21A, 22A, 23A, 24A and 25A, respectively.
Figure 19C:
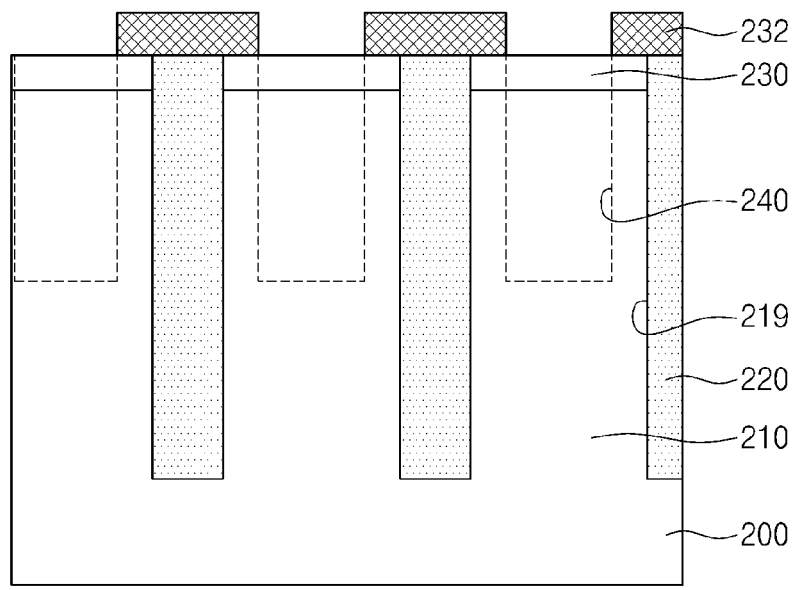
FIGS. 19C, 20C, 21C, 22C, 23C, 24C and 25C are cross-sectional views taken along lines XIX:C-XIX:C', XX:C-XX:C', XXI:C-XXI:C', XXII:C-XXII:C', XXIII:C-XXIII:C', XXIV:C-XXIV:C' and XXV:C-XXV:C' of FIGS. 19A, 20A, 21A, 22A, 23A, 24A and 25A, respectively.

Referring to FIGS. 19A, 19B and 19C, a trench 219 may be formed in the semiconductor substrate 200 and a device isolation layer 220 may be formed by filling the trench 219 with insulation material. The device isolation layer 220 may define an active region 210. The active region 210 may be of an island shape extending in the diagonal direction corresponding to the C direction of FIG. 18A and may be arranged in zigzag fashion. A hard mask 230 may be on the active region 210. A first mask 232 may be formed to define a BBL pattern 240 on the semiconductor substrate 200. The first mask 232 may extend in a longitudinal direction corresponding to the Y direction of FIG. 18A and may be formed in the shape of a line exposing a center of the active region 210 by covering edges of the active region 210.

Figure 20A:
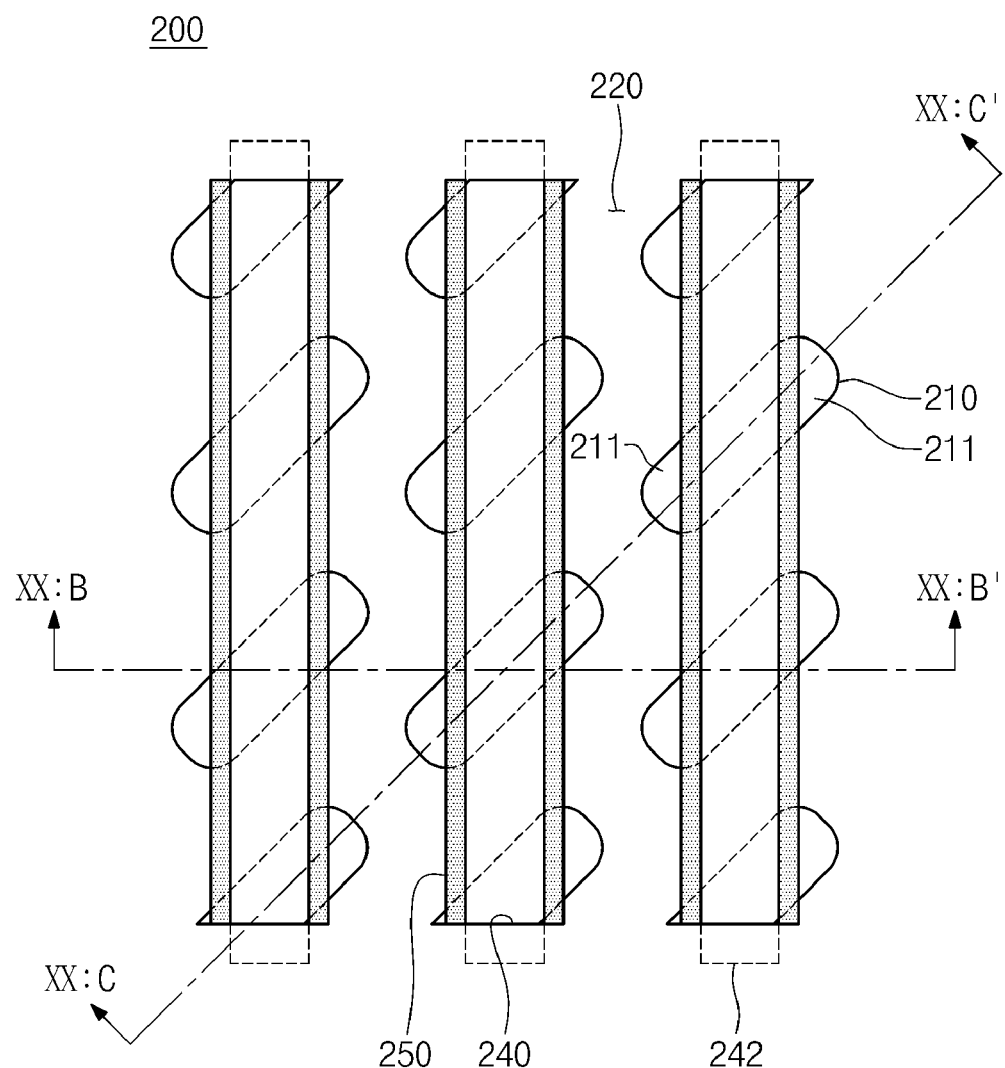
Figure 20B:
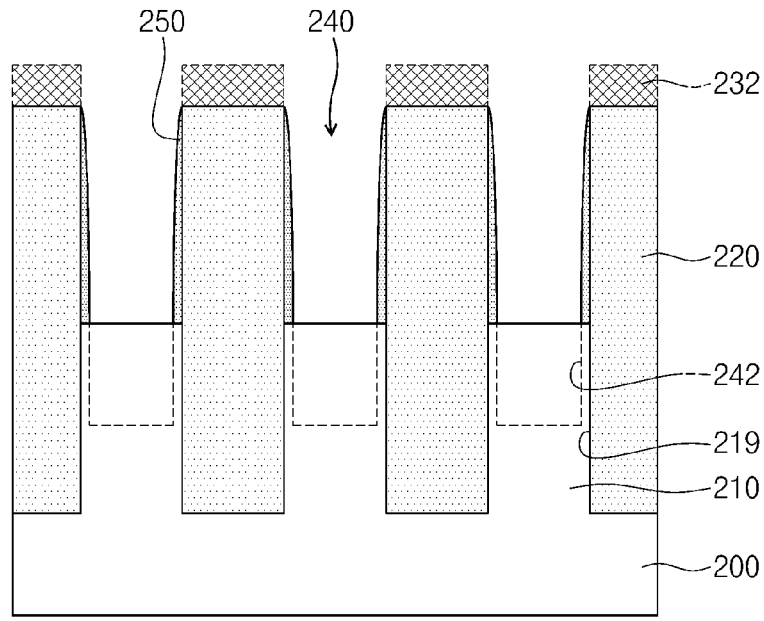
Figure 20C:
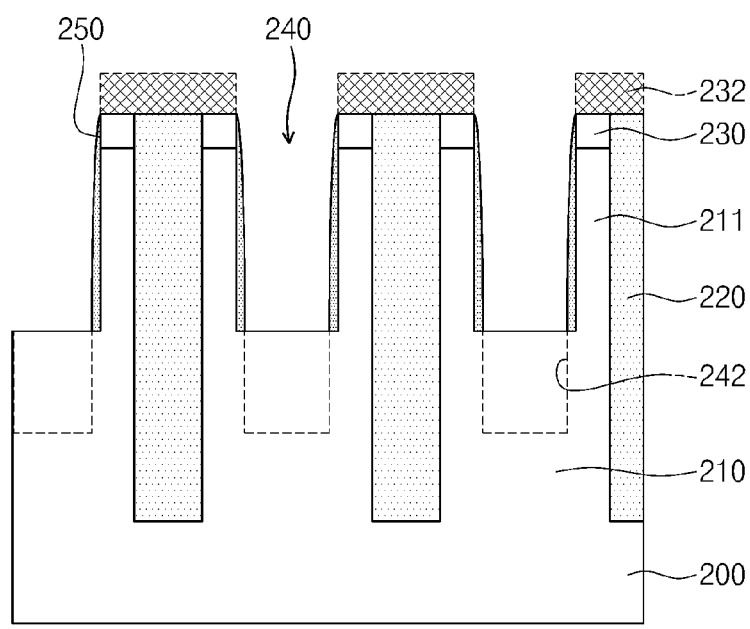
Figure 21A:
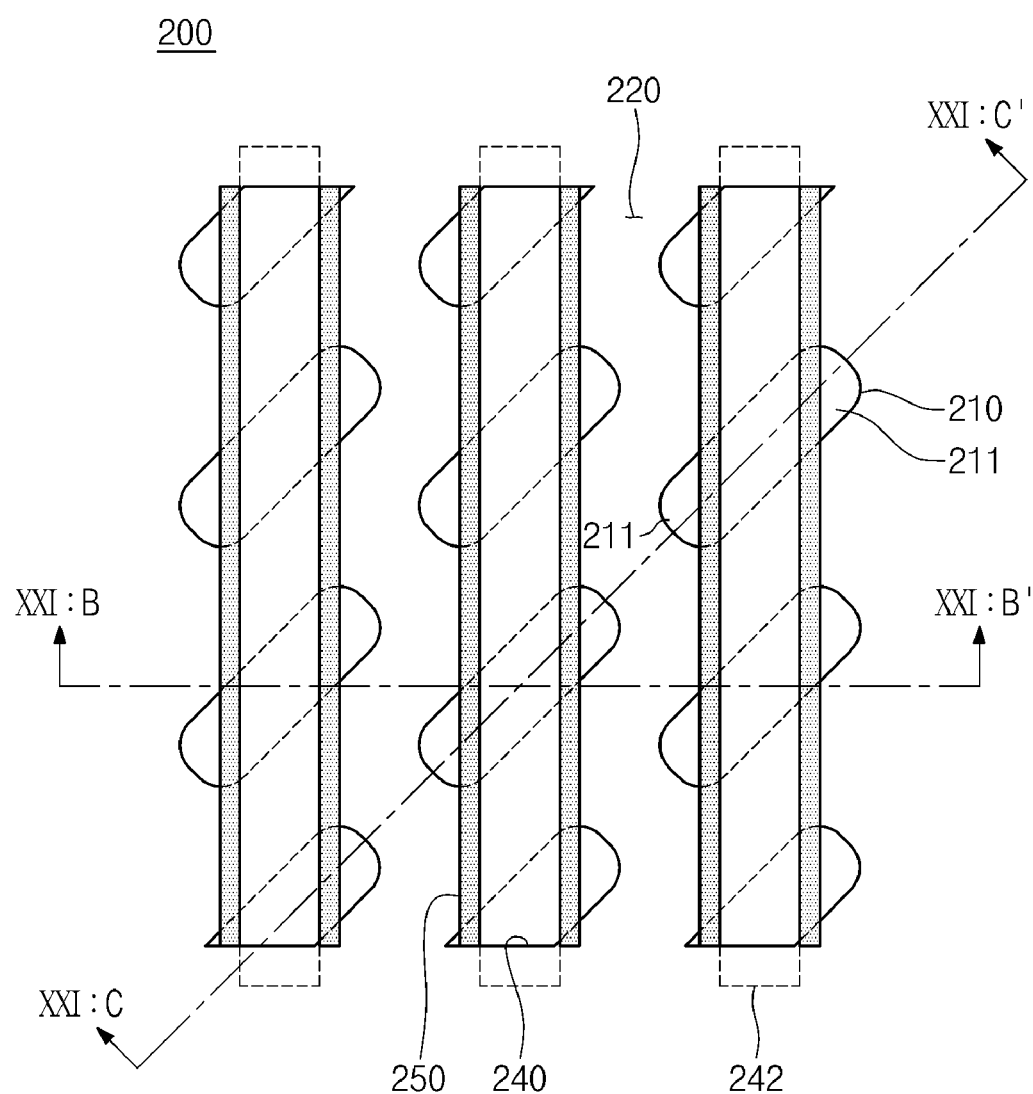
Figure 21B:
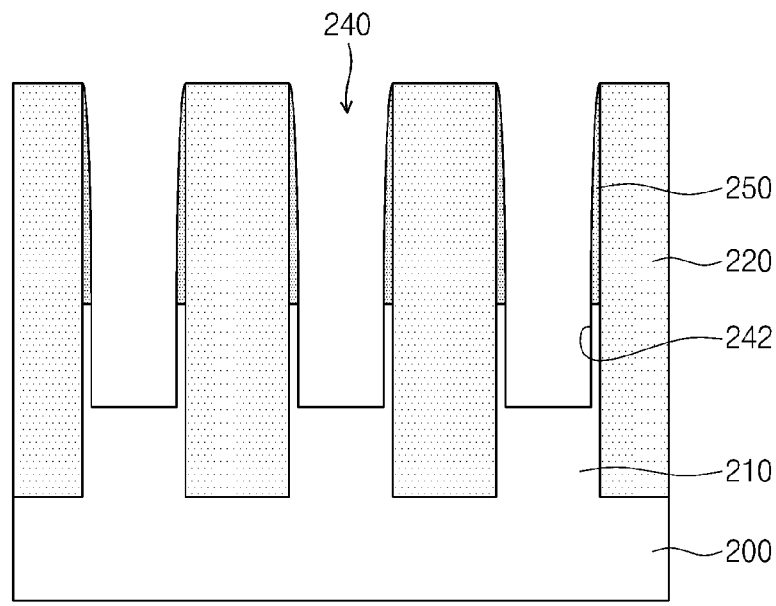
Figure 21C:
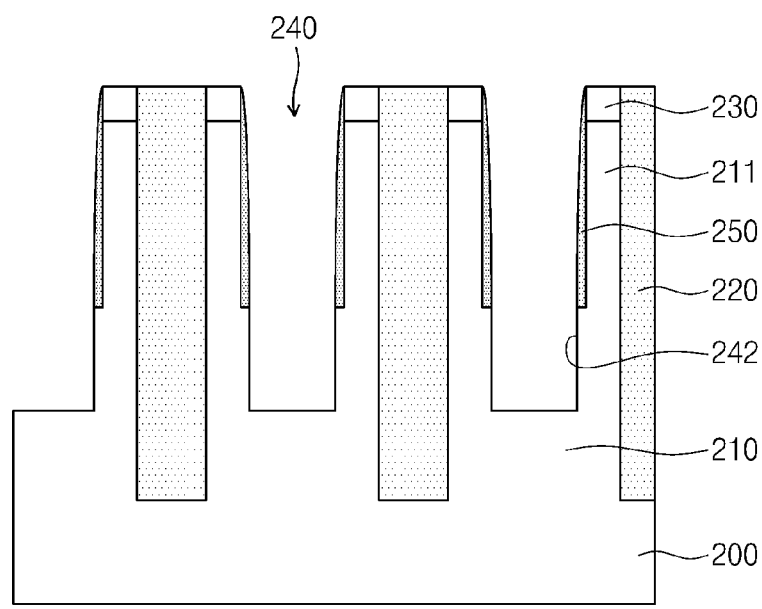

Referring to FIGS. 20A, 20B and 20C, the BBL pattern 240 may be formed by, for example, an etch process using the first mask 232. The BBL pattern 240 may be formed in the shape of a line extending in the Y direction to cross the center of the active region 210. The active region 210 may be patterned into a plurality (e.g., 2) of active branches 211 protruding from edges of the active region 210. A liner 250 may be formed on inner wall of the BBL pattern 240 to define a D-BBL pattern 242 under the BBL pattern 240. The first mask 232 may be removed by, for example, an ash process. Referring to FIGS. 21A, 21B and 21C, the D-BBL pattern 242 may be formed under the BBL pattern 240. For example, the active region 210 exposed by the BBL pattern 240 may be, for example, dry-etched to form the D-BBL pattern 242. The D-BBL pattern 242 may be formed in the shape of line extending in the Y direction on the semiconductor substrate 200.

Figure 22A:
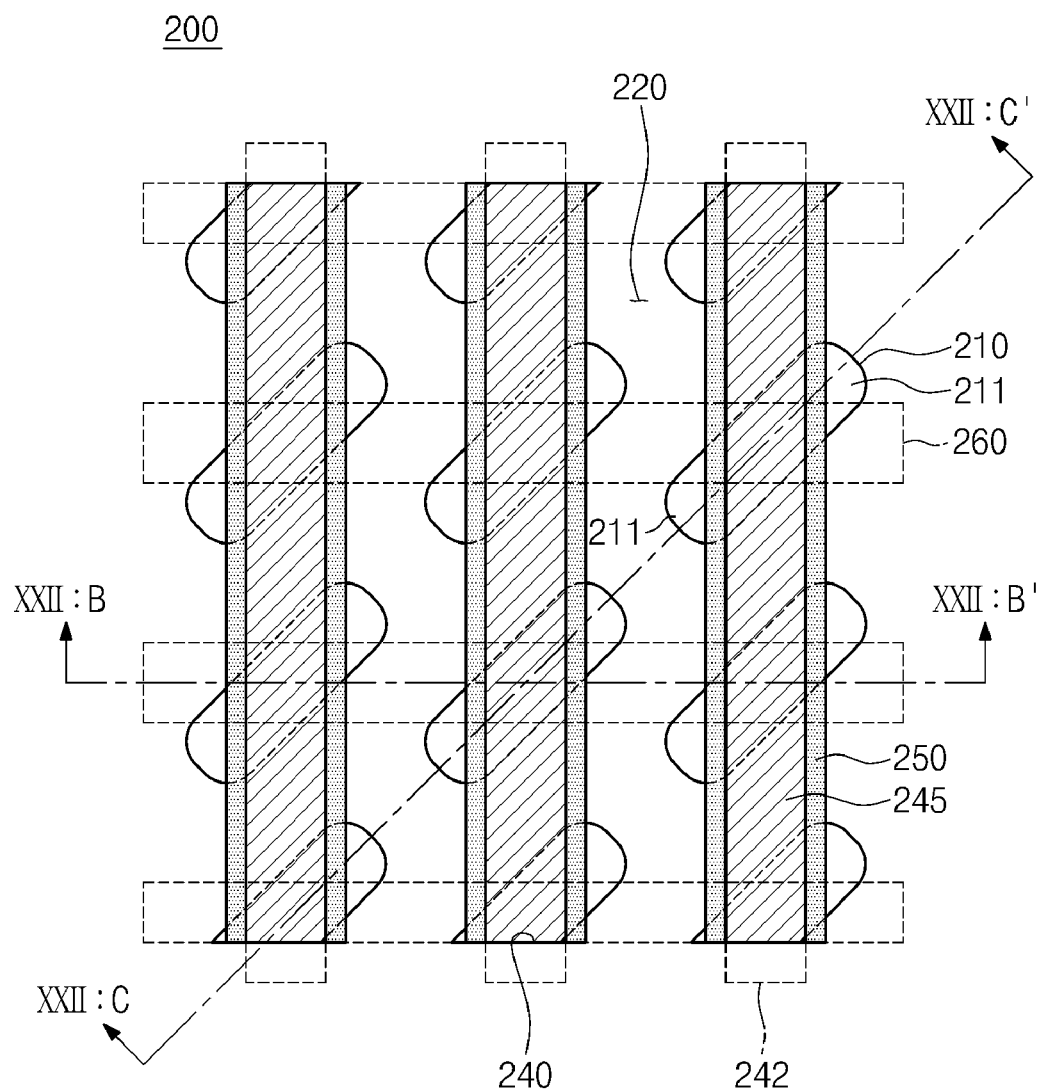
Figure 22B:
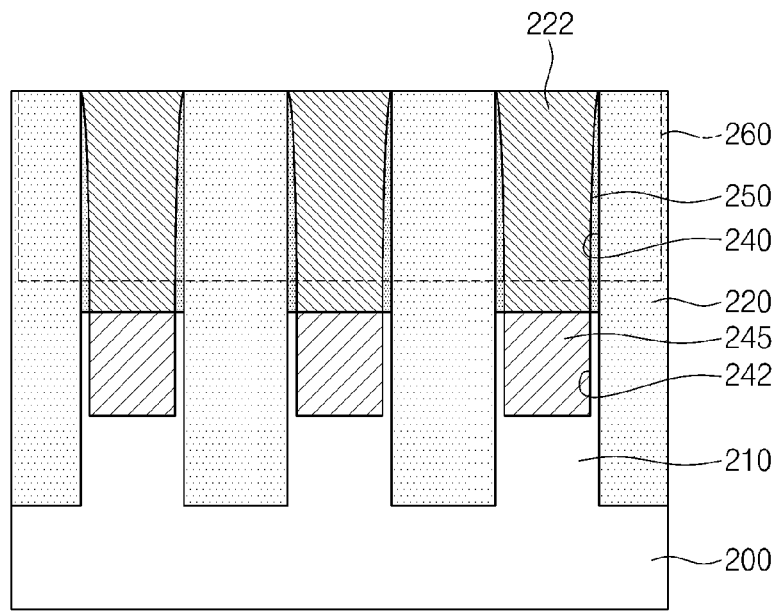
Figure 22C:
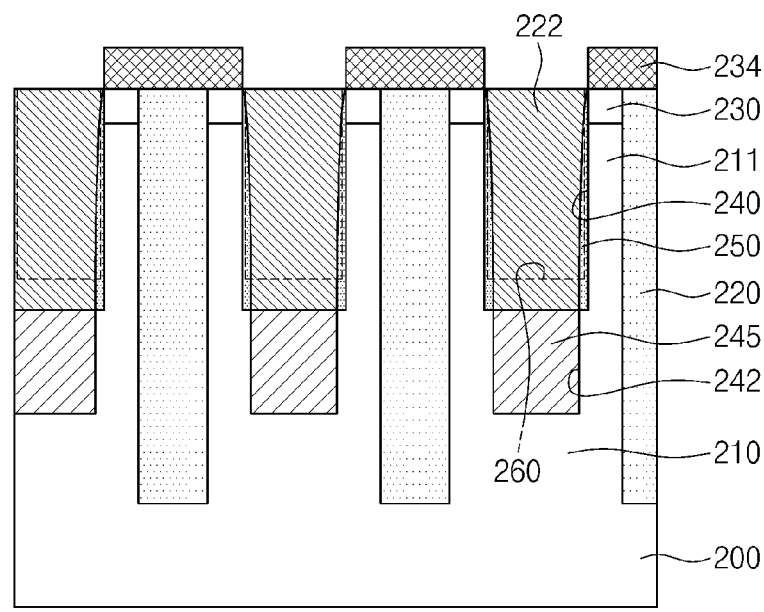

Referring to FIGS. 22A, 22B and 22C, the D-BBL pattern 242 may be filled with metal to form a buried bit line 245. The buried bit line 245 may be formed in the shape of a line extending in the Y direction on the semiconductor substrate 200 to cross the center of the active region 210. The BBL pattern 240 may be filled with insulation material to form an insulation pillar 222 covering the buried bit line 245. A second mask 234 may be formed on the semiconductor substrate 200 to define a WL pattern 260. The second mask 234 may extend in the latitudinal direction corresponding to the X direction of FIG. 18A substantially perpendicular to the buried bit line 245 and may cover a portion of the active branch 211. The second mask 234 may be formed in the shape of line exposing the center of the active region 210 as well as a portion of the active branch 211 not covered by the second mask 234.

Figure 23A:
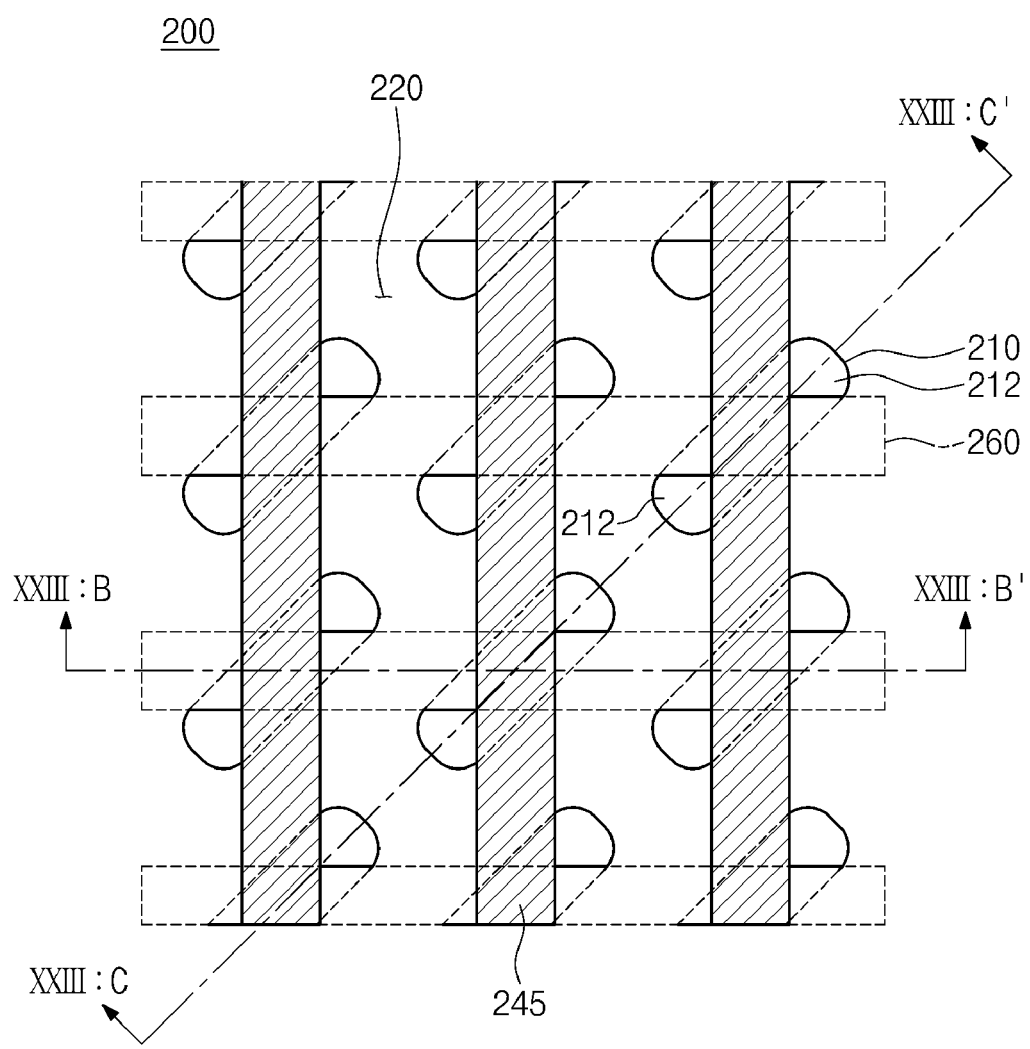
Figure 23B:
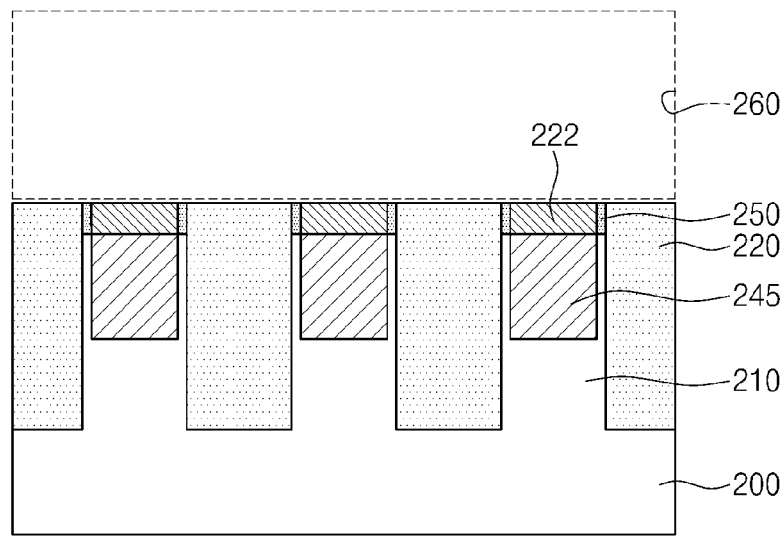
Figure 23C:
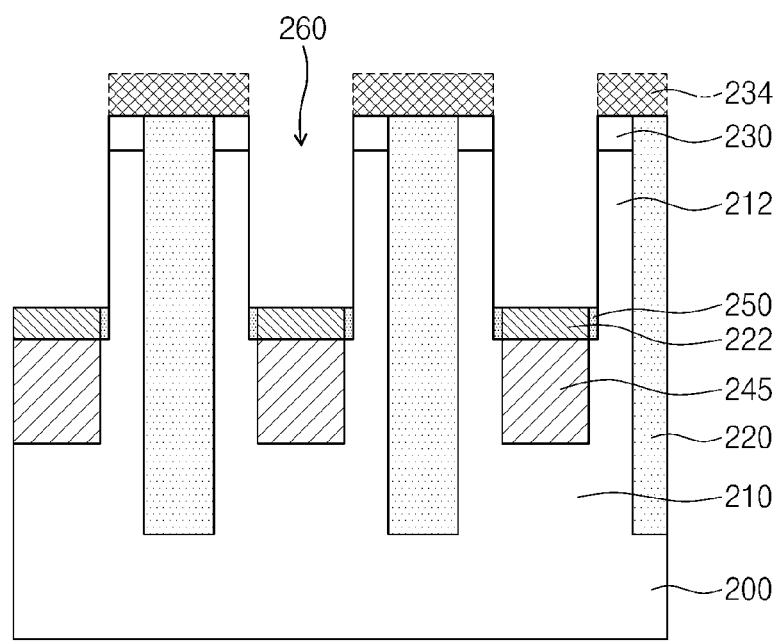

Referring to FIGS. 23A, 23B and 23C, the WL pattern 260 may be formed by, for example, an etch process using the second mask 234. The WL pattern 260 may be formed in the shape of hollow line (e.g., a trench) extending in the X direction substantially perpendicular to the buried bit line 245. A portion of the active branch 211 may be removed simultaneously with the formation of the WL pattern 260. The active region 210 may be patterned into a plurality (e.g., 2) of vertical channels 212 protruding vertically (Z direction of FIG. 18A) from edges of the active region 210. In the following drawings including FIG. 23A, the liner 250 may not be illustrated for simplicity.

Figure 24A:
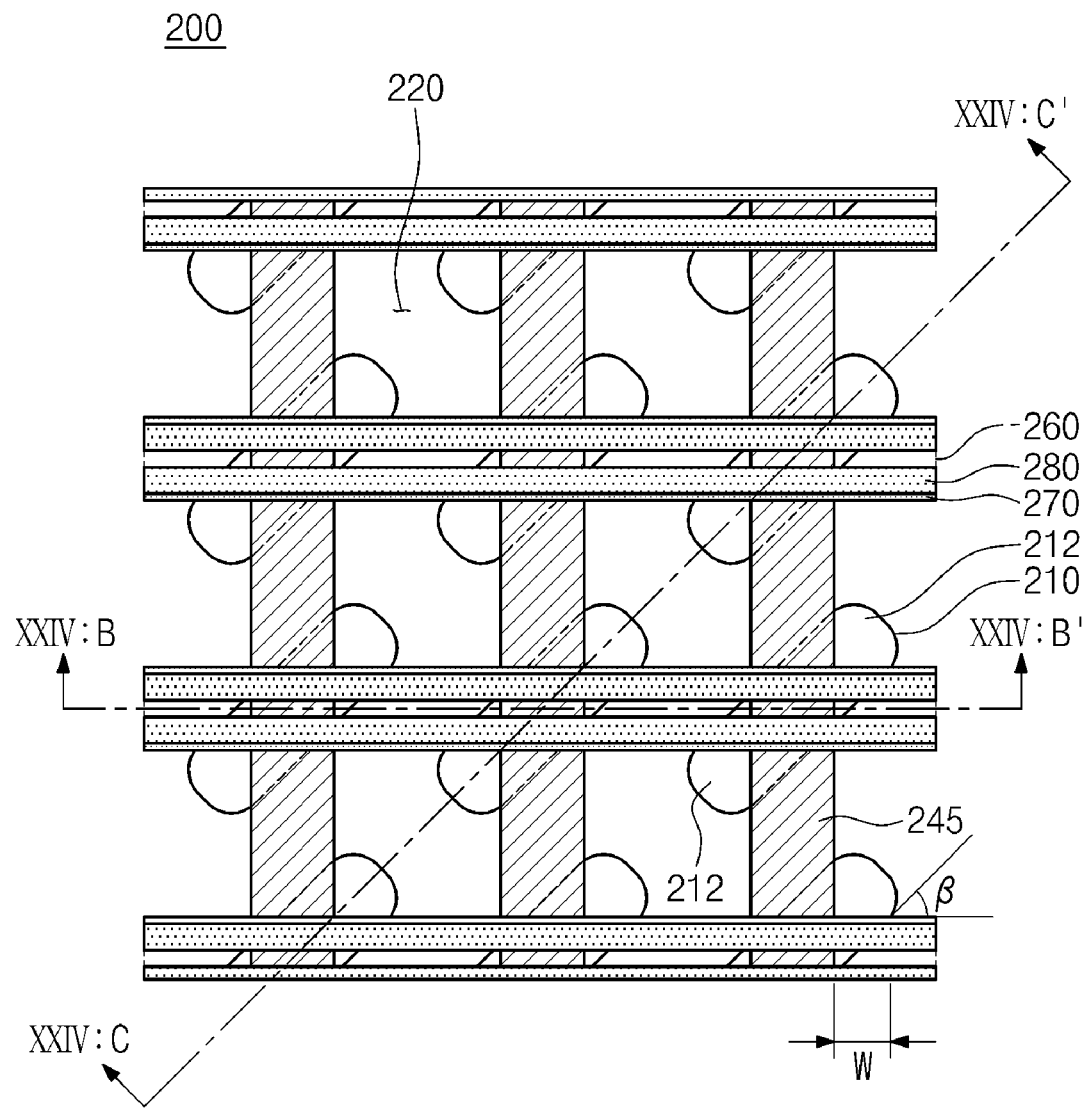
Figure 24B:
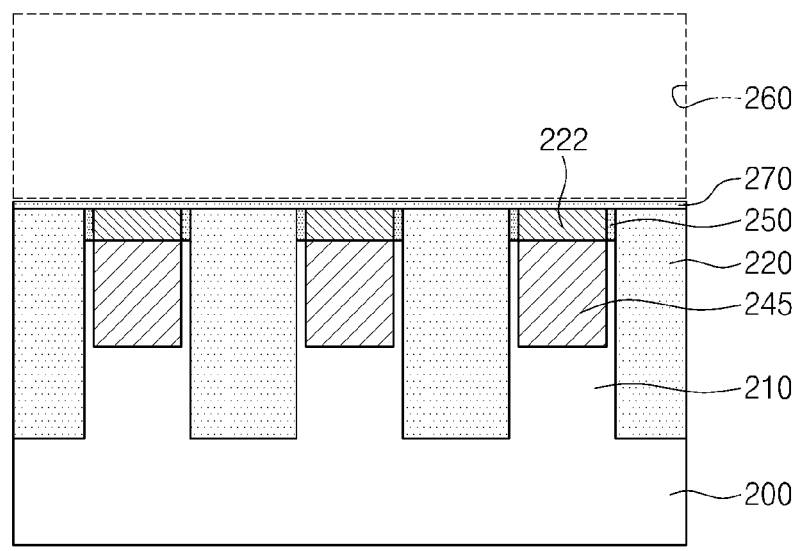
Figure 24C:
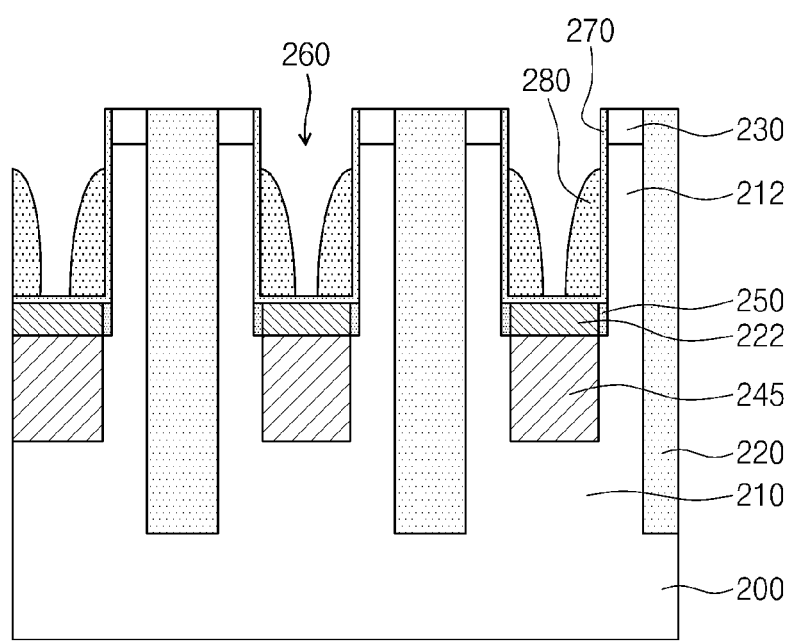
Figure 25A:
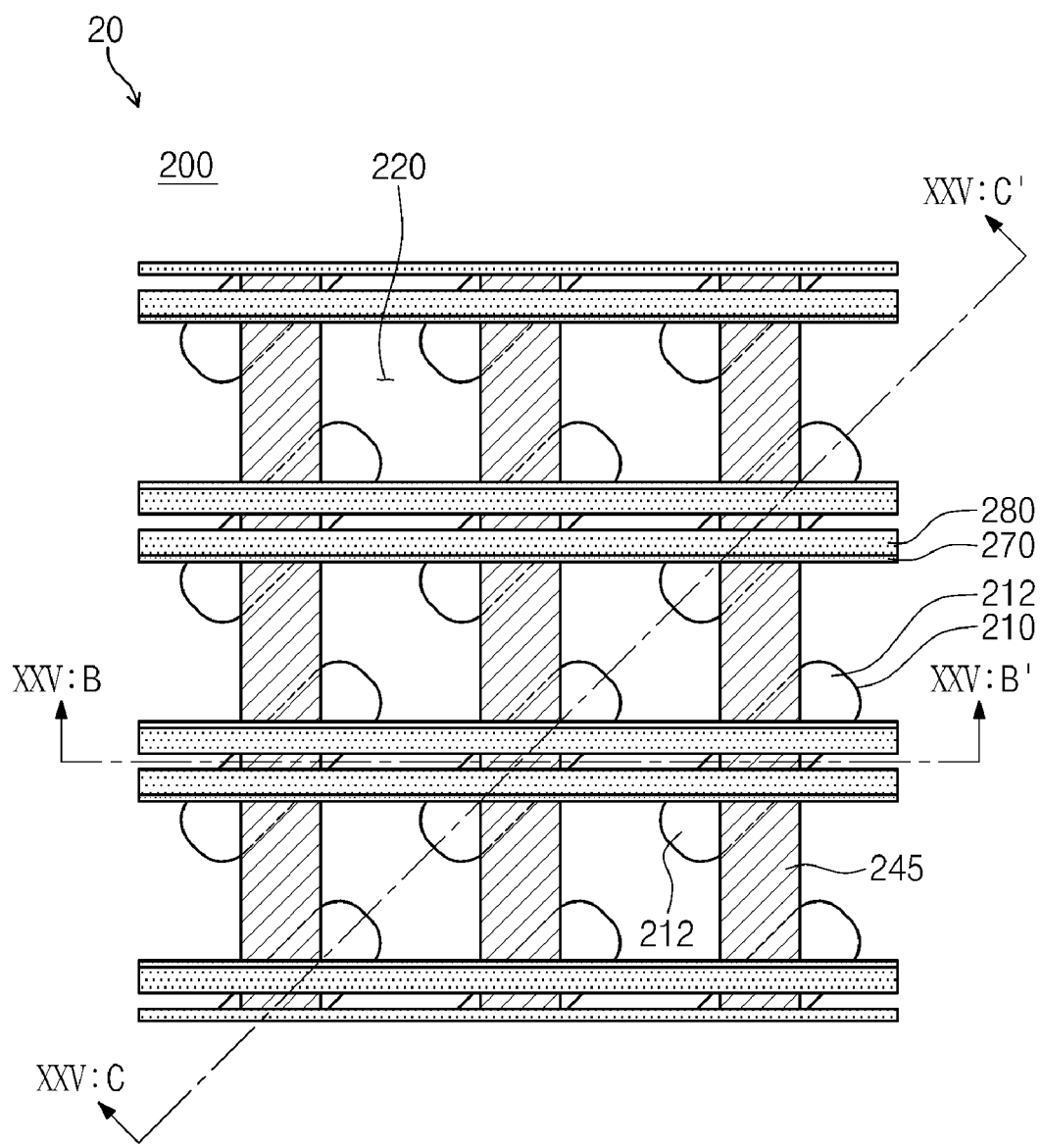
Figure 25B:
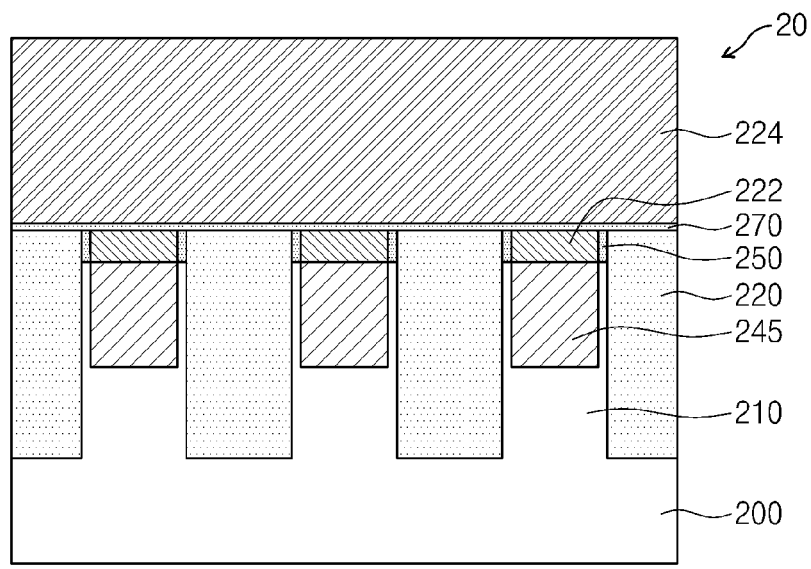
Figure 25C:
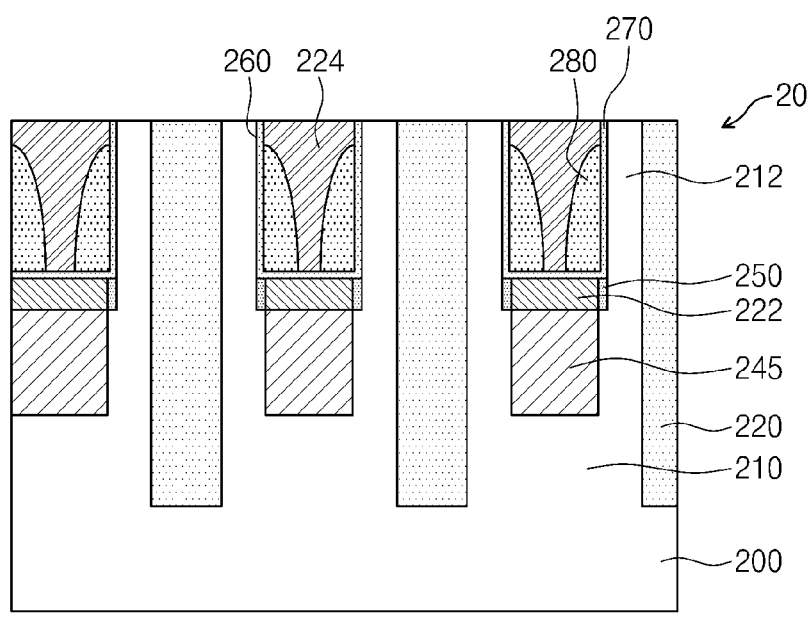

Referring to FIGS. 24A, 24B and 24C, a gate insulation layer 270 and a word line 280 may be formed in the WL pattern 260. The word line 280 may extend in the X direction substantially perpendicular to the buried bit line 245. The word line 280 may cross the center of the active region 210 and be between the plurality of vertical channels 212. An angle β, an angle between the word line 280 and the active region 210, may be chosen arbitrarily. A channel width W may depend on the angle β. For example, the greater the angle β is, the shorter the channel width W may become. The angle β may be changed depending on layout. Referring to FIGS. 25A, 25B and 25C, an insulation layer 224 may be formed within the WL pattern 260 and a top surface of the vertical channel 212 may be exposed by removing a hard mask 230 by, for example, an etch-back and/or CMP process.

According to example embodiments of the inventive concepts, an active region 210 may be formed with an island shape, a buried bit line 245 may be formed to cross the center of an active region 210, the active region 210 may be patterned into a plurality vertical channels 212, and a word line 280 may be formed to orthogonally cross a buried bit line 245 and be between the plurality of vertical channels 212. A vertical channel transistor 20 may be fabricated, for example, as illustrated in FIG. 18A.

FIGS. 26A, 27A, 28A, 29A, 30A, 31A and 32A are plan views illustrating methods of fabricating vertical channel transistors according to example embodiments of the inventive concepts illustrated in FIG. 18B. FIGS. 26B, 27B, 28B, 29B, 30B, 31B and 32B are cross-sectional views taken along lines XXVI:B-XXVI:B', XXVII:B-XXVII:B', XXVIII:B-XXVIII:B', XXIX:B-XXIX:B', XXX:B-XXX:B', XXXI:B-XXXI:B' and XXXII:B-XXXII:B' of FIGS. 26A, 27A, 28A, 29A, 30A, 31A and 32A, respectively. FIGS. 26C, 27C, 28C, 29C, 30C, 31C and 32C are cross-sectional views taken along lines XXVI:C-XXVI:C', XXVII:C-XXVII:C', XXVIII:C-XXVIII:C', XXIX:C-XXIX:C', XXX:C-XXX:C', XXXI:C-XXXI:C' and XXXII:C-XXXII:C' of FIGS. 26A, 27A, 28A, 29A, 30A, 31A and 32A, respectively.

Figure 26A:
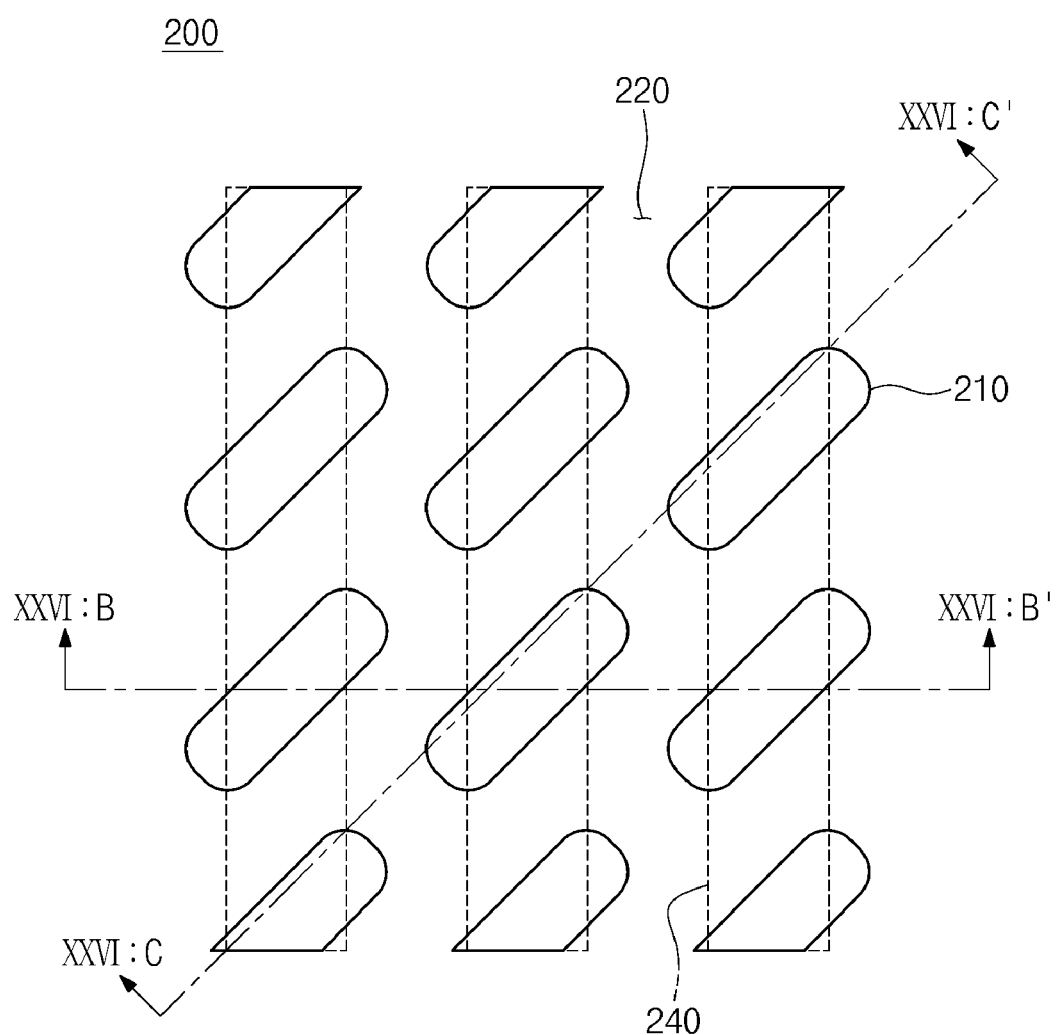
FIGS. 26A, 27A, 28A, 29A, 30A, 31A and 32A are plan views illustrating methods of fabricating vertical channel transistors according to example embodiments of the inventive concepts illustrated in FIG. 18B.
Figure 26B:
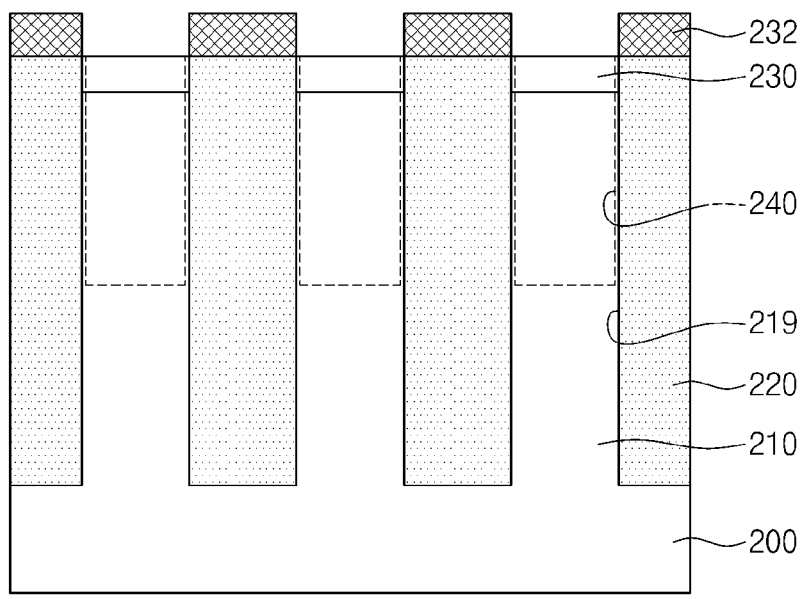
FIGS. 26B, 27B, 28B, 29B, 30B, 31B and 32B are cross-sectional views taken along lines XXVI:B-XXVI:B', XXVII:B-XXVII:B', XXVIII:B-XXVIII:B', XXIX:B-XXIX:B', XXX:B-XXX:B', XXXI:B-XXXI:B' and XXXII:B-XXXII:B' of FIGS. 26A, 27A, 28A, 29A, 30A, 31A and 32A, respectively.
Figure 26C:
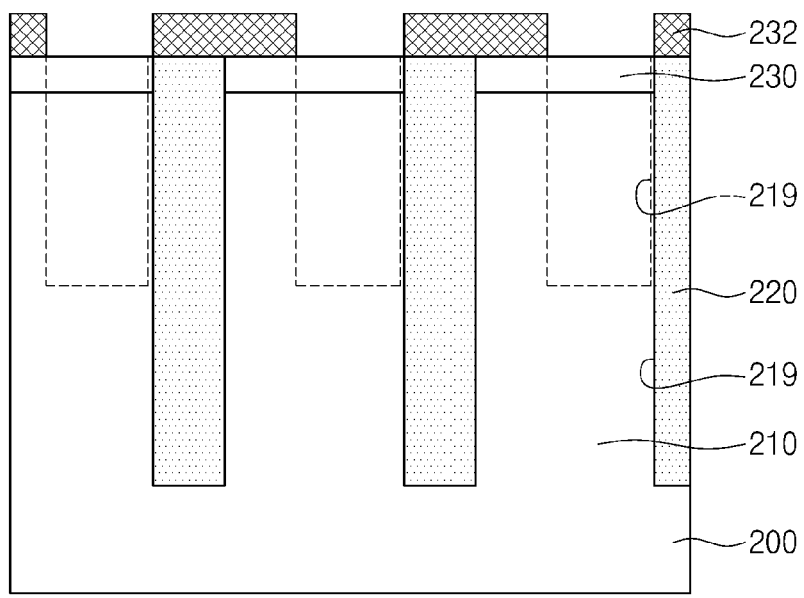
FIGS. 26C, 27C, 28C, 29C, 30C, 31C and 32C are cross-sectional views taken along lines XXVI:C-XXVI:C', XXVII:C-XXVII:C', XXVIII:C-XXVIII:C', XXIX:C-XXIX:C', XXX:C-XXX:C', XXXI:C-XXXI:C' and XXXII:C-XXXII:C' of FIGS. 26A, 27A, 28A, 29A, 30A, 31A and 32A, respectively.

Referring to FIGS. 26A, 26B and 26C, an active region 210 may be formed in the semiconductor substrate 200. The active region 210 may be of an island shape extending in a diagonal direction (C direction of FIG. 18B) and may be arranged in zigzag fashion. A device isolation layer 220 filling a trench 219 may define the active region 210. A first mask 232 may be formed to define a BBL pattern 240 on the semiconductor substrate 200. The first mask 232 may be a line shape extending in a longitudinal direction (Y direction of FIG. 18B) to expose a center of the active region 210 by covering edges of the active region 210.

Figure 27A:
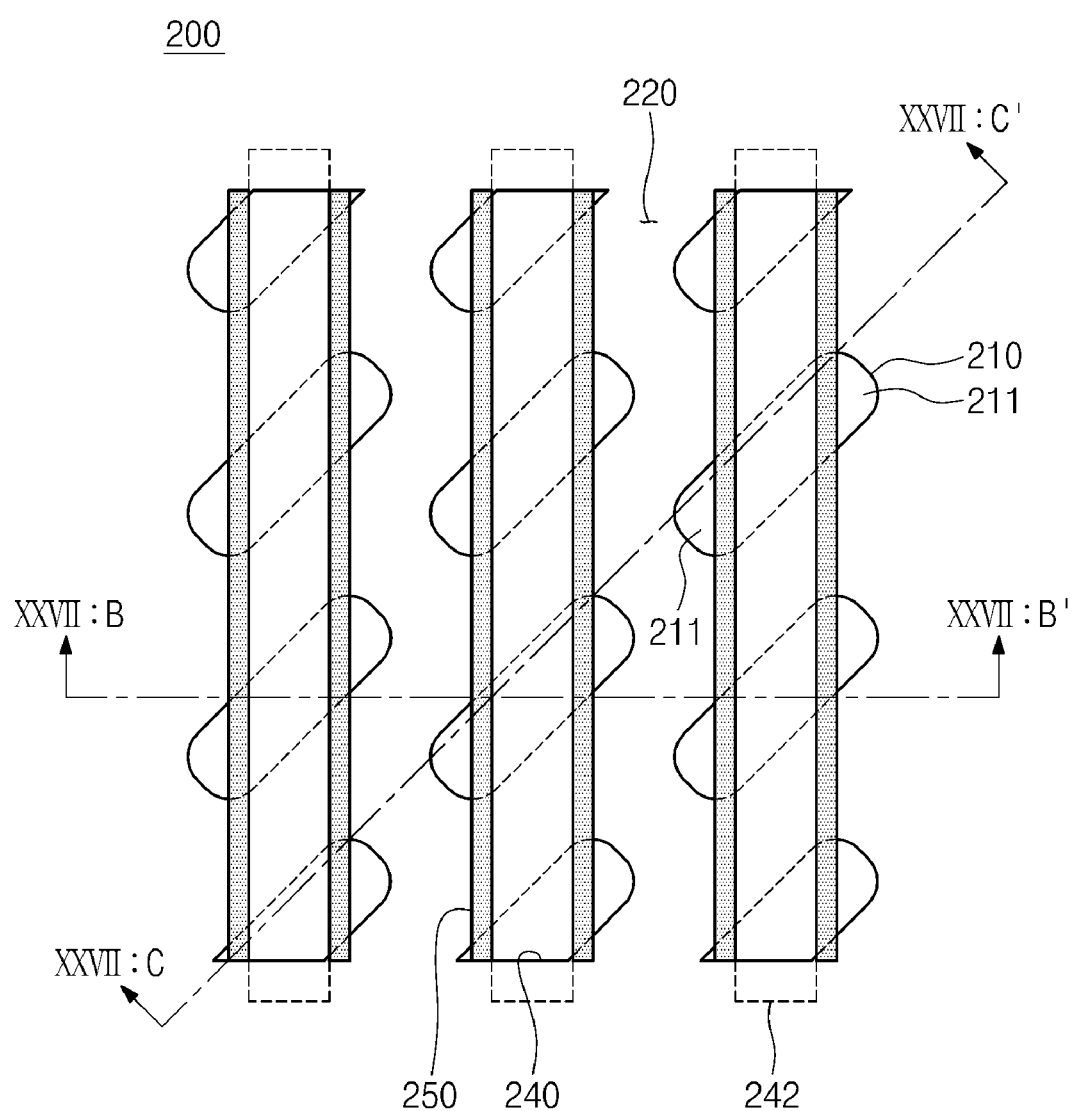
Figure 27B:
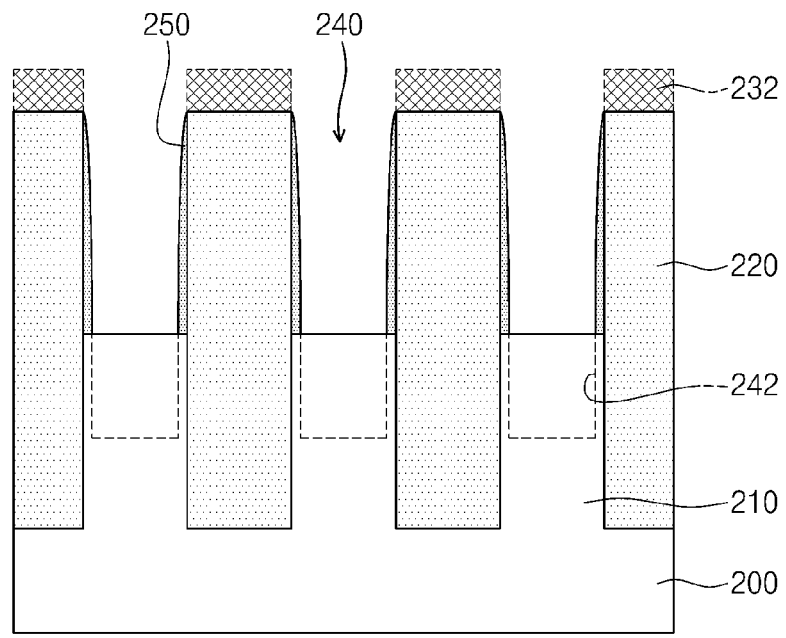
Figure 27C:
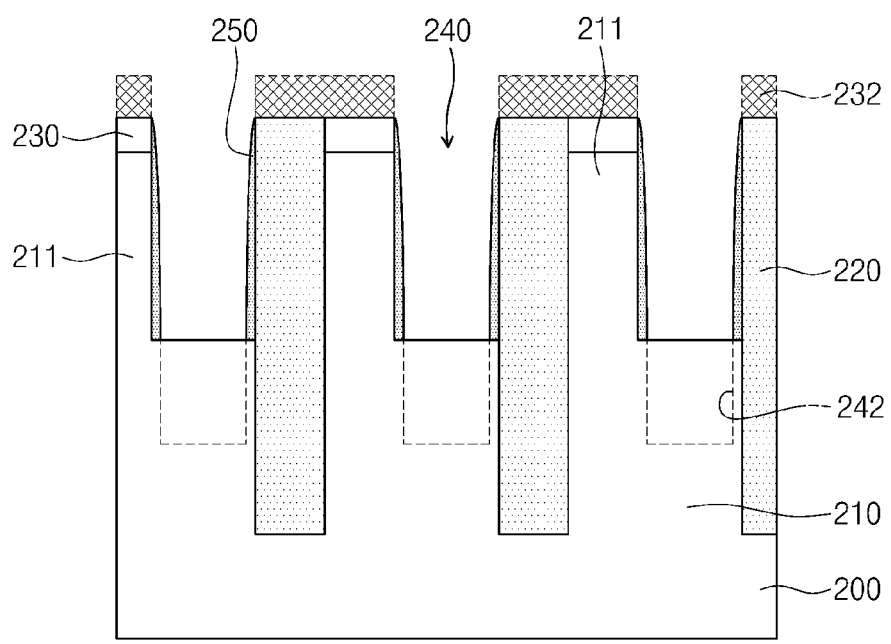

Referring to FIGS. 27A, 27B and 27C, the BBL pattern 240 may be formed by, for example, an etch process using the first mask 232. The active region 210 may be patterned into a plurality (e.g., 2) of active branches 211 protruding from edges of the active region 210. A liner 250 may be formed on inner wall of the BBL pattern 240 to define a D-BBL pattern 242 under the BBL pattern 240. The first mask 232 may be removed by, for example, an ash process.

Figure 28A:
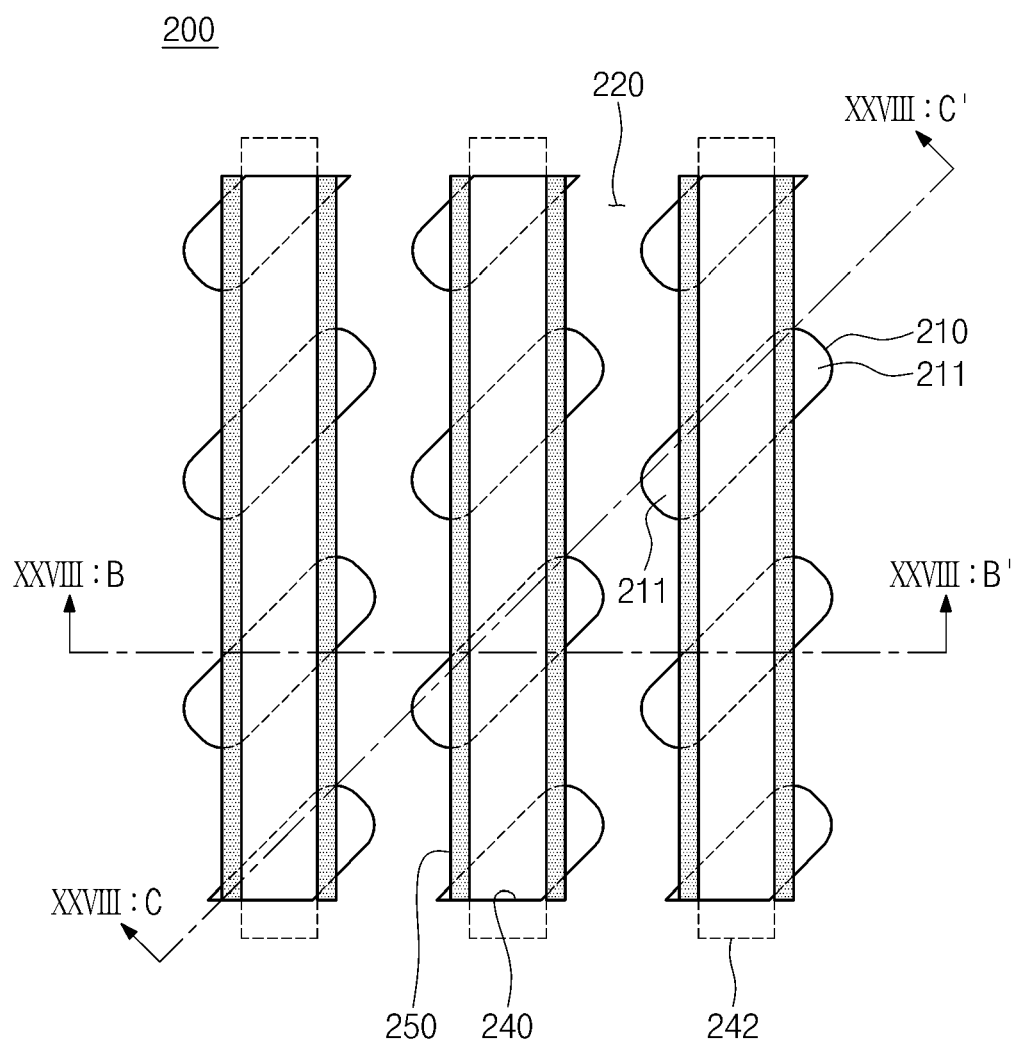
Figure 28B:
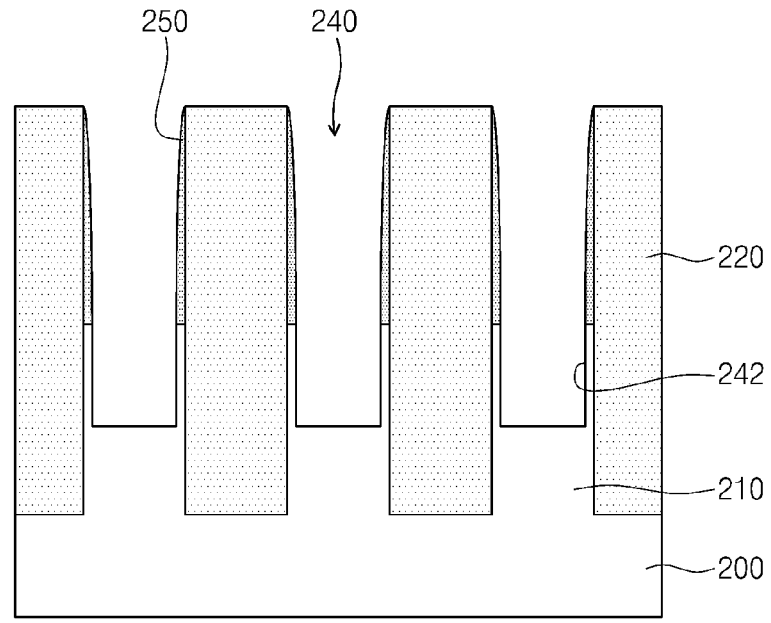
Figure 28C:
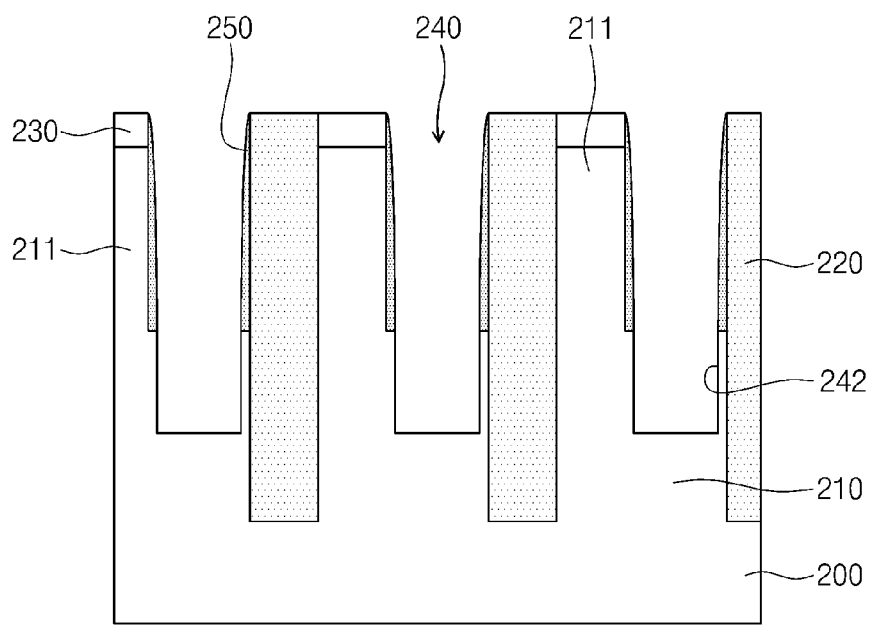
Figure 29A:
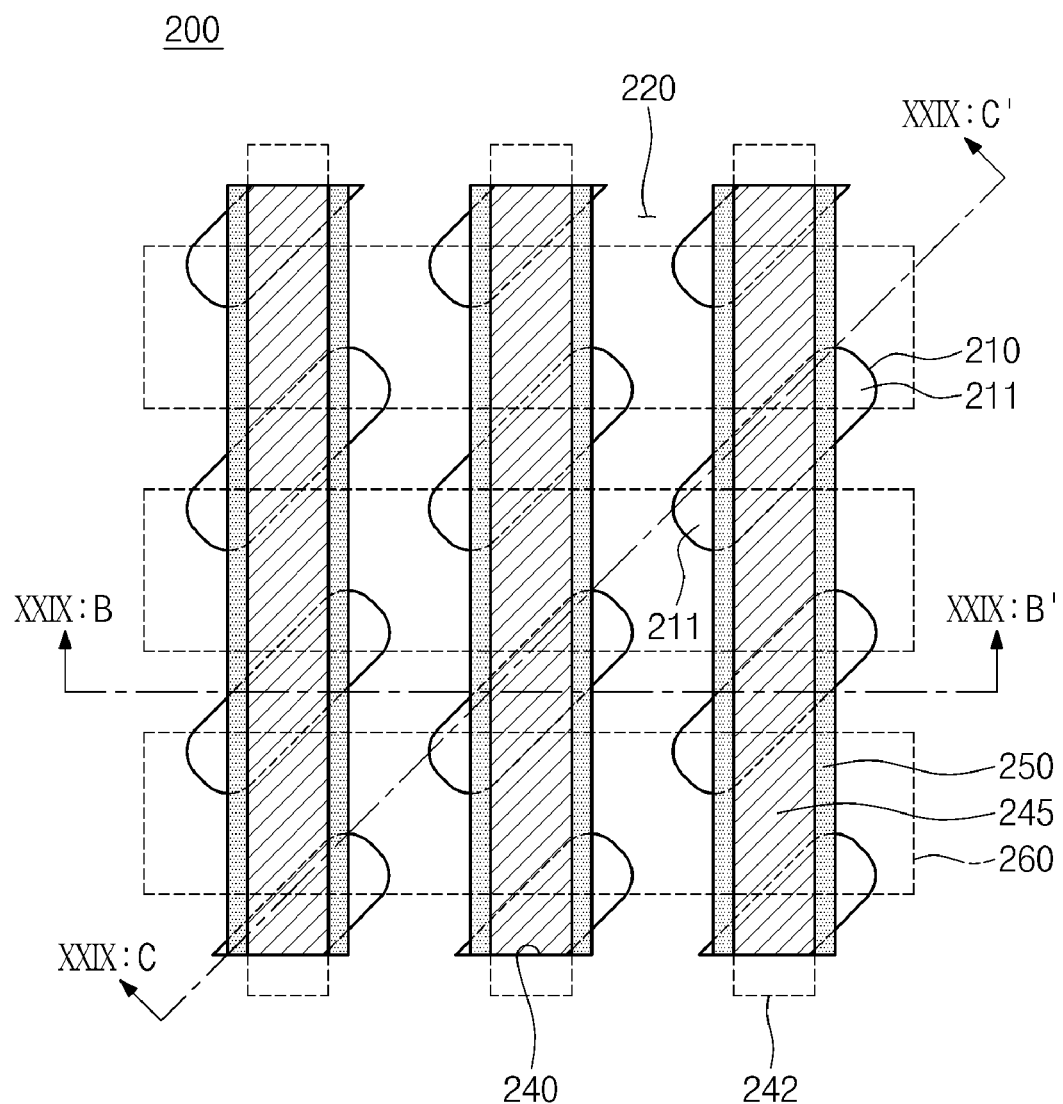
Figure 29B:
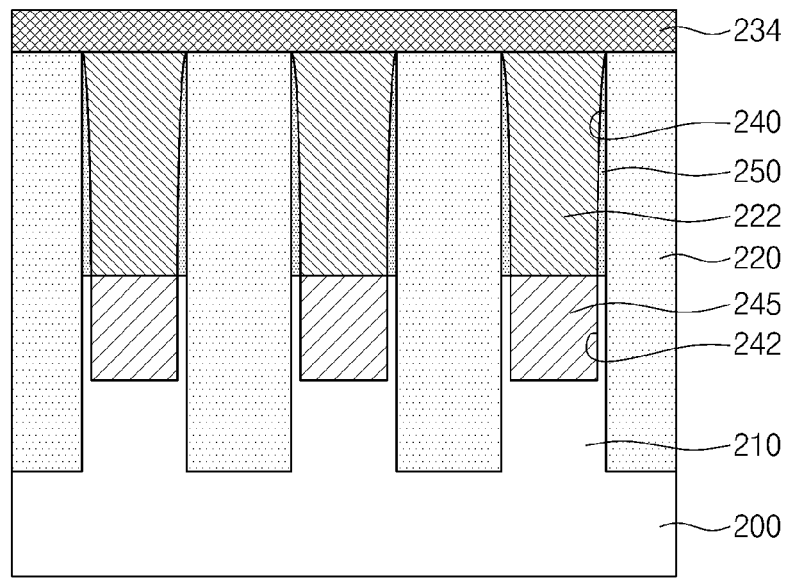
Figure 29C:
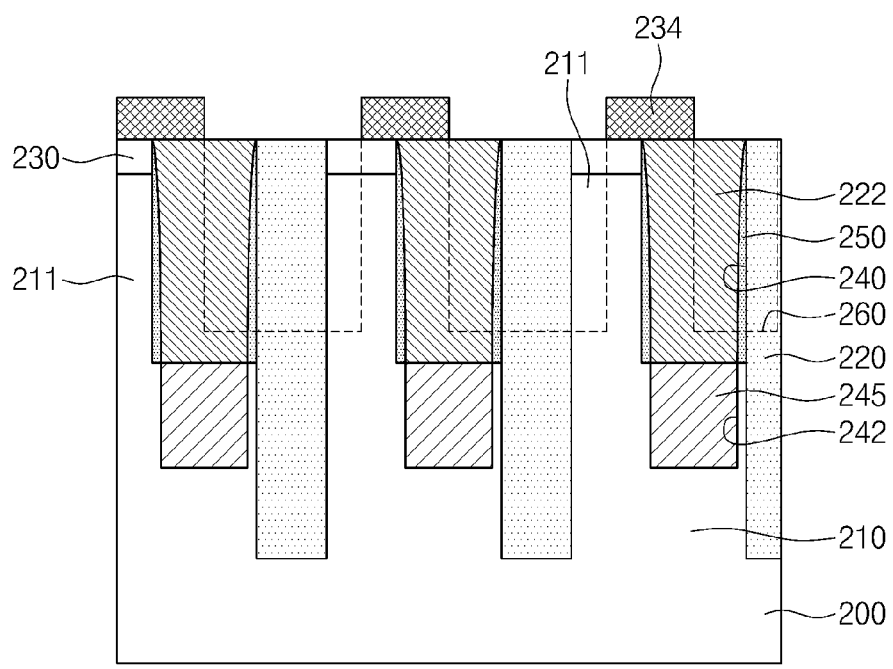

Referring to FIGS. 28A, 28B and 28C, the D-BBL pattern 242 may be formed under the BBL pattern 240. For example, the active region 210 exposed by the BBL pattern 240 may be dry-etched to form the D-BBL pattern 242. Referring to FIGS. 29A, 29B and 29C, the D-BBL pattern 242 may be filled with metal to form a buried bit line 245 and the BBL pattern 240 may be filled with insulation material to form an insulation pillar 222 covering the buried bit line 245. The buried bit line 245 may be formed in the shape of line extending in the Y direction on the semiconductor substrate 200 to cross the center of the active region 210. A second mask 234 may be formed on the semiconductor substrate 200 to define a WL pattern 260. The second mask 234 may extend in the latitudinal direction (X direction of FIG. 18B) substantially perpendicular to the buried bit line 245 to cover the center of the active region 210. The second mask 234 may partially cover the active branch 211. A portion of the active branch 211 may be covered with the second mask 234 and another portion of the active branch 211 may be exposed.

Figure 30A:
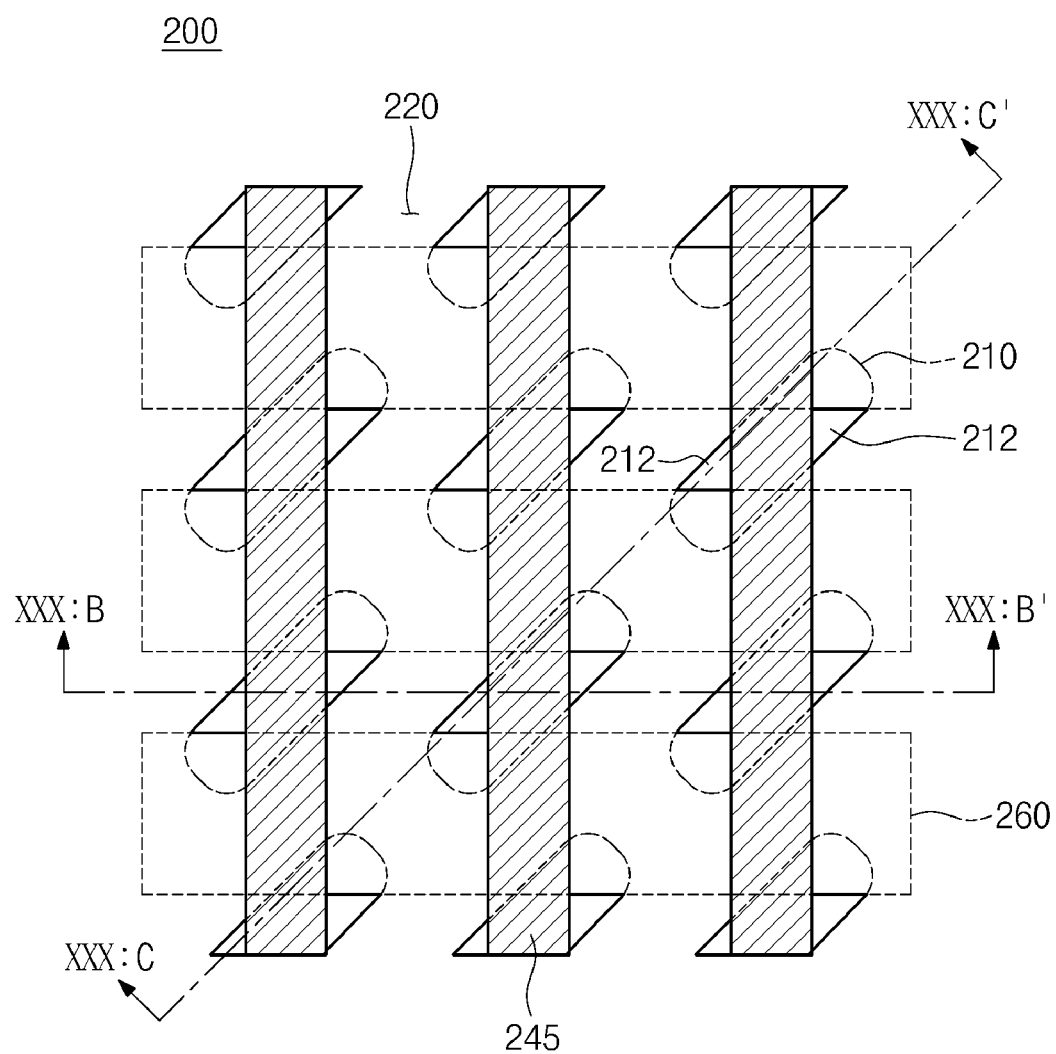
Figure 30B:
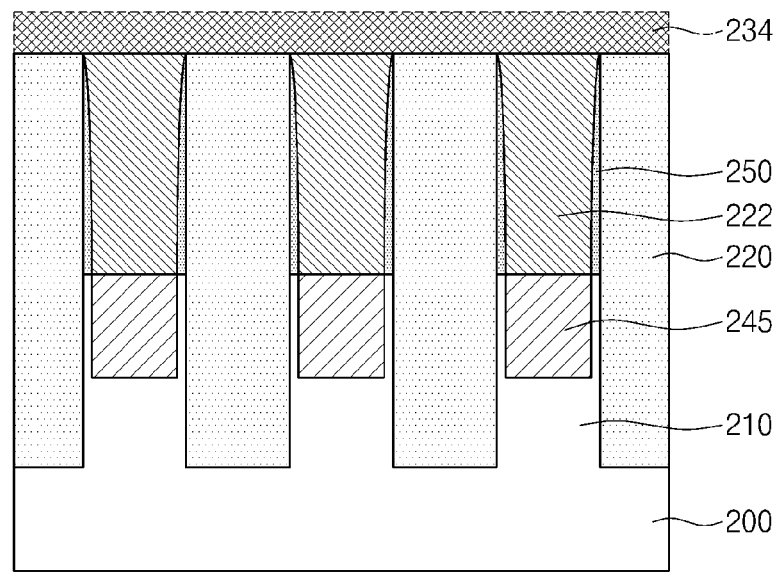
Figure 30C:
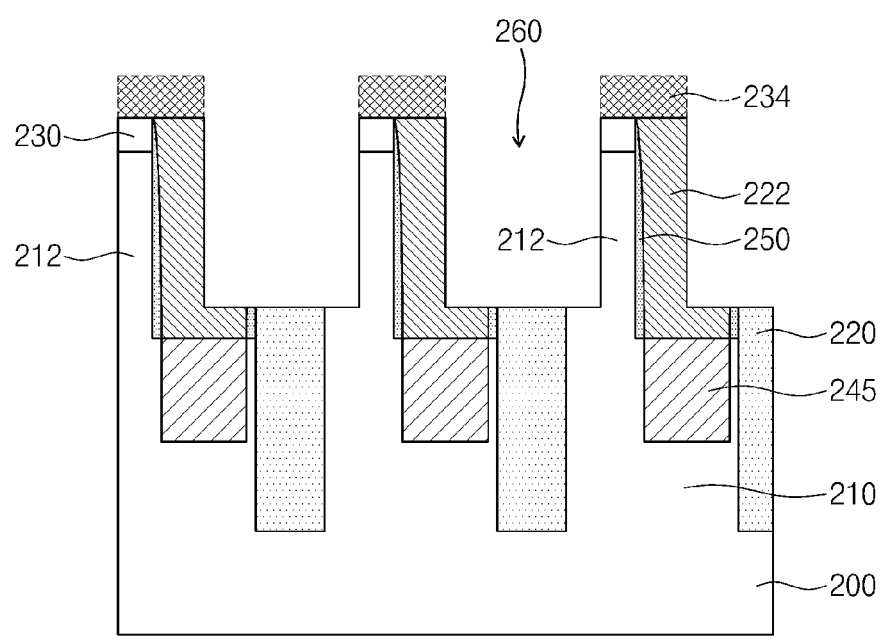

Referring to FIGS. 30A, 30B and 30C, the WL pattern 260 may be formed by, for example, an etch process using the second mask 234. The WL pattern 260 may be formed in the shape of hollow line (e.g., a trench) extending in the X direction substantially perpendicular to the buried bit line 245. A portion of the active branch 211 may be removed simultaneously with the formation of the WL pattern 260. The active region 210 may be patterned into a plurality (e.g., 2) of vertical channels 212 protruding vertically (Z direction of FIG. 18B) from edges of the active region 210. In the following drawings including FIG. 30A, the liner 250 may not be illustrated for simplicity.

Figure 31A:
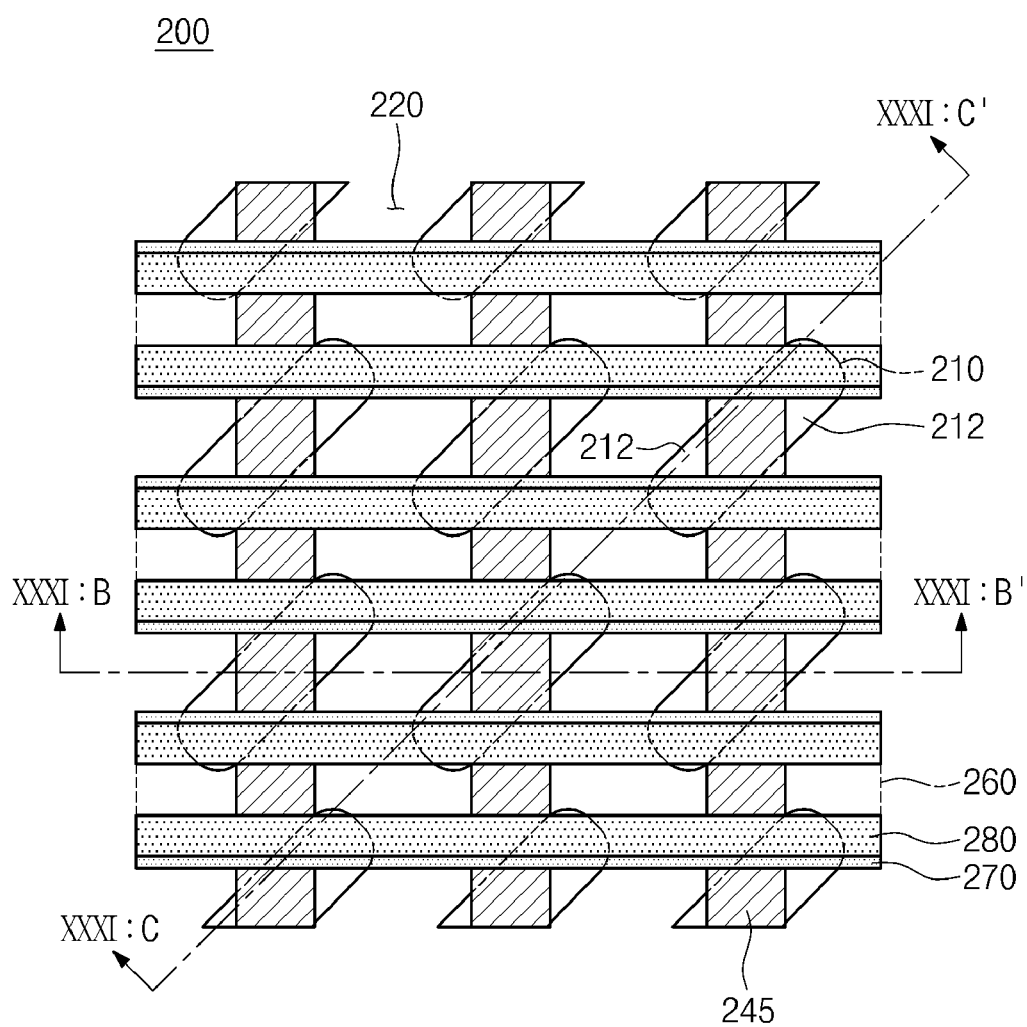
Figure 31B:
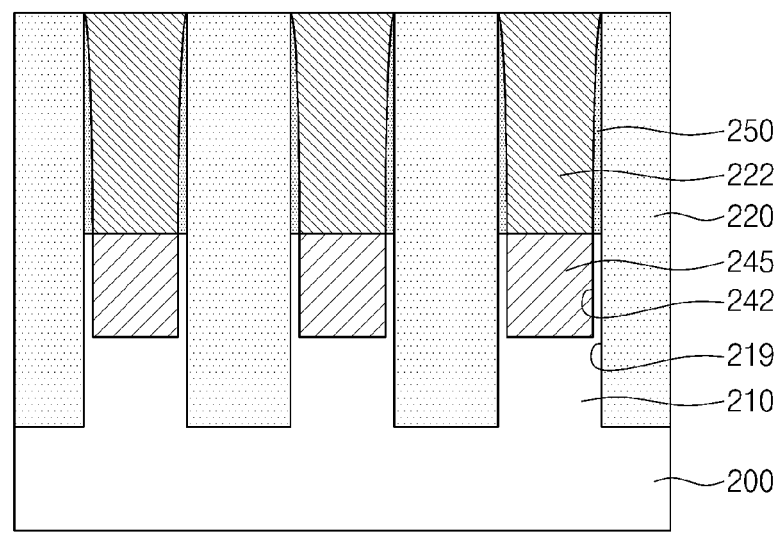
Figure 31C:
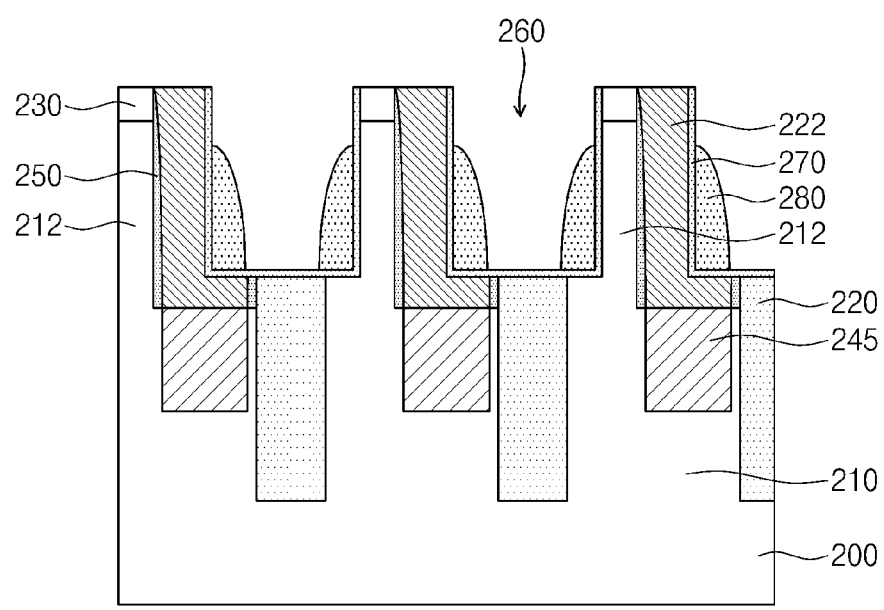
Figure 32A:
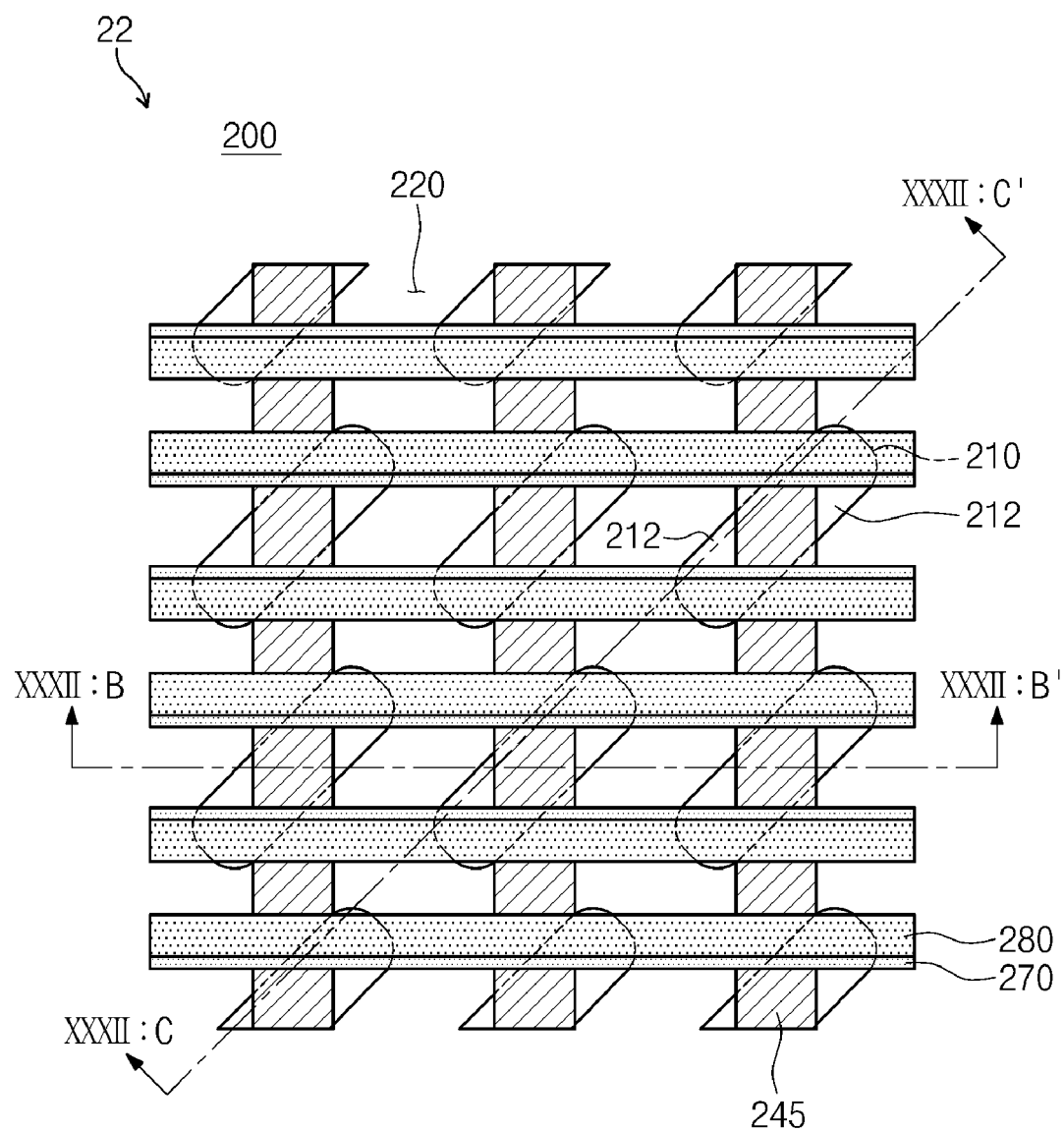
Figure 32B:
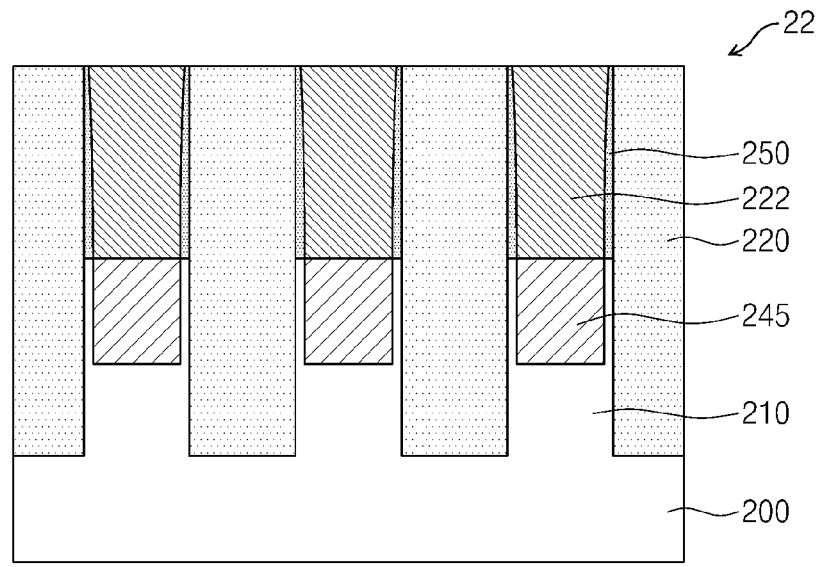
Figure 32C:
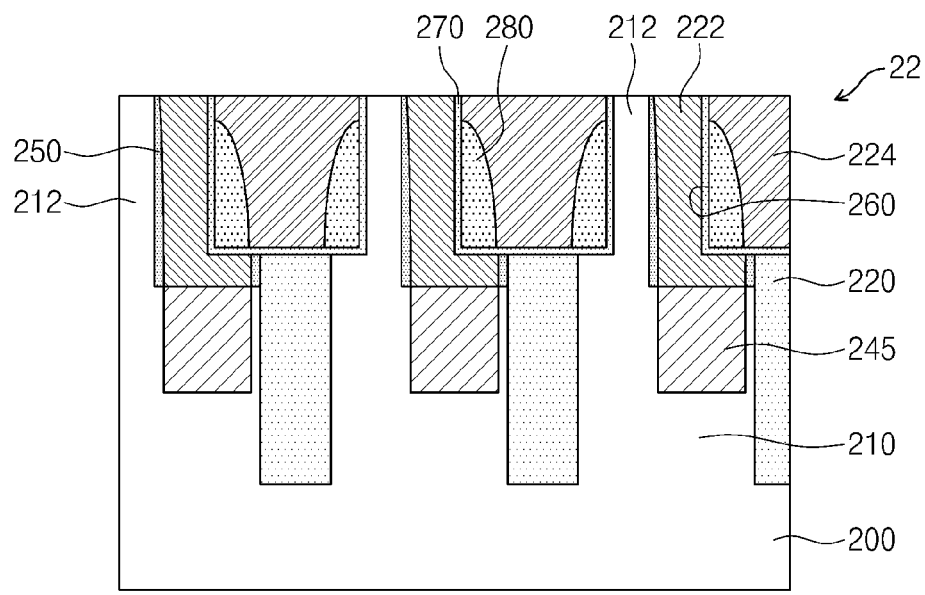

Referring to FIGS. 31A, 31B and 31C, a gate insulation layer 270 and a word line 280 may be formed in the WL pattern 260. The word line 280 may extend in the X direction substantially perpendicular to the buried bit line 245 and may be outside the vertical channel 212. Referring to FIGS. 32A, 32B and 32C, an insulation layer 224 may be formed within the WL pattern 260 and a top surface of the vertical channel 212 may be exposed by removing a hard mask 230 by, for example, an etch-back and/or CMP process.

According to example embodiments of the inventive concepts, an active region 210 may be formed with an island shape, a buried bit line 245 may be formed to cross the center of an active region 210, the active region 210 may be patterned into a plurality of vertical channels 212, and a word line 280 may be formed to orthogonally cross a buried bit line 245 and be outside the vertical channels 212. A vertical channel transistor 22 may be fabricated, for example, as illustrated in FIG. 18B.

FIGS. 33A, 34A, 35A and 36A are plan views illustrating methods of fabricating vertical channel transistors according to example embodiments of the inventive concepts illustrated in FIG. 18C. FIGS. 33B, 34B, 35B and 36B are cross-sectional views taken along lines XXXIII:B-XXXIII:B', XXXIV:B-XXXIV:B', XXXV:B-XXXV:B' and XXXVI:B-XXXVI:B' of FIGS. 33A, 34A, 35A and 36A, respectively. FIGS. 33C, 34C, 35C and 36C are cross-sectional views taken along lines XXXIII:C-XXXIII:C', XXXIV:C-XXXIV:C', XXXV:C-XXXV:C' and XXXVI:C-XXXVI:C' of FIGS. 33A, 34A, 35A and 36A, respectively.

Figure 33A:
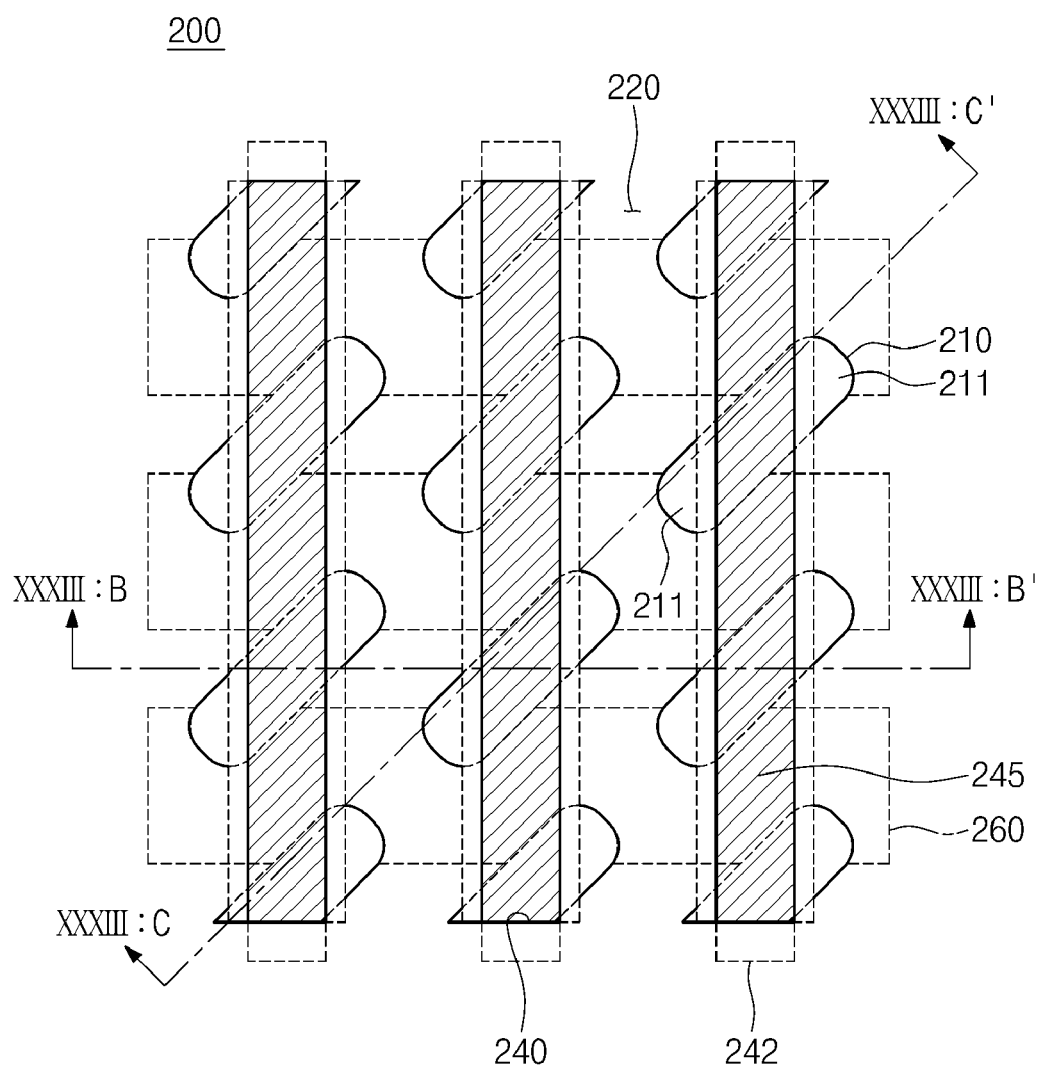
FIGS. 33A, 34A, 35A and 36A are plan views illustrating methods of fabricating vertical channel transistors according to example embodiments of the inventive concepts illustrated in FIG. 18C.
Figure 33B:
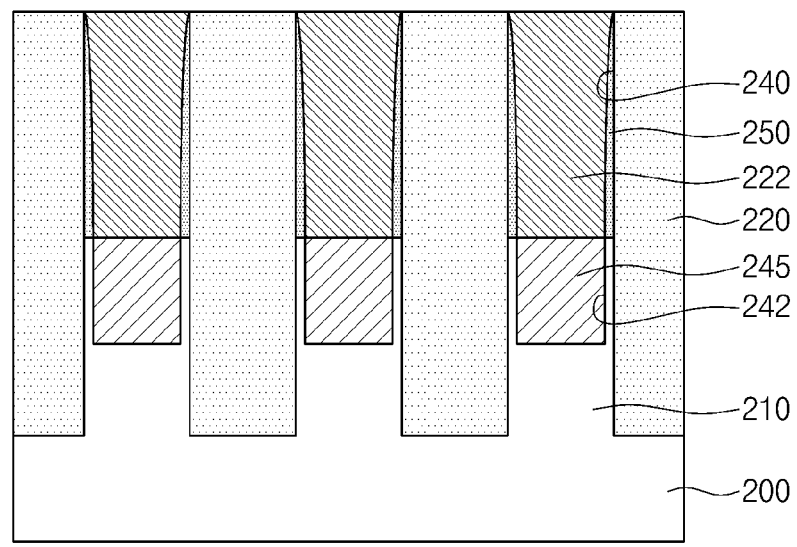
FIGS. 33B, 34B, 35B and 36B are cross-sectional views taken along lines XXXIII:B-XXXIII:B', XXXIV:B-XXXIV:B', XXXV:B-XXXV:B' and XXXVI:B-XXXVI:B' of FIGS. 33A, 34A, 35A and 36A, respectively.
Figure 33C:
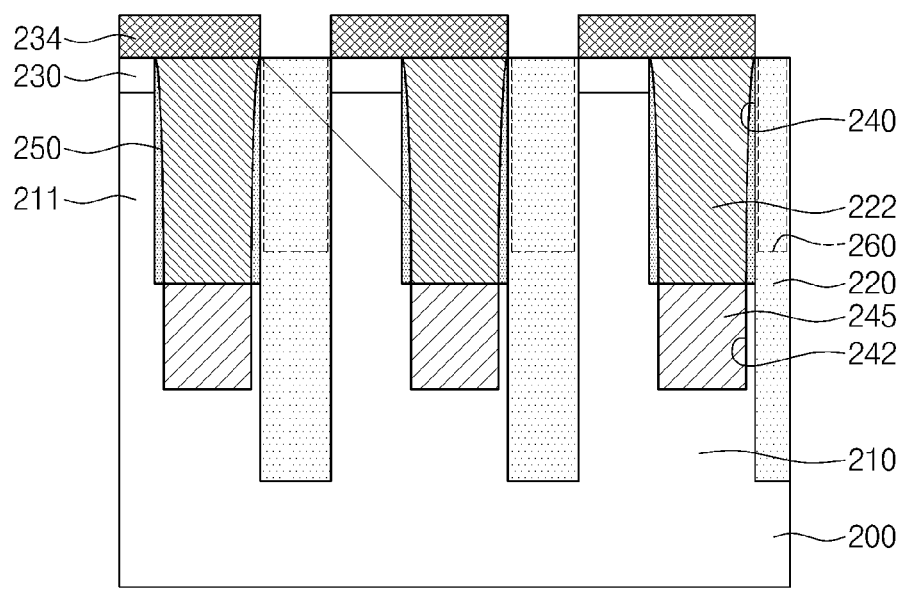
FIGS. 33C, 34C, 35C and 36C are cross-sectional views taken along lines XXXIII:C-XXXIII:C', XXXIV:C-XXXIV:C', XXXV:C-XXXV:C' and XXXVI:C-XXXVI:C' of FIGS. 33A, 34A, 35A and 36A, respectively.

Referring to FIGS. 33A, 33B and 33C, an active region 210 defined by a device isolation layer 220 may be formed on a semiconductor substrate 200 and a BBL pattern 240 may be formed to cross a center of the active region 210 in the longitudinal direction (Y direction of FIG. 18C). The active region 210 may be patterned into a plurality (e.g., 2) of active branches 211 simultaneously with the formation of the BBL pattern 240. A D-BBL pattern 242 may be formed under the BBL pattern 240 to extend in the Y direction, a buried bit line 245 may be formed in the D-BBL pattern 242, and an insulation pillar 222 may be formed in the BBL pattern 240 so as to cover the buried bit line 245.

Figure 34A:
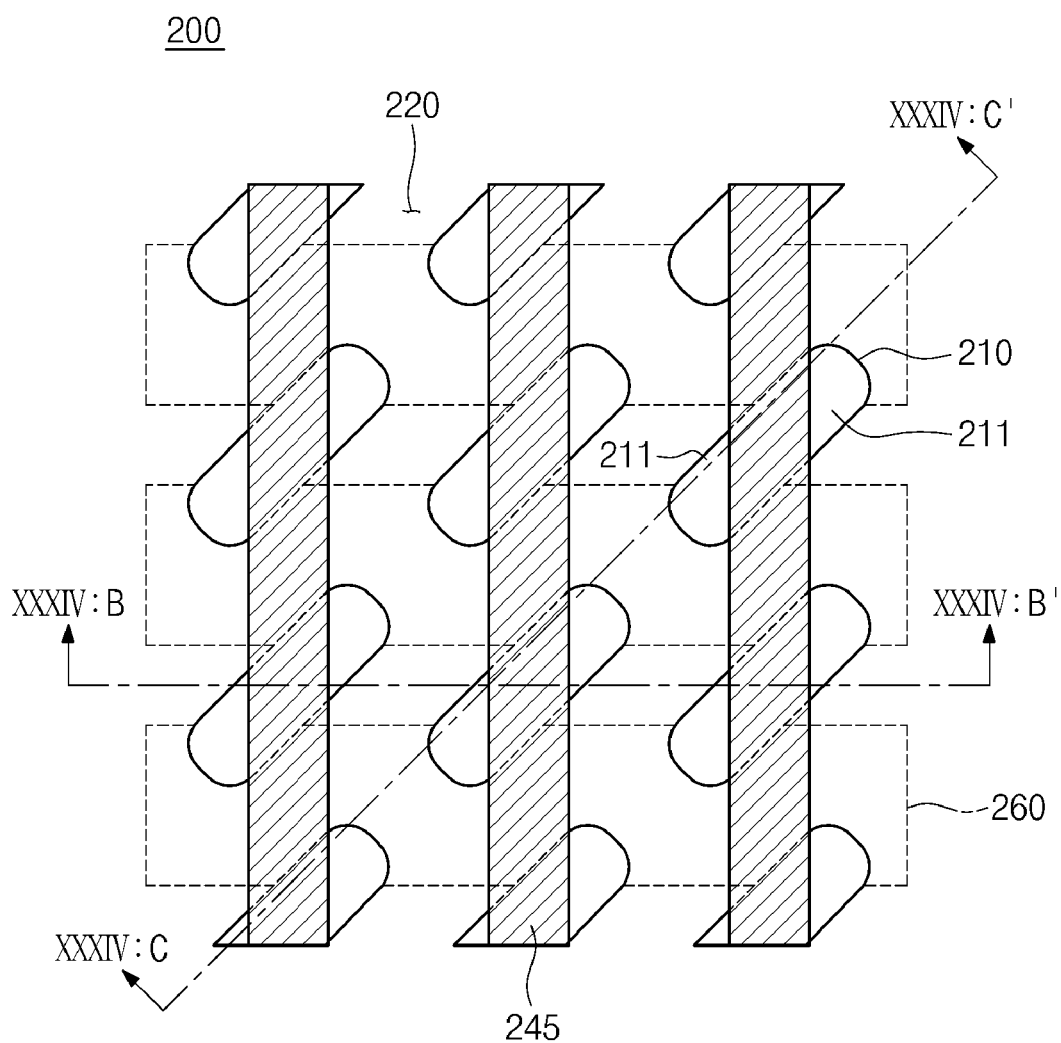
Figure 34B:
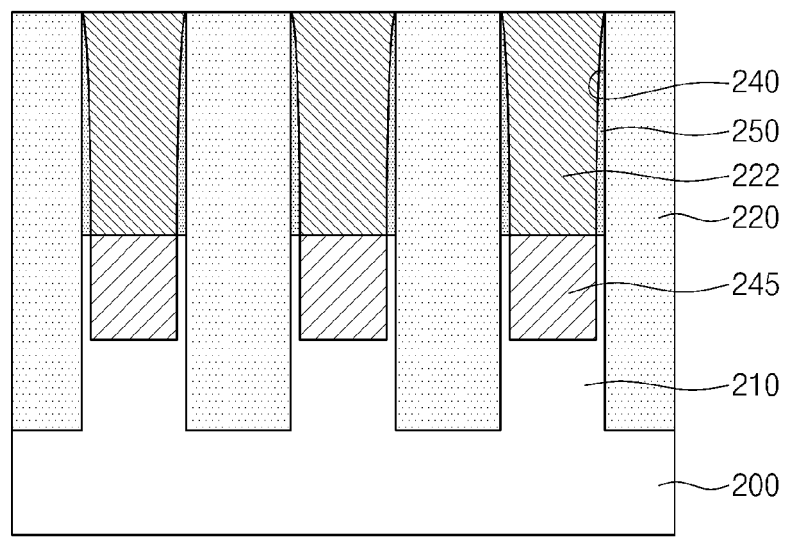
Figure 34C:
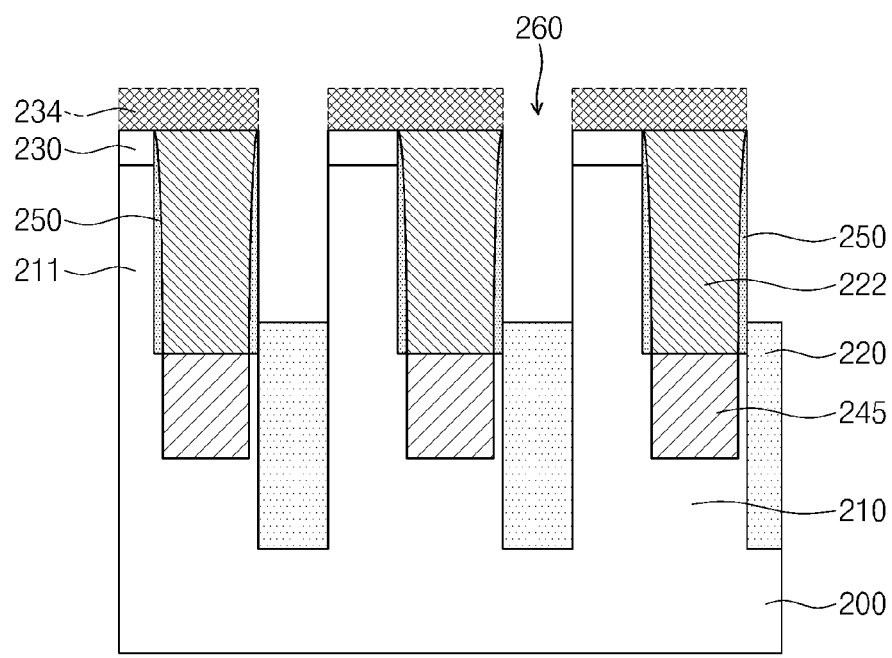

A second mask 234 may be formed on the semiconductor substrate 200 so as to define a WL pattern 260. The second mask 234 may intersect the active region 210 in the latitudinal direction (X direction of FIG. 18C) and may cover the active branch 211. Referring to FIGS. 34A, 34B and 34C, the WL pattern 260 may be formed by, for example, an etch process using the second mask 234. The WL pattern 260 may be formed in the shape of hollow line (e.g., a trench) extending in the X direction substantially perpendicular to the buried bit line 245. The second mask 234 may cover the active branch 211 such that the active branch 211 may not be removed during the etch process. According to embodiments of the inventive concept, the active branch 211 may be utilized as a vertical channel. The second mask 234 may be removed by, for example, an ash process.

Figure 35A:
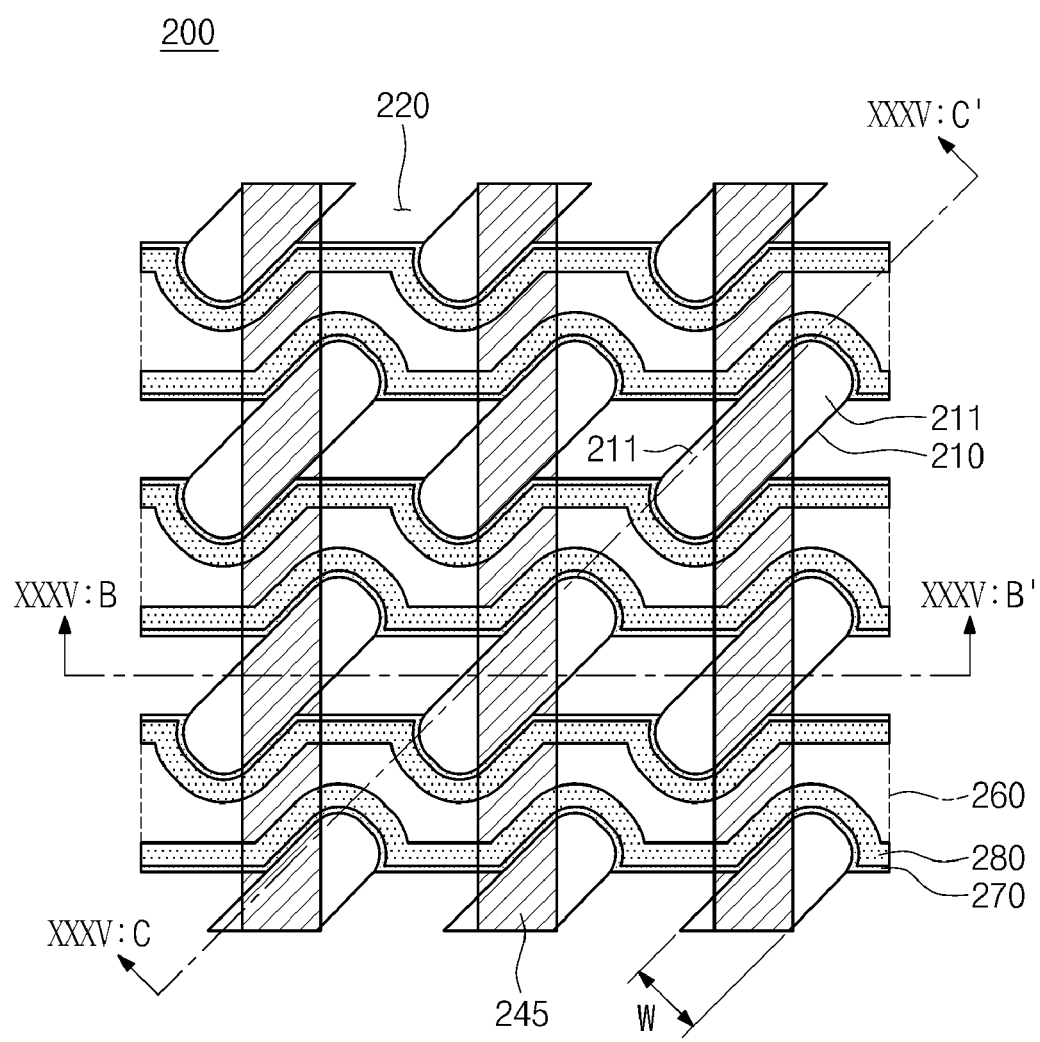
Figure 35B:
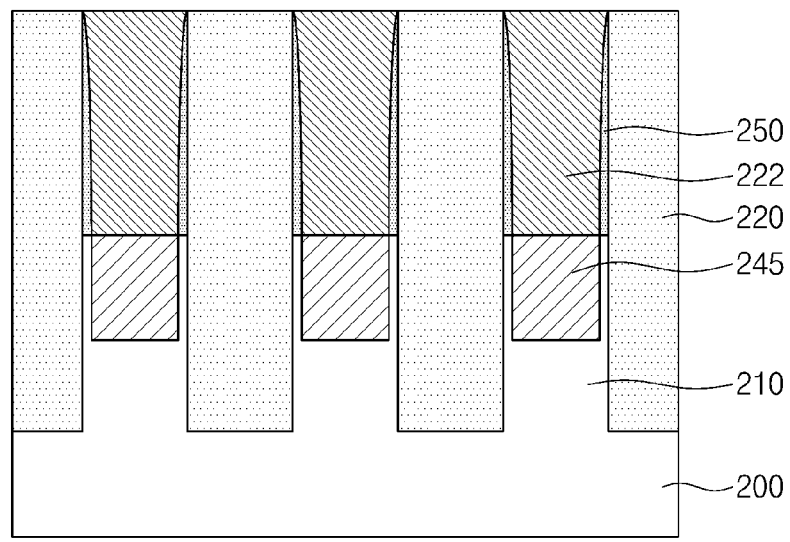
Figure 35C:
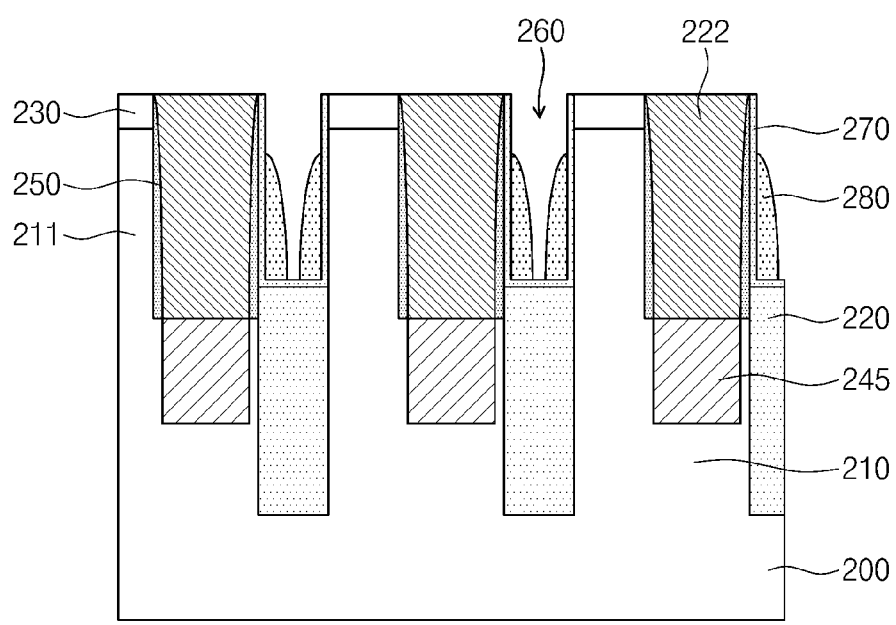

Referring to FIGS. 35A, 35B and 35C, a gate insulation layer 270 and a word line 280 may be formed in the WL pattern 260. Each of the gate insulation layer 270 and the word line 280 may include a round portion facing the vertical channel 211. According to example embodiments of the inventive concepts, the word line 280 may be formed in a shape coinciding with an outer side of the vertical channel 211 (e.g., wrapping around) without crossing into the active region 210. The rounded word line 280 may make increase a channel width W compared to, for example, the line-shaped word line 280 illustrated in FIG. 31A.

Figure 36A:
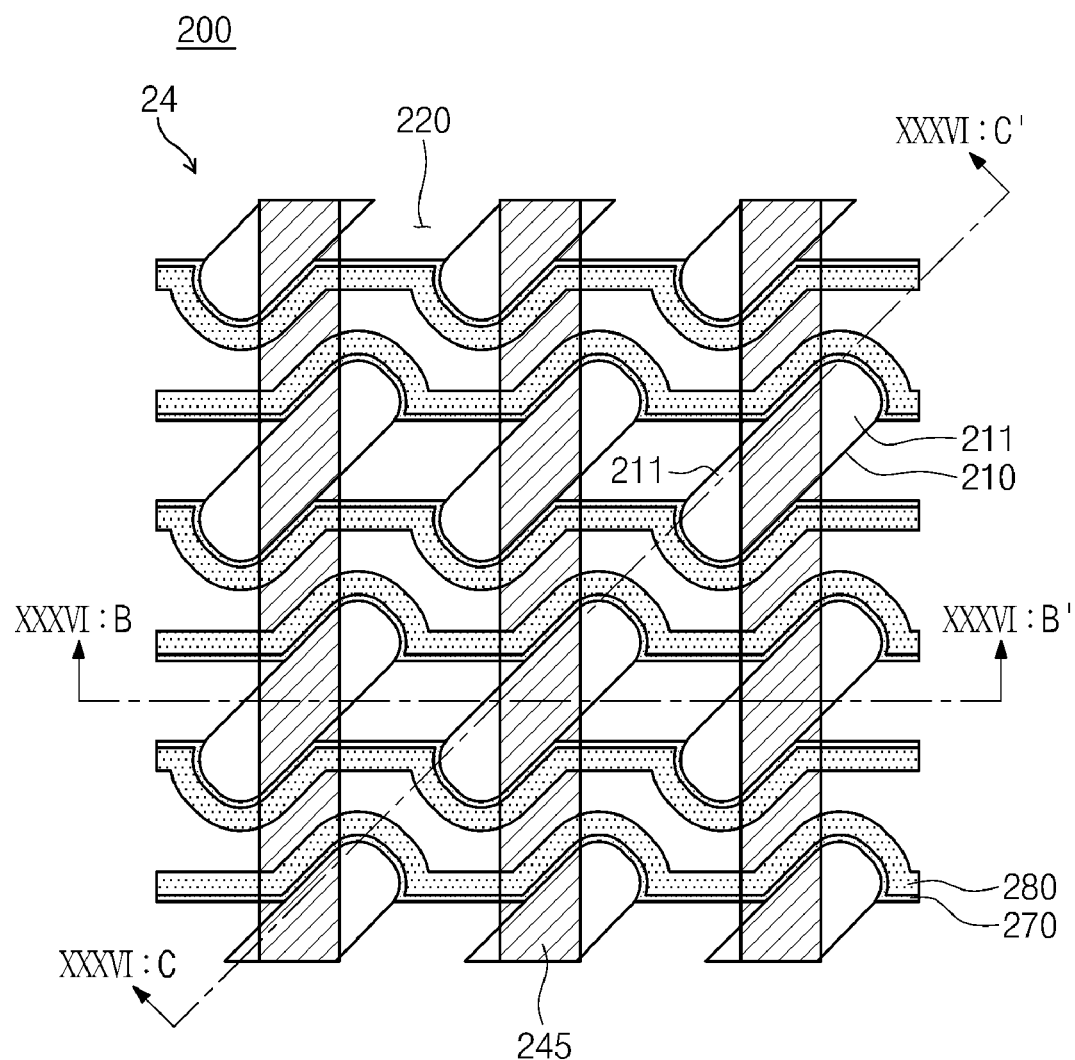
Figure 36B:
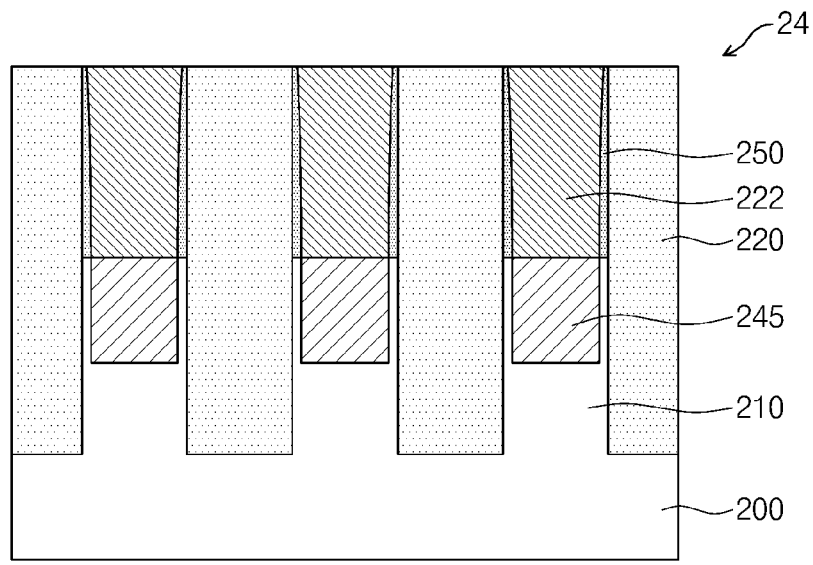
Figure 36C:
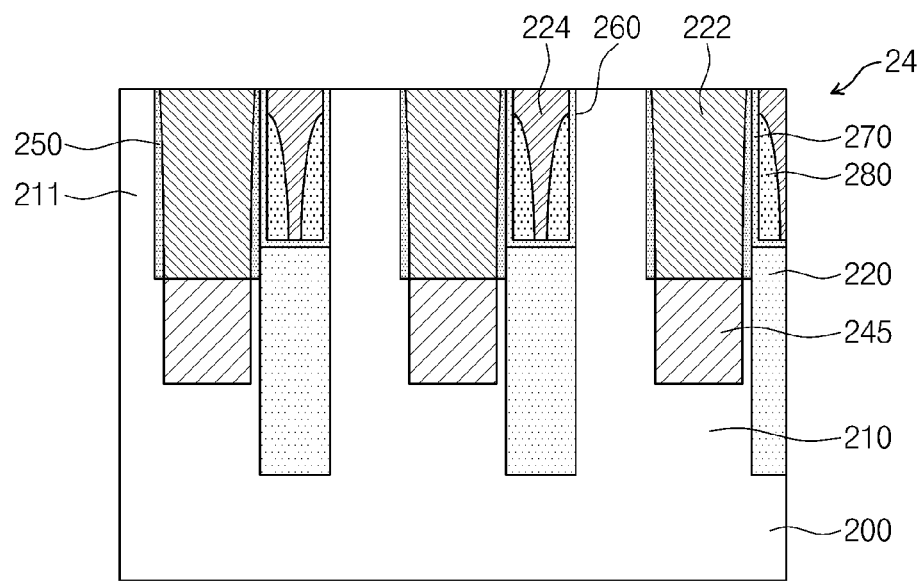

Referring to FIGS. 36A, 36B and 36C, an insulation layer 224 may be formed in the WL pattern 260 and a hard mask 230 may be removed by, for example, an etch or CMP process, which exposes a top surface of the vertical channel 211.

According to example embodiments of the inventive concepts, an active region 210 may be formed with an island shape, a buried bit line 245 may be formed to cross the center of the active region 210, the active region 210 may be patterned into a plurality of vertical channels 211, and a word line 280 may be formed to orthogonally cross the buried bit line 245 and to extend along an outer side of a vertical channel 211. A vertical channel transistor 24 may be fabricated, for example, as illustrated in FIG. 18C.

Figure 37A:
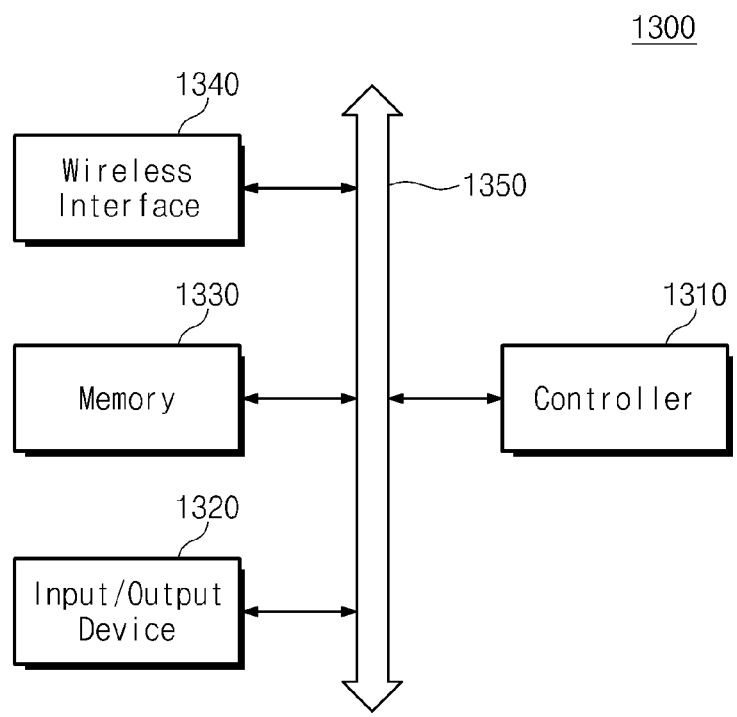
Figure 37B:
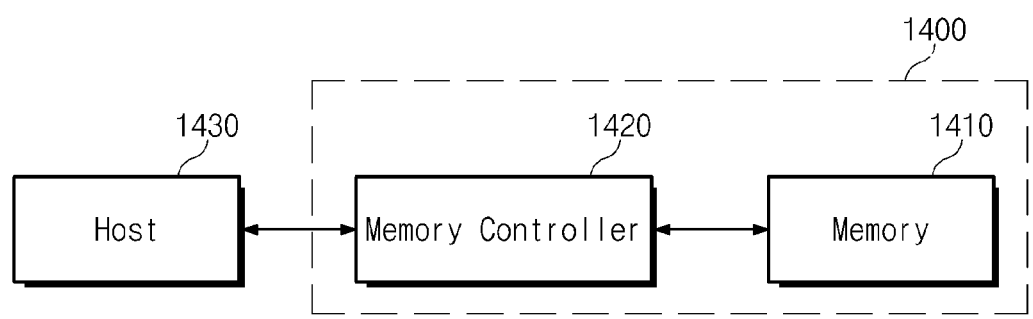

FIGS. 37A and 37B are block diagrams illustrating electronic devices and memory systems including vertical channel transistors according to example embodiments of the inventive concepts. Referring to FIG. 37A, an electronic device 1300 may include at least one vertical channel transistor according to example embodiments of the inventive concepts described with respect to, for example, FIGS. 1-36C. The electronic device 1300 may be used in a wireless communication device such a PDA, a laptop computer, a portable computer, a web tablet, a wireless phone, a cellular phone, a digital music player, and/or any device capable of transmitting and/or receiving information in a wireless environment. The electronic device 1300 may include a controller 1310, an input/output device 1320, for example, a keypad, a keyboard, and/or a display device, a memory 1330, and a wireless interface 1340 connected via a bus 1350.

The controller 1310 may include at least one microprocessor, a digital signal processor, a microcontroller, and/or any other processing unit. The memory 1330 may be used, for example, to store commands executed by the controller 1310. The memory 1330 may used, for example, to store user data. Any component of the electronic device 1300 may include vertical channel transistors according to example embodiments of the inventive concepts. The electronic device 1300 may use the wireless interface 1340 to transmit data to a wireless communication network communicating RF signals and/or receive data from the network. For example, the wireless interface 1340 may include a wireless transceiver. The electronic device 1300 may be used in a communication interface protocol of a three-generation communication system such as CDMA, GSM, NADC, E-TDMA, WCDMA, and/or CDMA2000.

Referring to FIG. 37B, a memory system including a semiconductor memory device according to example embodiments of the inventive concepts may include at least one vertical channel transistor. A memory system 1400 may include a memory device 1410 storing large data and a memory controller 1420. The memory controller 1420 may control the memory device 1410 to read stored data from the memory device and/or write data in reply to a reading/writing request of a host 1430. The memory controller 1420 may form an address mapping table used to map addresses provided from the host 1430 such as a mobile device and/or a computer system to physical addresses. The memory device 1410 may include the vertical channel transistor according to example embodiments of the inventive concepts, for example, as described with respect to FIGS. 1-36C.

According to example embodiments of the inventive concepts, there may be obtained a lowered resistance of a buried bit line and reproducibility of a channel length may be realized.

The above-disclosed subject matter is to be considered illustrative, and not restrictive, and the appended claims are intended to cover all such modifications, enhancements, and other embodiments, which fall within the true spirit and scope of the inventive concepts. While example embodiments have been particularly shown and described, it will be understood by one of ordinary skill in the art that variations in form and detail may be made therein without departing from the spirit and scope of the claims.

What is claimed is:

1. A method of fabricating a vertical channel transistor, the method comprising:
   forming an active region on a substrate;
   forming a plurality of vertical channels by patterning the active region;
   forming a buried bit line in the active region between the vertical channels by
      removing a material of a center region of the active region to define a buried bit line pattern,
      forming a damascene bit line pattern using the buried bit line pattern, and
      forming a first conductive layer in the damascene bit line pattern; and
   forming a word line on a side of at least one of the vertical channels,
   wherein the forming of the buried bit line includes removing the material of the center region of the active region to form a plurality of active branches defining the buried bit line pattern, and
   the forming a plurality of vertical channels includes forming a word line pattern extending through at least one of the center region and a peripheral region of the active region to remove portions of the active branches, the vertical channels including remaining portions of the active branches.

2. The method of claim 1, wherein the forming of the active region includes forming a device isolation region including an insulation material in the substrate, the device isolation region defining the active region.

3. The method of claim 2, wherein
   the buried bit line includes a metal.

4. The method of claim 1, wherein the forming of the word line includes:
   forming the word line pattern to extend through the center region,
   forming an insulation layer in the word line pattern, and
   forming a second conductive layer on the insulation layer in the word line pattern, the insulation layer between the second conductive layer and the at least one of the vertical channels.

5. The method of claim 1, wherein forming of the word line includes:
   forming the word line pattern to extend through the peripheral region,
   forming an insulation layer in the word line pattern, and forming a second conductive layer on the insulation layer in the word line pattern, the insulation layer between the second conductive layer and the at least one of the vertical channels.

6. The method of claim 1, further comprising:
forming a first junction region on a first end of the at least one of the vertical channels; and
forming a second junction region on a second end of the at least one of the vertical channels.

7. The method of claim 1, wherein only one of the word line and the active region extends perpendicularly to the buried bit line.

8. A method of fabricating a vertical channel transistor, the method comprising:
forming an active region on a substrate;
forming a plurality of vertical channels by patterning the active region;
forming a buried bit line in the active region between the vertical channels by
removing a material of a center region of the active region to define a buried bit line pattern,
forming a damascene bit line pattern using the buried bit line pattern, and
forming a first conductive layer in the damascene bit line pattern; and
forming a word line on a side of at least one of the vertical channels, the word line being non-linear in a direction parallel to the substrate.

9. The method of claim 8, wherein
the forming of the buried bit line includes removing the material of the center region of the active region to form the vertical channels, the vertical channels including peripheral regions of the active region and defining the buried bit line pattern, and
the buried bit line includes a metal.

10. The method of claim 9, wherein the forming of the word line includes:
forming a word line pattern, a portion of the word line pattern extending adjacent to an edge of at least one of the peripheral regions and conforming to a contour of the at least one of the peripheral regions,
forming an insulation layer in the word line pattern; and
forming a second conductive layer on the insulation layer in the word line pattern, the insulation layer between the second conductive layer and the at least one of the vertical channels.

\* \* \* \* \*